United States Patent
Noguchi et al.

(10) Patent No.: US 6,819,592 B2
(45) Date of Patent: Nov. 16, 2004

(54) SEMICONDUCTOR MEMORY

(75) Inventors: Mitsuhiro Noguchi, Yokohama (JP);
Akira Goda, Yokohama (JP); Yasuhiko Matsunaga, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 179 days.

(21) Appl. No.: 10/108,574

(22) Filed: Mar. 29, 2002

(65) Prior Publication Data
US 2002/0159315 A1 Oct. 31, 2002

(30) Foreign Application Priority Data

Mar. 29, 2001 (JP) .......................................... 2001-095512
Dec. 17, 2001 (JP) .......................................... 2001-383554

(51) Int. Cl.[7] .............................................. G11C 16/04
(52) U.S. Cl. ........................ 365/185.17; 365/185.17; 365/185.23
(58) Field of Search ................ 365/185.17, 185.12, 365/185.18, 185.24, 185.29, 185.28, 185.3, 185.06

(56) References Cited

U.S. PATENT DOCUMENTS

| | | | |
|---|---|---|---|
| 5,043,942 A | 8/1991 | Iwata et al. | |
| 5,673,223 A | 9/1997 | Park | |
| 5,808,938 A | 9/1998 | Tran et al. | |
| 5,822,252 A | * 10/1998 | Lee et al. | ................. 365/185.3 |
| 5,930,169 A | 7/1999 | Iwata et al. | |
| 6,160,297 A | 12/2000 | Shimizu et al. | |
| 6,411,548 B1 | 6/2002 | Sakui et al. | |
| 6,459,114 B1 | 10/2002 | Nakamura et al. | |

FOREIGN PATENT DOCUMENTS

| | | |
|---|---|---|
| JP | 7-111095 | 4/1995 |
| JP | 11-260076 | 9/1999 |
| JP | 2000-76882 | 3/2000 |
| JP | 2000-105998 | 4/2000 |

* cited by examiner

Primary Examiner—David Nelms
Assistant Examiner—Thinh T Nguyen
(74) Attorney, Agent, or Firm—Oblon, Spivak, McClelland, Maier & Neustadt, P.C.

(57) ABSTRACT

A semiconductor memory including a memory cell unit, the memory cell unit comprising: a plurality of memory cells in which each conductance between current terminals changes according to held data, each having a plurality of current terminals connected in series between a first terminal and a second terminal, and each capable of electrically rewriting the data; a first select switching element electrically connecting said first terminal to a data transfer line; and a MISFET serving as a second select switching element connecting said second terminal to a reference potential line, wherein said semiconductor memory has a data read mode for forcing the first and second select switching elements of said memory cell unit into conduction, applying a read voltage for forcing a path between the current terminals into conduction or cut-off according to the data of a selected memory cell, to a control electrode of the selected memory cell, applying a pass voltage for forcing a path between the current terminals into conduction irrespectively of the data of each of the memory cells other than said selected memory cell, to the control electrode of each of the memory cells other than said selected memory cell, and detecting presence and absence or magnitude of a current between said data transfer line and said reference potential line, and in said data read mode, a conductance between current terminals of said MISFET is set lower than a conductance, in the case where the conductance between the current terminals is set to be the lowest, with regards to at least one of the memory cells other than said selected memory cell.

8 Claims, 42 Drawing Sheets

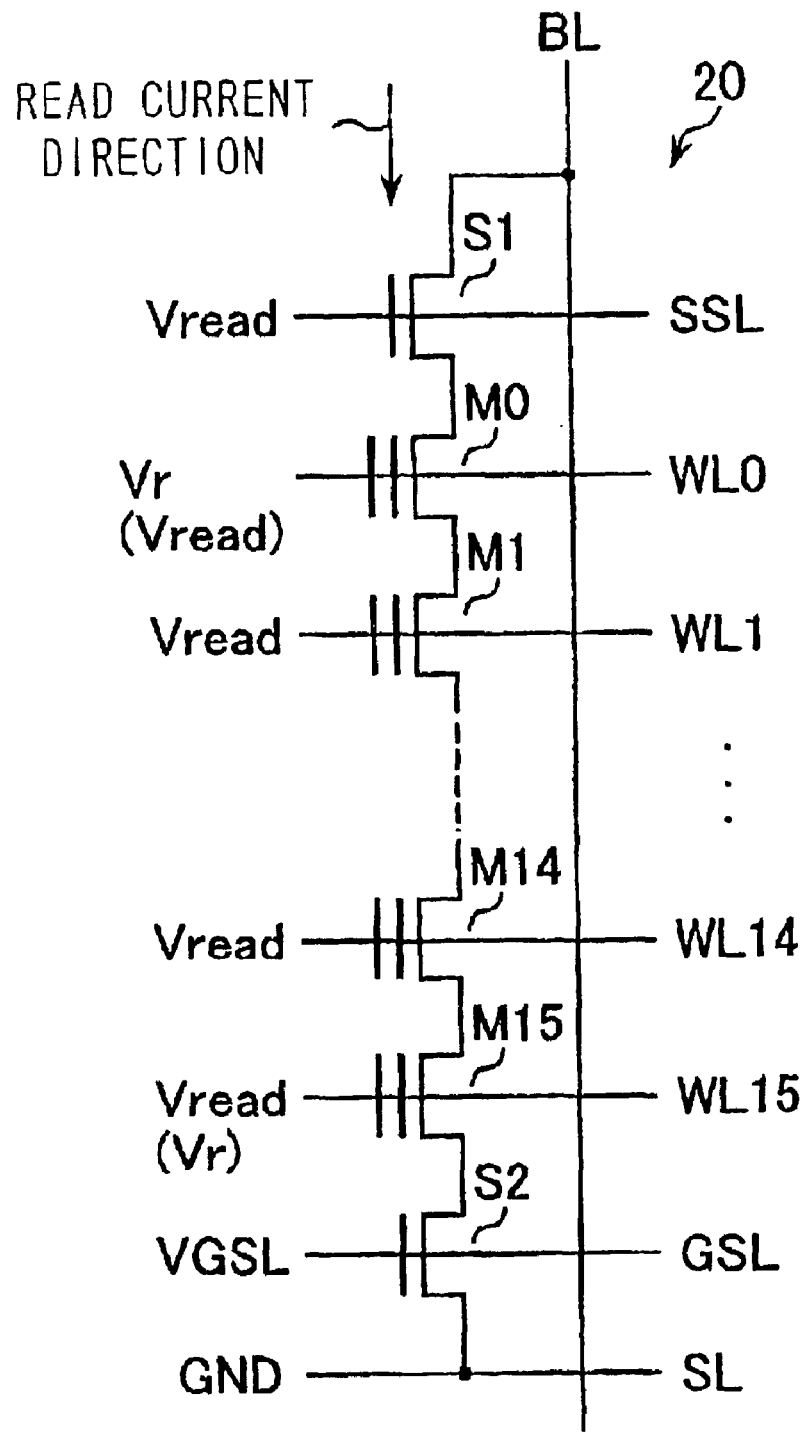
F I G. 8

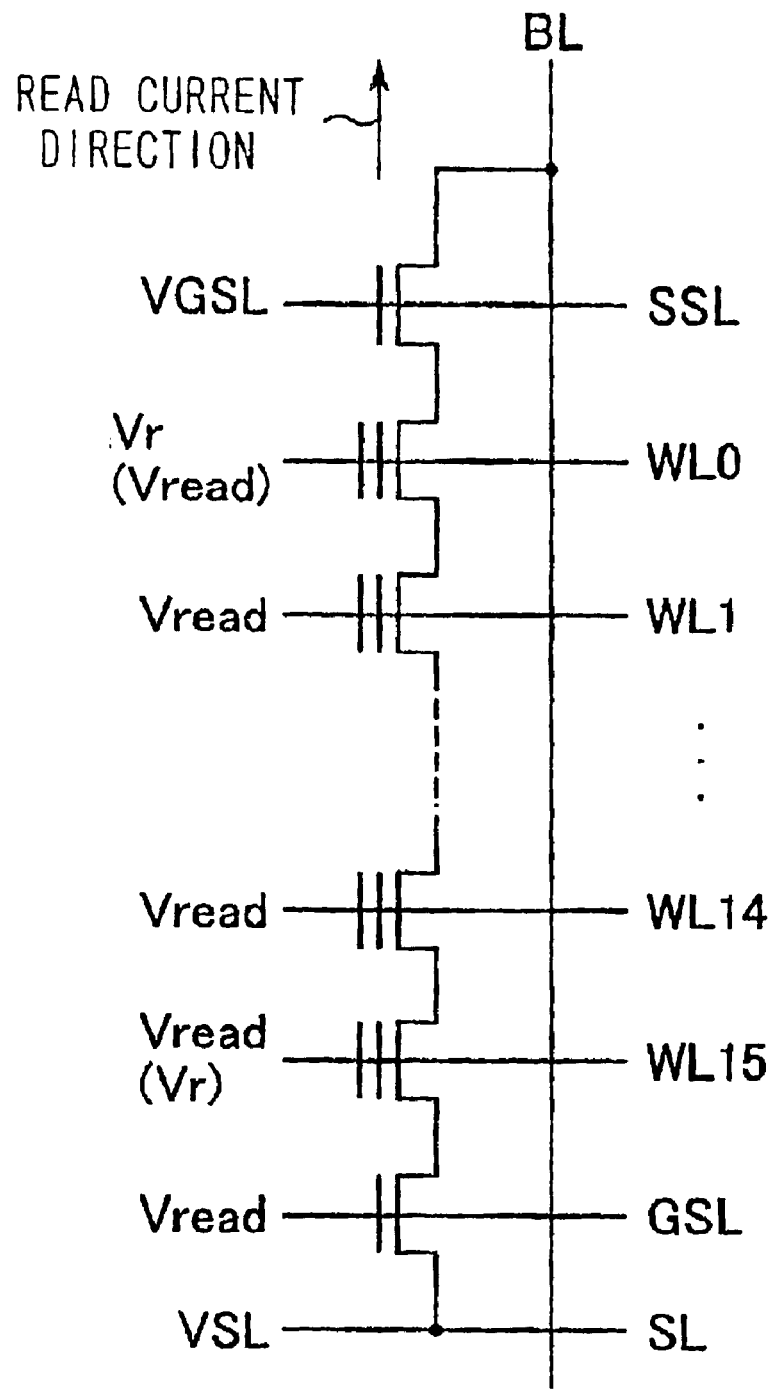
F I G. 16

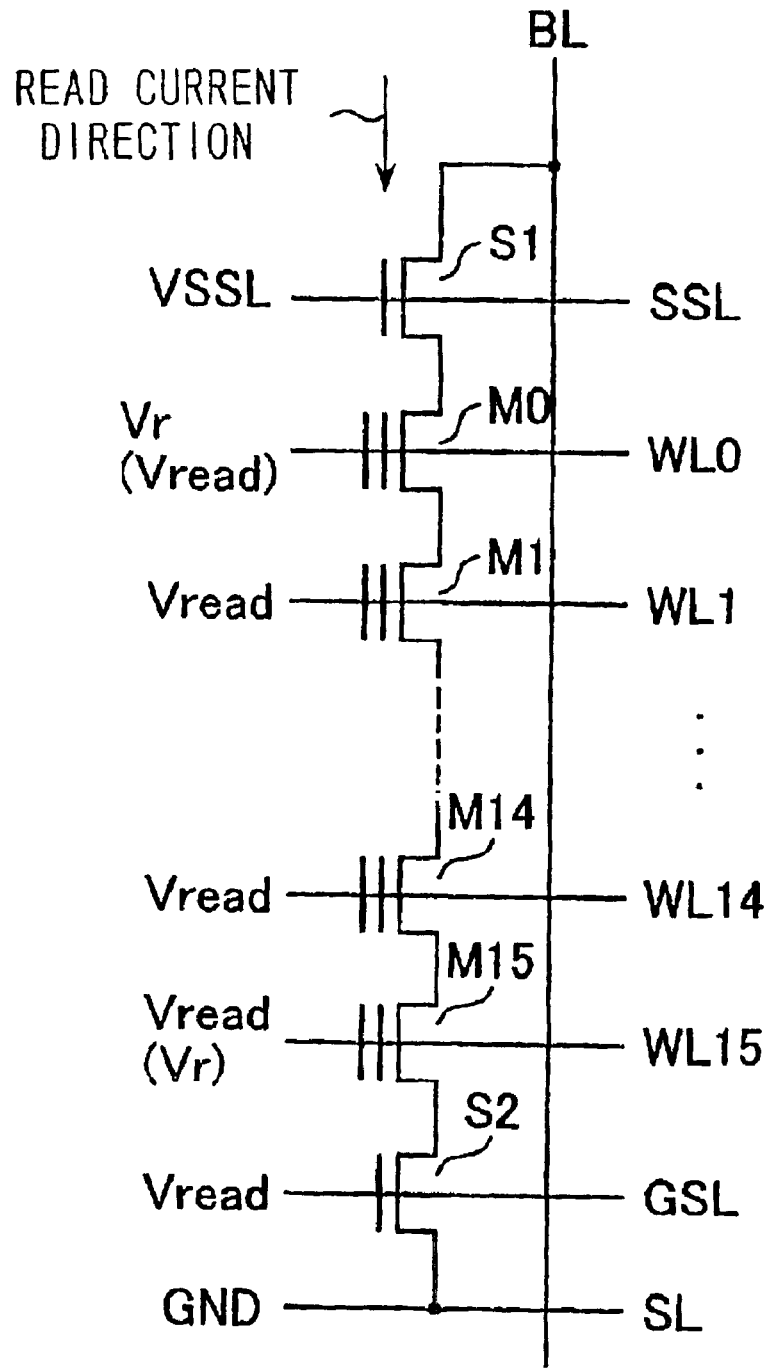
F I G. 18

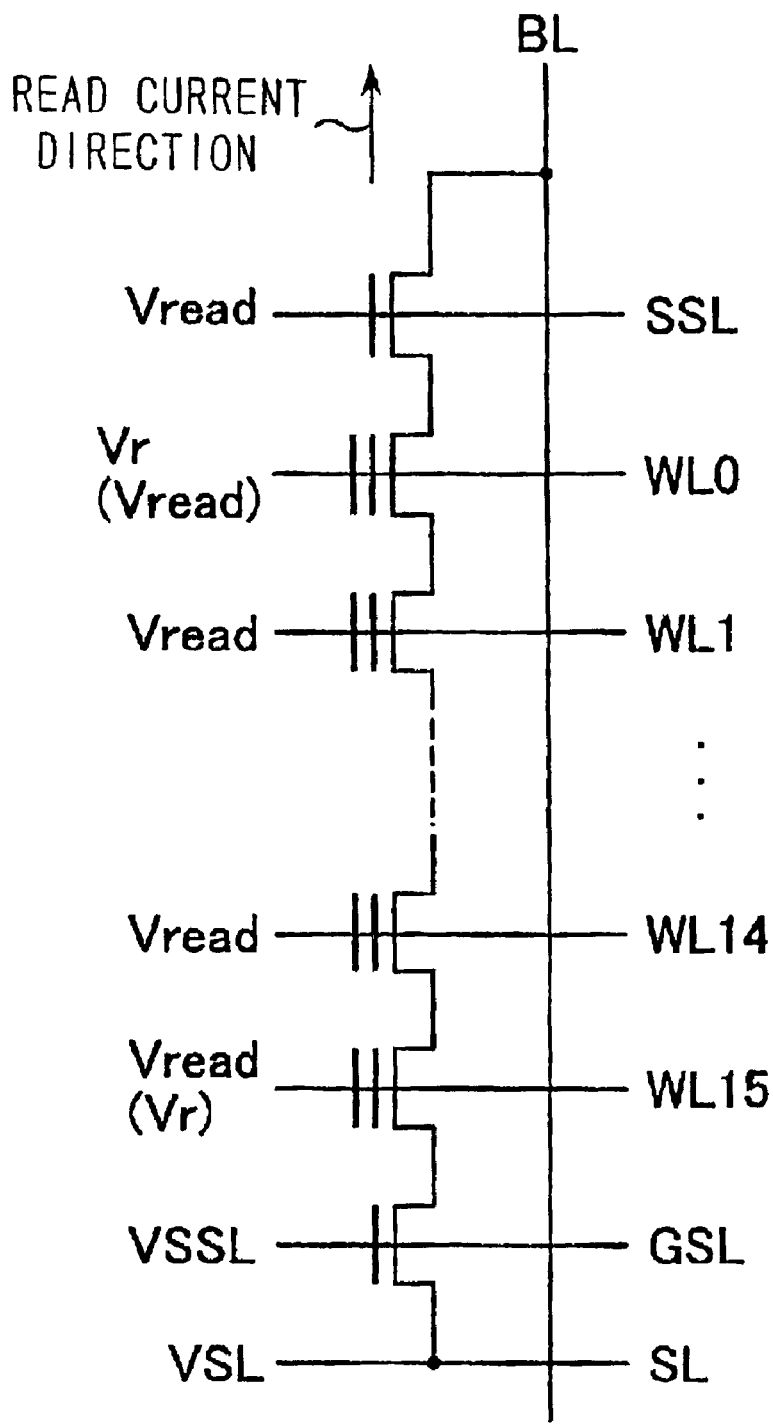
F I G. 22

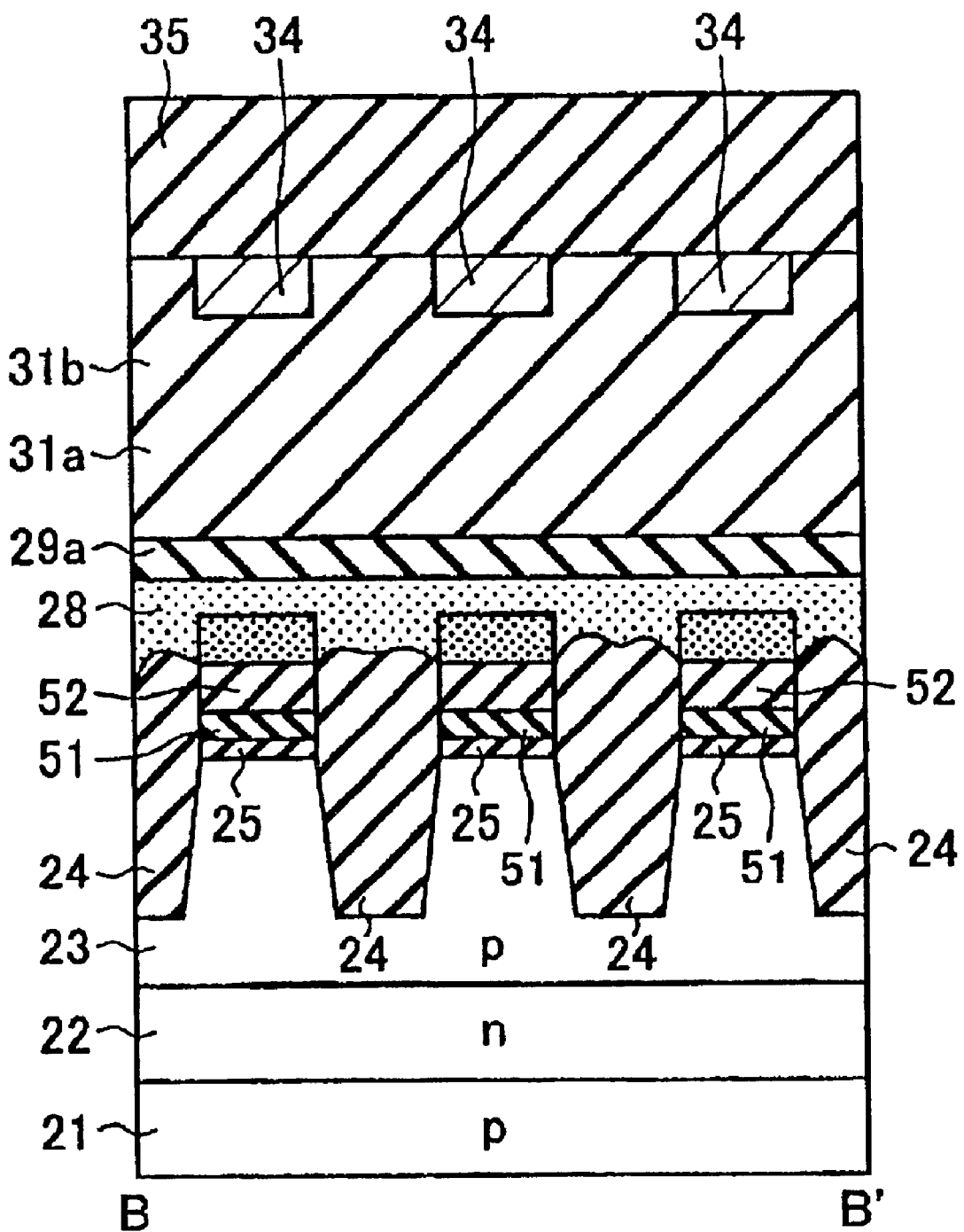
F I G. 24

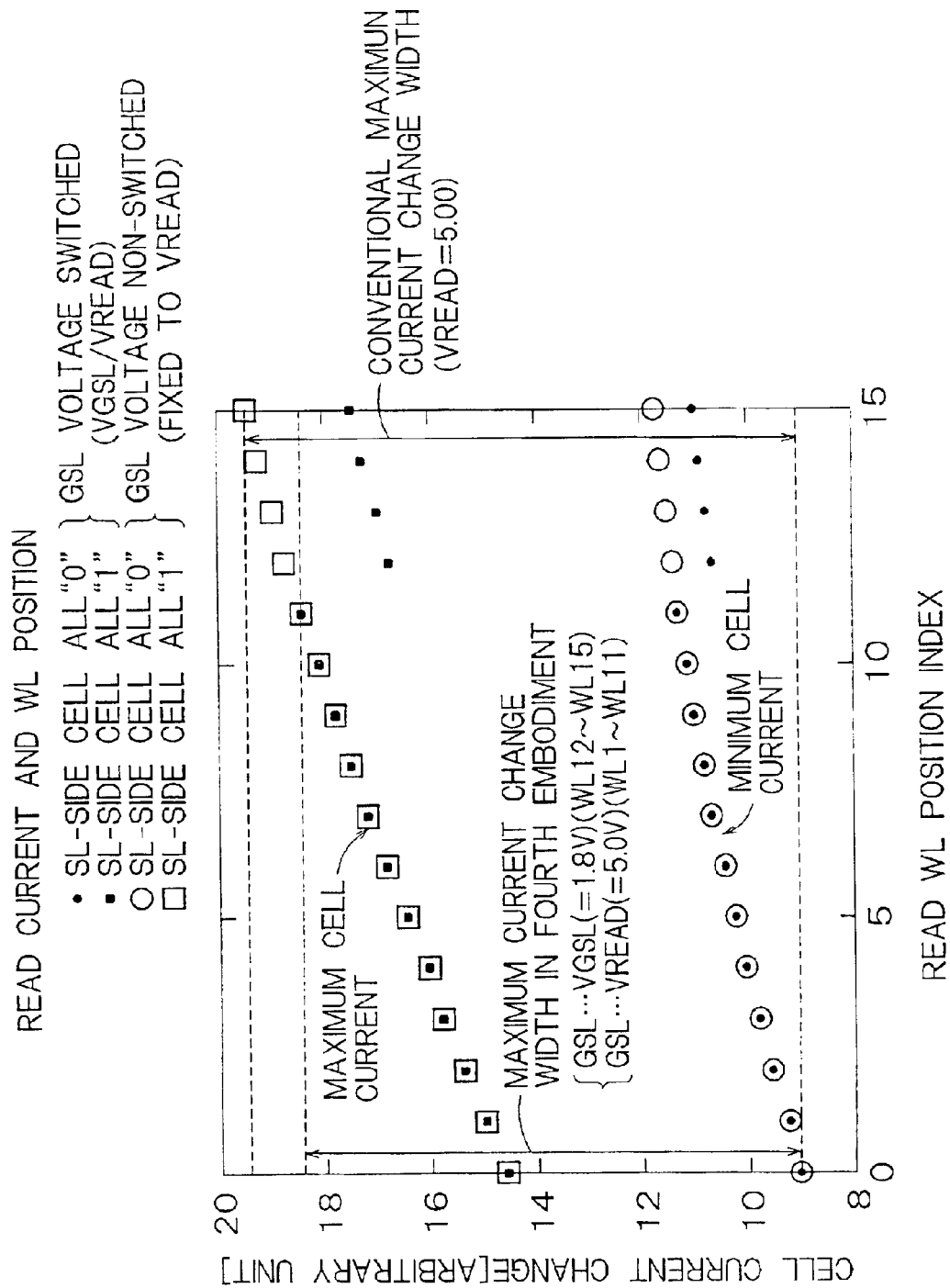
F I G. 26

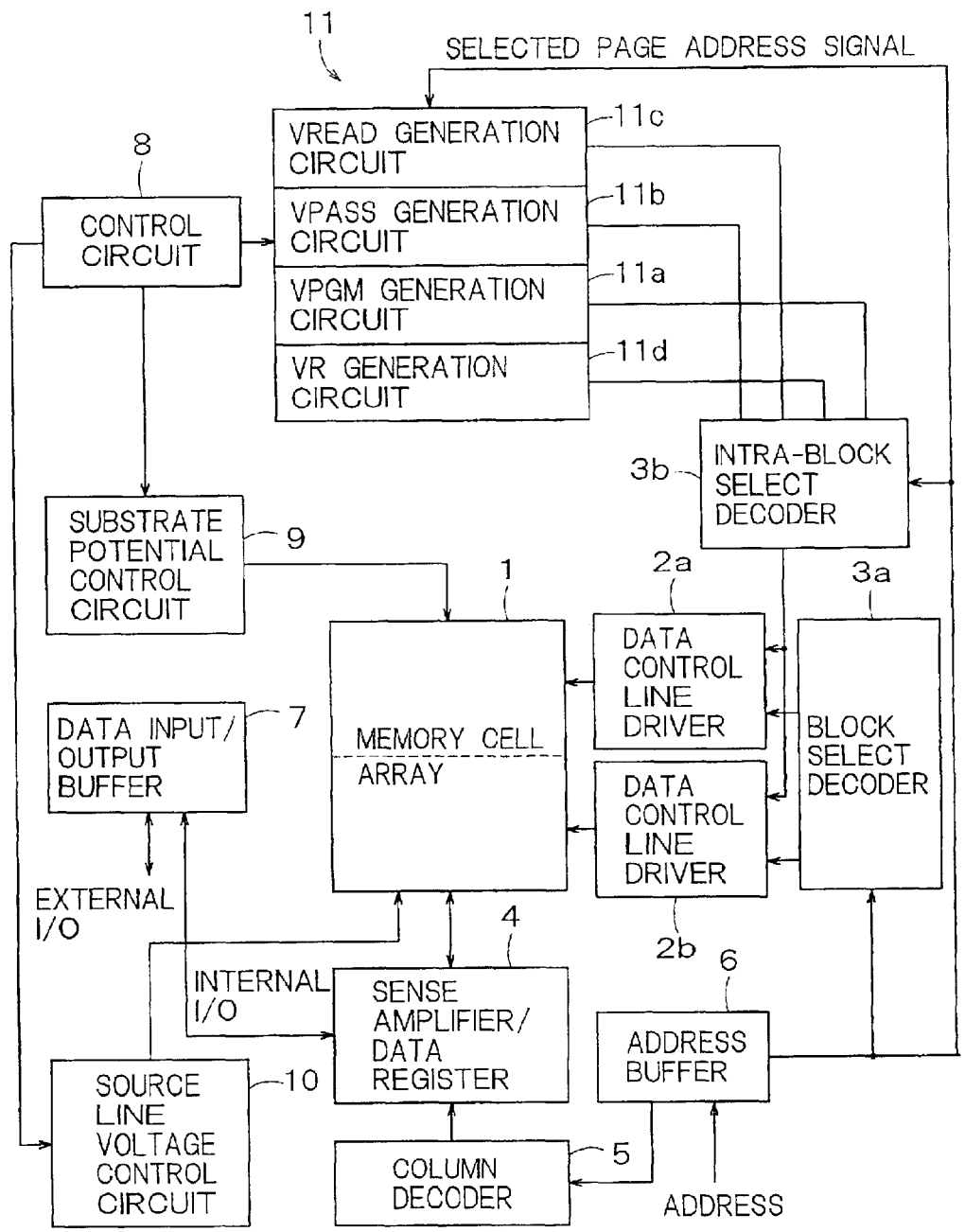
F I G. 33

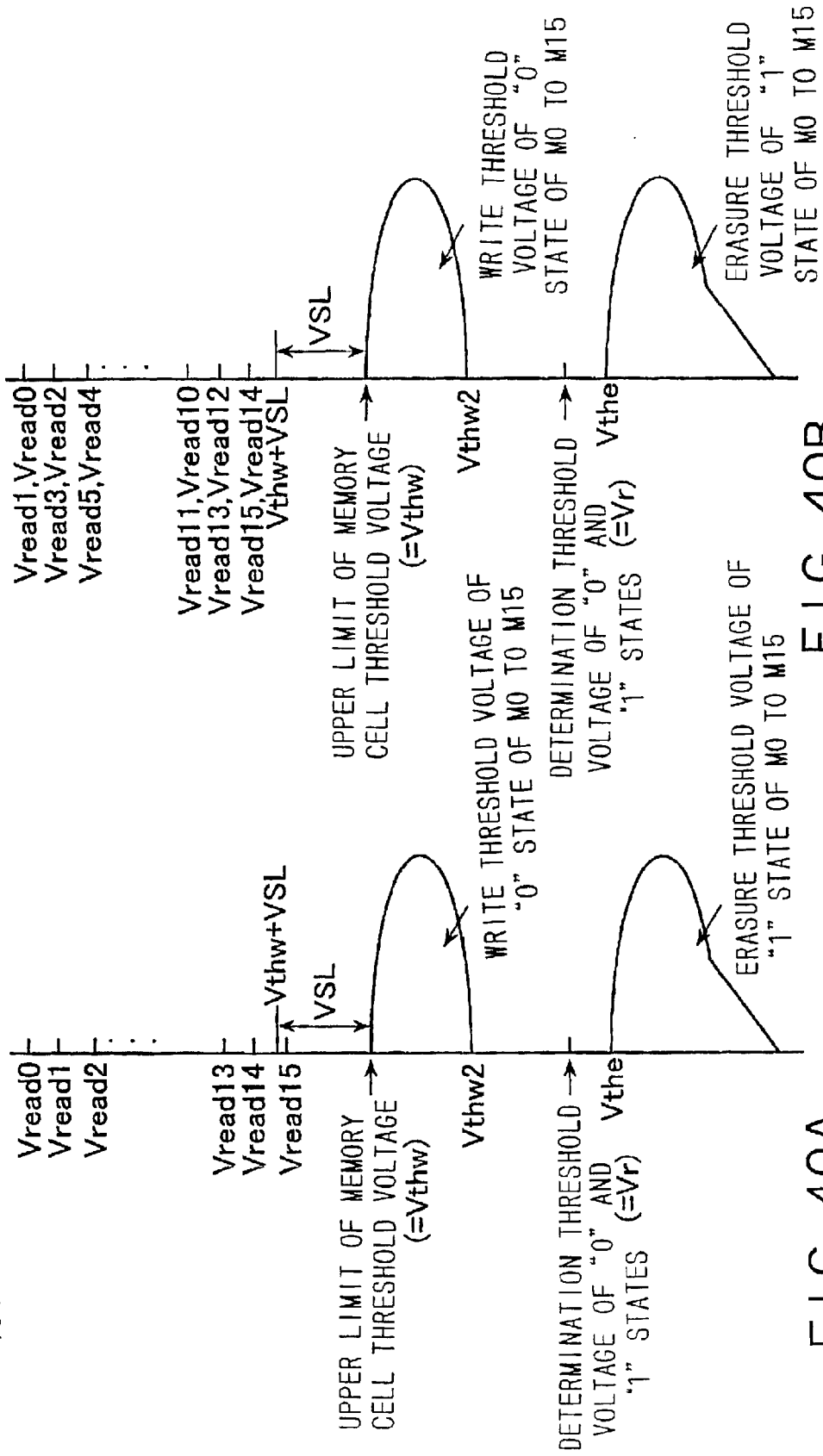

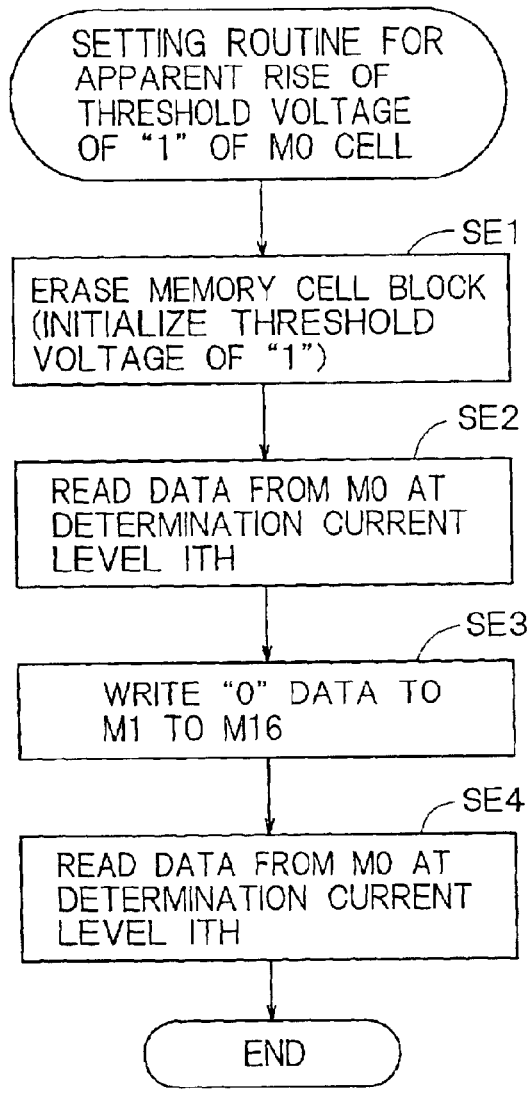
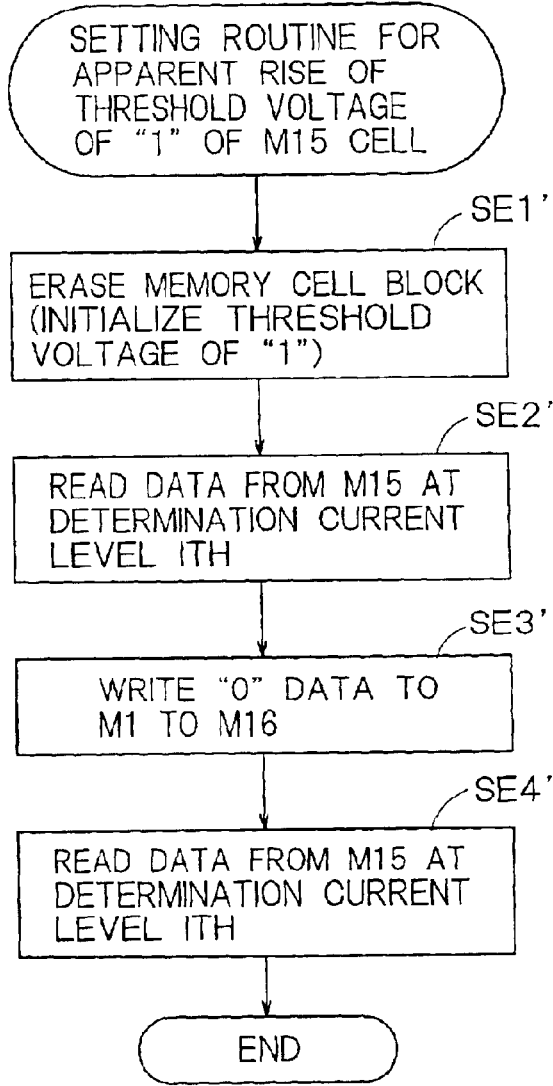
F I G. 44A  F I G. 44B

SEMICONDUCTOR MEMORY

CROSS REFERENCE TO RELATED APPLICATIONS

This application is based upon and claims the benefit of priority from the prior Japanese Patent Applications No. 2001-95512, filed on Mar. 29, 2001 and No. 2001-383554, filed on Dec. 17, 2001, the entire contents of which are incorporated herein by reference.

BACKGROUND OF THE INVENTION

1. Field of the Invention

The present invention relates to a semiconductor memory employing electrically rewritable memory cells. More specifically, the present invention relates to a semiconductor memory which constitutes memory cell units by connecting memory cells in series.

2. Related Background Art

Normally, an EEPROM memory cell has a MISFET structure in which a charge accumulation layer and a control gate are layered. This memory cell stores data in a nonvolatile manner based on the difference between a threshold voltage at the state of injecting electric charge into the charge accumulation layer and a threshold voltage at the state of discharging the electric charge. The injection and emission of charges are carried out by a tunnel current through a tunnel insulating film provided between the charge accumulation layer and a substrate channel.

Among EEPROM's, a so-called NAND type EEPROM which constitutes NAND cell units by connecting a plurality of memory cells in series requires fewer selected transistors than an NOR type EEPROM, thereby realizing higher integration.

In order to read data from the NAND type EEPROM, a read voltage for threshold voltage determination is applied to the control gate of a selected memory cell in the NAND cells, a pass voltage higher than the read voltage for turning on the memory cell irrespective of data is applied to the control gates of the remaining unselected memory cells and a current penetrating the NAND cell string is detected. Therefore, even if the same data is written, the read current differs according to the state of data of the unselected memory cells and the position of the selected memory cell in the NAND cells. Further, since data is read according to the quantity of charges which pass the current terminals of the memory cells, the apparent threshold voltage of each memory cell disadvantageously changes.

The generation of the difference in read current according to the data states of the unselected memory cell and the position of the selected memory cell will be specifically described with reference to FIGS. 41 to 43. FIGS. 41 and 42 show different read conditions for a NAND cell unit constituted by connecting 16 memory cells M0 to M15 in series, respectively. One end of a NAND cell is connected to a data transfer line (bit line) BL through a select transistor S1 and the other end thereof is connected to a common source line SL having a reference potential through a select transistor S2. The control gate of the respective memory cells M0 to M15 are connected to different data control lines (word lines) WL0 to WL15, respectively and the gates of the select transistors S1 and S2 are connected to select gate lines SSL and GSL for block selection, respectively.

While each of FIGS. 41 and 42 shows only one NAND cell unit, a plurality of NAND cell units of this type are arranged in a bit line direction and a word line direction and a memory cell array is thereby formed. In addition, a sense amplifier/data register is connected to the bit line BL. In a flash memory, the range of a plurality of NAND cell units aligned in the word line direction serves as a block which is a unit of batch erasure of data. Description will be given hereinafter while assuming that a state, in which electrons are discharged from the charge accumulation layer and a threshold voltage is low, is a "1" data state (erasure state) and a state, in which electrons are injected into the charge accumulation layer and a threshold voltage is high, is a "0" data state.

FIGS. 41A and 41B show the read voltages when the memory cell M0 closest to the bit line BL among the memory cells M0 to M15 is selected. In this case, the common source line SL has a ground potential GND, the bit line BL is applied with, for example, a positive voltage VBL of about 1V, the selected word line WL0 is applied with a read voltage Vr for threshold voltage determination and the remaining unselected word lines WL1 to WL16 are each applied with a pass voltage Vread necessary to turn on a cell irrespective of the data. In addition, each of the select gate lines SSL and GSL is applied with the pass voltage Vread, as well.

FIG. 43 shows an example of the threshold voltage distribution of a memory cell which stores binary data. The upper limit Vthw of the threshold voltage of the "0" data is set at 2V, the upper limit Vthe of the threshold voltage of the "1" data (erasure state) is set at −1V and the pass voltage Vread is set at a voltage between 4 to 5V, for example. In addition, the read voltage Vr is set at, for example, 0V. While FIG. 43 shows the threshold voltages of the select transistors S1 and S2, they are lower than the upper limit Vthw of the write threshold voltage of a memory cell. By applying the pass voltage Vread to the select transistors S1 and S2 have, therefore, the select transistors S1 and S2 have higher conductance than that of each memory cell or are sufficiently kept conductive.

FIG. 41A shows that the selected memory cell M0 has "1" data and each of the remaining unselected memory cells M1 to M15 has "1" data, as well. FIG. 41B shows that the selected memory cell M0 has "1" data and each of the remaining unselected memory cells M1 to M15 has "0" data. In these two cases, the relationship between read currents ID1 and ID2 which are carried to the NAND cell unit satisfies ID1>ID2. This is because the case shown in FIG. 41B is higher than that shown in FIG. 41A in the resistance between the source and the drain of each of the unselected memory cells M1 to M15.

FIGS. 42A and 42B show the relationship among read voltages in the case where the memory cell M15 closest to the common source line SL of the NAND cells is selected. FIG. 42A shows that each of the memory cells M0 to M15 has "1" data and FIG. 42B shows that the selected memory cell M15 has "1" data and each of the remaining unselected memory cells M0 to M14 has "0" data. In these cases, if the voltage VBL is lower than (Vread−Vthw), each of the memory cells M0 to M14 operates in a linear region. The case shown in FIG. 42B is higher in series resistance than the case shown in FIG. 42A. In addition, the memory cell M15 also operates in the linear region and the voltage between the drain and the source of the memory cell M15 is low. Further, the relationship between read currents ID3 and ID4 shown in FIGS. 42A and 42B, respectively, satisfies ID3>ID4.

If the substrate bias effect of each memory cell is taken into account, the memory cell M0 closer to the data transfer line BL is applied with a higher substrate bias than that of the memory cell M15 closer to the common source line SL. As a result, ID2 becomes lower than ID4 and ID1 becomes lower than ID3.

A problem in which the threshold voltage at the erasure state rises occurs by carrying out the erasure, write and read sequences, as shown in FIGS. 44A and 44B, even if the same data is written. Hereinafter, such a problem will be described.

In FIG. 44A, the memory cells M0 to M15 in the NAND cell unit are batch-erased and each is set in a "1" data state (in a step SE1). In a step SE2, the data of the memory cell M0 is read in the voltage relationship shown in FIG. 41A and it is determined whether the data is "0" or "1" at a constant current level Ith. Alternatively, the data may be determined not by applying the constant current Ith but by, for example, precharging the data transfer line with VBL to turn the data transfer line into a floating state, reading the data and detecting the potential change of the data transfer line using a sense amplifier. Further, "0" data is written to each of the memory cells M1 to M15 and the threshold voltage thereof is raised (in a step SE3). Next, in a step SE4, the data of the memory cell M0 is read in the voltage relationship shown in FIG. 41B and it is determined whether the data thus read is "0" or "1" at the constant current level Ith.

In this sequence, even in the memory cell M0 in the same erasure state, the read currents ID1 and ID2 described with reference to FIGS. 41A and 41B differ from each other. Due to this, it is determined in the step SE4 the read current ID2 is not higher than the determination current Ith. Besides, in the step SE2, the read current ID1 becomes higher than the determination current Ith. In other words, the threshold voltage distribution in the step SE4 is raised toward a positive threshold voltage compared with that in the step SE2 at the same current level and statuses indicated by a dashed line and a solid line occur as shown in FIG. 43.

In FIG. 44B, the memory cells M0 to M15 of the NAND cell unit are batch-erased to set to the "1" data state (in a step SE1'). In a step SE2', the data of the memory cell M15 is read in the relationship shown in FIG. 42A and it is determined whether the data is "0" or "1" at the constant current level Ith. Further, "0" data is written to each of the memory cells M0 to M14 to raise the threshold voltage thereof (in a step SE3'). In a step SE4', the data of the memory cell M15 is read in the voltage relationship shown in FIG. 42B and it is determined whether the data is "0" or "1" at the constant current level Ith.

In this sequence, even in the memory cell M15 in the same erasure state, the read currents ID3 and ID4 described with reference to FIGS. 42A and 42B differ from each other. Due to this, the read current ID4 becomes not higher than the determination current Ith in the step SE4' and the read current ID3 becomes higher than the determination current Ith in the step SE2'. In this case, the threshold voltage distribution in the step SE4' is raised toward a positive threshold voltage compared with that in the step SE2' at the same current level and statuses indicated by a dot line and a solid line occur as shown in FIG. 43.

On the other hand, when the same logical value is read, if the read current of the memory cell greatly changes according to the position of the memory cell and the data of the unselected memory cells, it is difficult to shorten maximum read time and to reduce the maximum electromagnetic noise generated by the cell current. This is because the maximum read time is determined by the condition that the read current of a selected cell becomes the lowest and the maximum electromagnetic noise is determined by the condition that the read current of the selected memory cell becomes the highest.

If the memory cell read current is higher further, the floating of the potential of the common source line increases. If write and verification read operations are repeatedly carried out, defect in which "0" data cannot be sufficiently written occurs (see, for example, Japanese Patent Application Laid-open Publication No. 11-260076). In addition, since the maximum current flowing through the data transfer line increases, the rise of wiring resistance and the deterioration of reliability due to electro-migration caused by current stress, the change of the threshold voltage of the transistor and the increase of leakage current following the increase of heat emission disadvantageously occur.

Furthermore, if the threshold voltage of "1" data becomes higher, the difference between the lower limit of the threshold voltage distribution of the "0" data and the upper limit of the threshold voltage distribution of the "1" data decreases. As a result, the probability of, for example, erroneously reading "1" data as "0" data increases. To eliminate the reading error, it is necessary to widen the threshold voltage distribution of, for example, the "0" data toward a higher region. This in turn brings about another disadvantage. That is, the holding characteristic of holding data having a high threshold voltage is inferior to that of data having a low threshold voltage because of the self electric field of accumulated charges. Due to this, if the threshold voltage distribution of the "0" data ranges toward the too high region, it is difficult to obtain sufficient data holding characteristic. In addition, it is necessary to apply a higher pass voltage than the maximum voltage of the threshold voltage distribution to unselected memory cells in the NAND cell unit during reading. Therefore, if read operation is repeated, negative charges are accumulated in the charge accumulation layer to raise the threshold voltage and further increase the upper limit of the threshold voltage in the erasure state. This disadvantageously causes data destruction and reading error.

As described above, according to the conventional NAND type EEPROM, read current differs depending on the data states of the unselected memory cells and the position of the selected memory cell in the NAND cell unit, whereby various disadvantages to the improvement of the EEPROM, such as reading errors and data destruction, occur.

SUMMARY OF THE INVENTION

A semiconductor memory including a memory cell unit, the memory cell unit comprising:

a plurality of memory cells in which each conductance between current terminals changes according to held data, each having a plurality of current terminals connected in series between a first terminal and a second terminal, and each capable of electrically rewriting the data;

a first select switching element electrically connecting said first terminal to a data transfer line; and a second select switching element electrically connecting said second terminal to a reference potential line, wherein said semiconductor memory has a data read mode for forcing the first and second select switching elements of said memory cell unit into conduction, applying a read voltage for forcing a path between the current terminals into conduction or cut-off according to the data of a selected memory cell, to a control electrode of the selected memory cell, applying a pass voltage for forcing a path between the current terminals into conduction irrespectively of the data of each of the memory cells other than said selected memory cell, to the control electrode of each of the memory cells other than said selected memory cell, and detecting presence and absence or magnitude of a current between said data transfer line and said reference potential line, and in said data read mode, voltage nodes equal to or more than two are provided, each of said voltage nodes having a voltage different from each other, and being electrically connected to the control electrode of said first switching element and the control electrode of said second switching element at the same time.

Furthermore, a semiconductor memory including a memory cell unit, the memory cell unit comprising:

a plurality of memory cells in which each conductance between current terminals changes according to held data, each having a plurality of current terminals connected in series between a first terminal and a second terminal, and each capable of electrically rewriting the data;

a first select switching element electrically connecting said first terminal to a data transfer line; and a second select switching element electrically connecting said second terminal to a reference potential line, wherein said semiconductor memory has a data read mode for forcing the first and second select switching elements of said memory cell unit into conduction, applying a read voltage for forcing a path between the current terminals into conduction or cut-off according to the data of a selected memory cell, to a control electrode of the selected memory cell, applying a pass voltage for forcing a path between the current terminals into conduction irrespectively of the data of each of the memory cells other than said selected memory cell, to the control electrode of each of the memory cells other than said selected memory cell, and detecting presence and absence or magnitude of a current between said data transfer line and said reference potential line, and in said data read mode, pass voltage nodes equal to or more than two are provided, each of said pass voltage nodes having voltages different from each other, and being electrically connected to the control electrode of the unselected memory cell between said data transfer line and said selected memory cell, and the control electrode of the unselected memory cell between said reference potential line and said selected memory cell at the same time.

Furthermore, a semiconductor memory including a memory cell unit, the memory cell unit comprising:

a plurality of memory cells in which each conductance between current terminals changes according to held data, each having a plurality of current terminals connected in series between a first terminal and a second terminal, and each capable of electrically rewriting the data;

a first select switching element electrically connecting said first terminal to a data transfer line; and a second select switching element electrically connecting said second terminal to a reference potential line, wherein said semiconductor memory has a data read mode for forcing the first and second select switching elements of said memory cell unit into conduction, applying a read voltage for forcing a path between the current terminals into conduction or cut-off according to the data of a selected memory cell, to a control electrode of the selected memory cell, applying a pass voltage for forcing a path between the current terminals into conduction irrespectively of the data of each of the memory cells other than said selected memory cell, to the control electrode of each of the memory cells other than said selected memory cell, and detecting presence and absence or magnitude of a current between said data transfer line and said reference potential line, and the pass voltage applied to the control electrode of each of said unselected memory cells is made variable according to a position of said selected memory cell in said memory cell unit.

BRIEF DESCRIPTION OF THE DRAWINGS

FIG. 8 shows the voltage relationship of the NAND cell unit in the data read operation in the first embodiment;

FIG. 16 shows the voltage relationship of a NAND cell unit in the data read operation in the modification of the first embodiment;

FIG. 18 shows the relationship between the drain current and the drain voltage of each of select transistors and memory cells in the second embodiment;

FIG. 22 shows the voltage relationship of a NAND cell unit in the data read operation in the modification of the second embodiment;

FIG. 24 shows the cross-sectional structure of a memory array in the third embodiment of the present invention while corresponding to FIG. 6;

FIG. 26 shows the dependency of read current change on word line position in the fourth embodiment and that according to the prior art;

FIG. 33 is a block diagram showing the configuration of an EEPROM in the seventh embodiment of the present invention;

FIGS. 40A and 40B show examples of the setting of pass voltage Vread in a modification of the seventh embodiment;

FIGS. 44A–44B is an explanatory view for data read operation resulting in threshold voltage change according to the prior art.

DESCRIPTION OF THE PREFERRED EMBODIMENTS

The embodiments of the present invention will be described hereinafter with reference to the drawings.

In the following description, a transistor ON state indicates that a higher voltage than the threshold voltage of a transistor is applied to a gate electrode of the MISFET thereby becomes conductive between the source electrode and the drain electrode thereof. A transistor OFF state indicates that a voltage lower than the threshold voltage of the transistor is applied to the gate electrode of the MISFET is thereby cut off electrically the source electrode from the drain electrode thereof. The threshold voltage is assumed as a gate voltage at which a current carried between the source electrode and the drain electrode becomes 40 nA×(channel width W)/(gate length L). In this embodiment, since the configuration of an ordinary CMOS logic circuit is simple, a transistor having a positive threshold voltage will be described by way of example. Unless specified otherwise, it is assumed that if a positive voltage Vcc between, for example, 0.5V and 6V is applied as a control voltage, logic level is "H" and the circuit is turned on, and if a voltage GND of, for example, 0V is applied, logic level is "L" and the circuit is turned off. Further, a value corresponding to the logic level "H" of the logic value is denoted by Vcc and that corresponding to the logical level "L" thereof is denoted by GND for the sake of convenience. Of course, the "L" level may be a voltage of not lower than 0V and of lower than Vcc/2, and the "H" level may be a voltage of not higher than Vcc/2 and of lower than Vcc. This is because a CMOS circuit operates at such a voltage. Needless to say, even if a transistor having a negative threshold voltage is employed, it suffices that the variable range of the gate voltage thereof includes the threshold voltage.

First Embodiment

Figure 1:
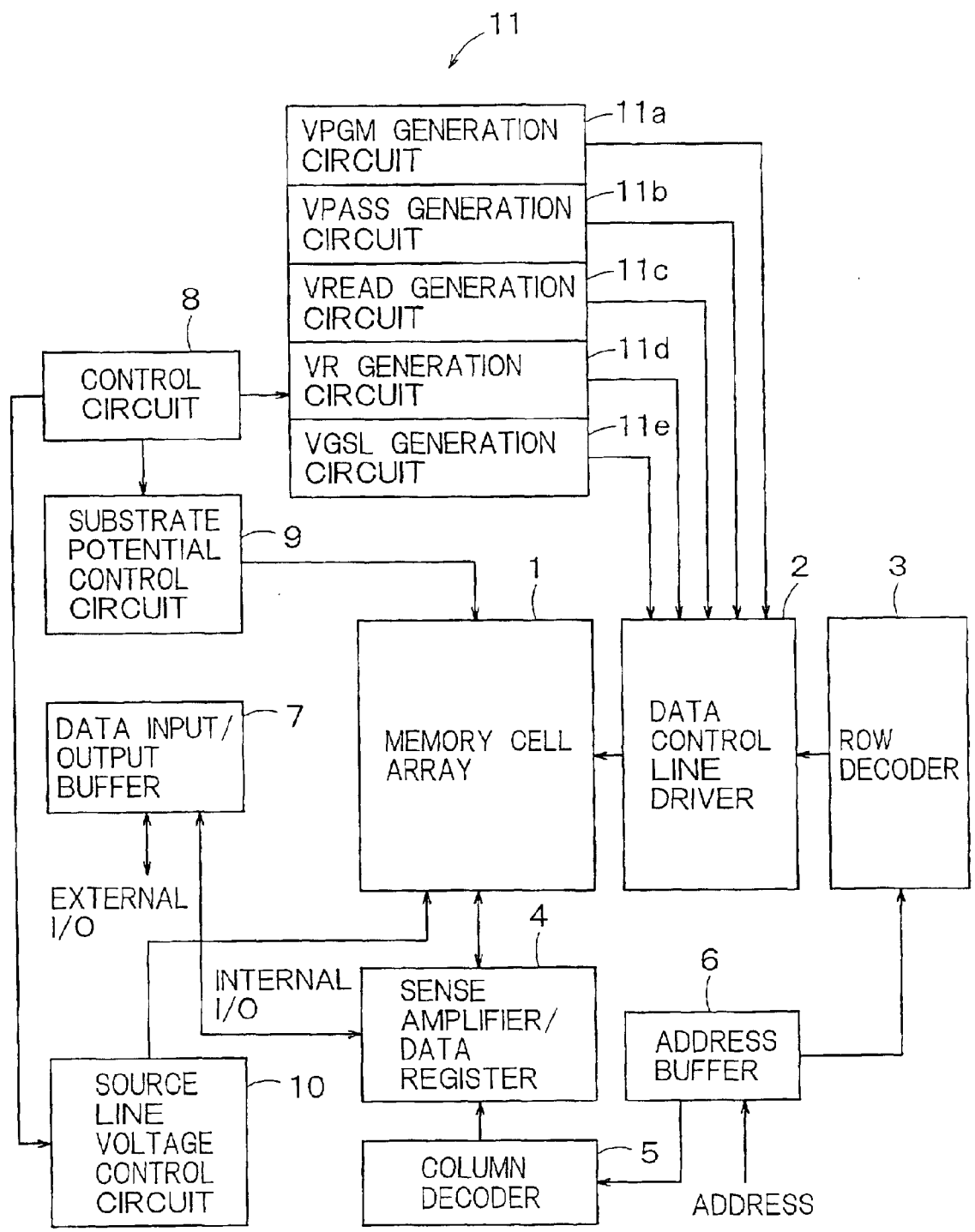
FIG. 1 is a block diagram showing the configuration of an EEPROM in the first embodiment of the present invention.
Figure 2:
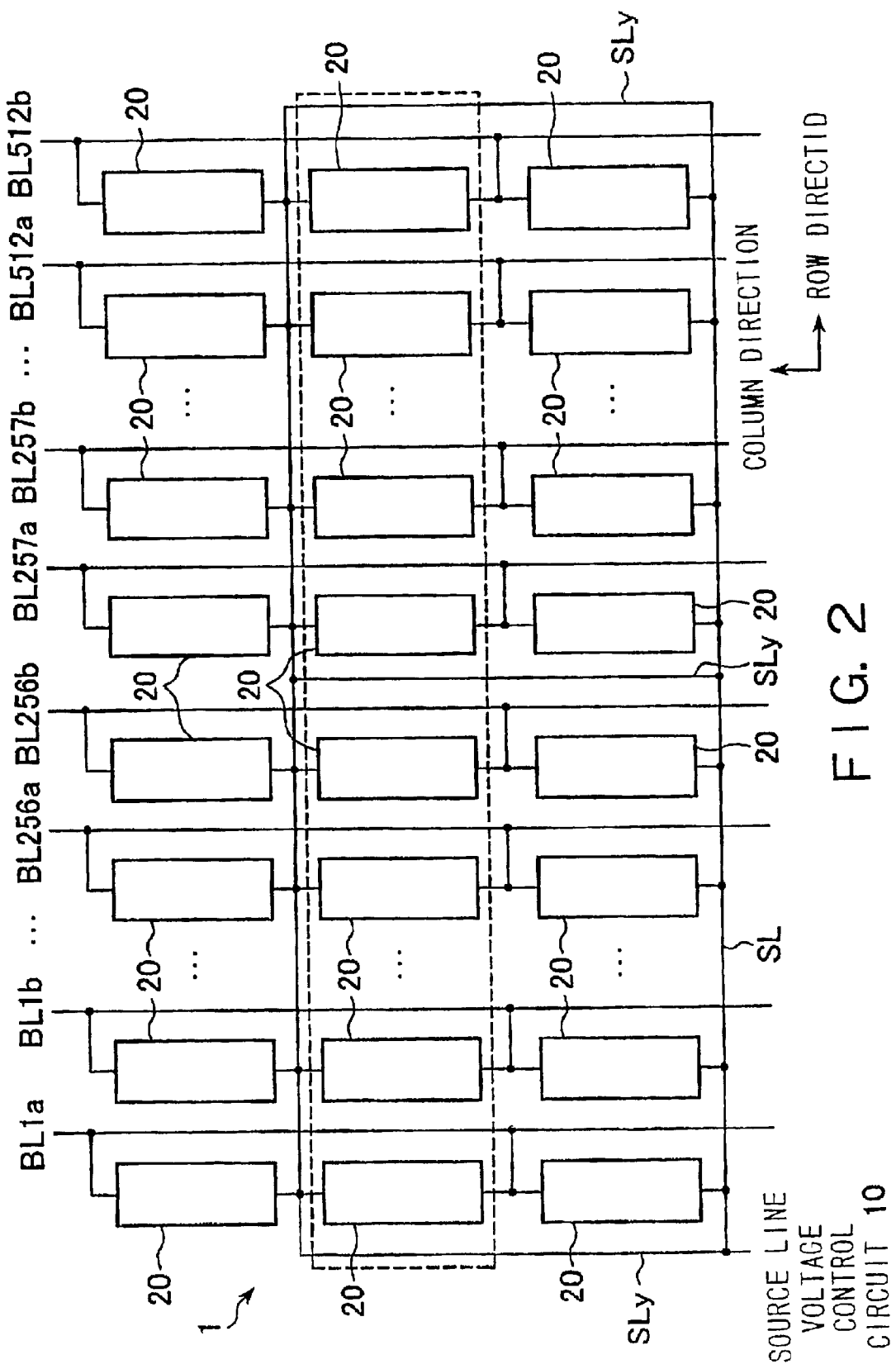
FIG. 2 is an equivalent circuit of a memory cell array of the EEPROM in the first embodiment.

FIG. 1 shows the configuration of a NAND type EEPROM in the first embodiment. FIG. 2 shows the configuration of a memory cell array of the NAND type EEPROM shown in FIG. 1. The memory cell array 1 is constituted so that a plurality of memory cell units (that is, NAND cell units) 20 each of which includes a plurality of memory cells connected in series, are arranged in row and column directions, respectively. Each NAND cell unit 20 is connected between a data transfer line (to be referred to as "bit line" hereinafter) BL continuous in the column direction and a reference potential line (to be referred to as "common source line" hereinafter) continuous in the row direction. A sense amplifier 4 is provided to sense data of the bit line of the memory cell array 1 or to hold written data. The sense amplifier 4 also serves as a data register and mainly consists of a flip-flop circuit.

The sense amplifier 4 is connected to a data input/output buffer 7. The connection therebetween is controlled by the output of a column decoder 5 which decodes an address signal from an address buffer 6, to thereby enable data applied to a data input/output I/O to be written to the memory cell array 1 or the data of the memory cell array 1 to be read to the I/O.

To select a memory cell in the memory cell array or, to be specific, to control data control lines (to be referred to as "word lines" hereinafter) WL's and select gate lines SSL and GSL, a row decoder 3 and a data control line driver 2 are provided. The data control driver 2 applies necessary voltages to a selected data control line and the select gate lines, respectively in response to the decoded output of the row decoder 3.

A substrate potential control circuit 9 is provided to control the potential of a substrate region (which is normally a p type well) in which the memory cell array 1 is formed. Specifically, the substrate potential control circuit 9 is controlled by a control circuit 8 to generate the ground potential GND during data write and data read and to generate an erasure voltage of not lower than 10V during data erasure.

An internal voltage generation circuit 11 is controlled by the control circuit 8, and generates various internal voltages for applying voltages necessary to the selected memory cell in the memory cell array 1 at data write time or data read time. More specifically, the internal voltage generation circuit 11 includes a Vpgm generation circuit 11a which generates a write voltage (Vpgm), a Vpass generation circuit 11b which generates a pass voltage (Vpass) during data write, a Vread generation circuit 11c which generates a pass voltage (Vread) during data read, a Vr generation circuit 11d which generates a read voltage (Vr) applied to a selected memory cell during data read and a VGSL generation circuit 11e which generates a control voltage (VGSL) applied to a select transistor.

The Vpgm generation circuit 11a generates the write voltage Vpgm which is boosted to be higher than the power supply voltage and which is applied to the control gate of the selected memory cell during data write. The Vpass generation circuit 11b generates the pass voltage Vpass which is lower than the write voltage Vpgm and higher than the power supply voltage and which is applied to the control gate of each unselected memory cell during data write. The Vread generation circuit 11c generates the pass voltage Vread which is higher than the power supply voltage and which is applied to the control gate of each unselected memory cell during data read. The Vr generation circuit 11d generates the read voltage Vr which is applied to the control gate of the selected memory cell during data read for threshold voltage determination.

The VGSL generation circuit 11e, which is characteristic of the present invention, generates the select voltage VGSL which is applied to the gate of the select transistor during data read. This voltage VGSL is set lower than the pass voltage Vpass applied to each of the unselected memory cell. If the voltage VGSL is set to be not higher than the power supply voltage Vcc, in particular, the VGSL generation circuit 11e requires no booster circuit, making it possible to reduce a circuit area. It is also possible to reduce the field stress of the select transistor and to thereby improve reliability.

It is preferable that this VGSL generation circuit 11e is constituted as a power supply circuit which is programmable after chip formation. This is because even if the threshold voltages differ among chips, it is possible to correct the voltage VGSL for each chip. For example, sets of fuse circuits and nonvolatile memory elements corresponding to several voltage values, respectively, are included in the VGSL circuit 11e so as to measure a threshold voltage rise quantity per chip and to cut off a fuse using the data or program each nonvolatile memory element during shipment. By doing so, even after wafer dicing, it is possible to correct the voltage VGSL. Alternatively, the voltage VGSL may be supplied not from the internal power supply circuit 11 but from the outside of the EEPROM 1. By doing so, the variation of chips can be effectively dealt with.

Specifically, the write voltage Vpgm is not lower than 6V and not higher than 30V. The pass voltage Vpass during data write is not lower than 3V and not higher than 15V. The pass voltage Vread during data read is not lower than 1V and not higher than 9V. This pass voltage Vread is preferably set to be higher than the upper limit of the write threshold voltage by about 1V to 3V so as to sufficiently secure a read current and to prevent data destruction. The read voltage Vr is set to be the intermediate of the separation width for the threshold voltage distribution of the "0" data and that of the "1" data.

A source voltage control circuit 10 is controlled by the control circuit 8 to control the voltage of the common source line which serves as the reference potential line of the memory cell array 1 according to data write, erasure and read. Although not shown in FIG. 1, a control signal for controlling the activation of the sense amplifier 4, bit line select signals sel1, sel2 and the like are outputted from the control circuit 8.

In the memory cell array 1 shown in FIG. 2, word lines WL0 to WL15 and select gate lines (block select lines) SSL and GSL, although not shown therein, are shared among all the NAND cell units 20 aligned in the row direction as indicated by a broken line (the range of these NAND cell units 20 corresponds to a block of data batch erasure). FIG. 2 shows a structure in which three NAND cell units 20 are arranged in each of the column direction (bit line direction), and in the row direction (word line direction), 2×512 NAND cell units 20 are arranged. However, a plurality of NAND cell units 20 may normally be arranged and preferably $2^i$ (where i is a positive integer) NAND cell units 20 may be arranged in light of address decoding.

Figure 3:
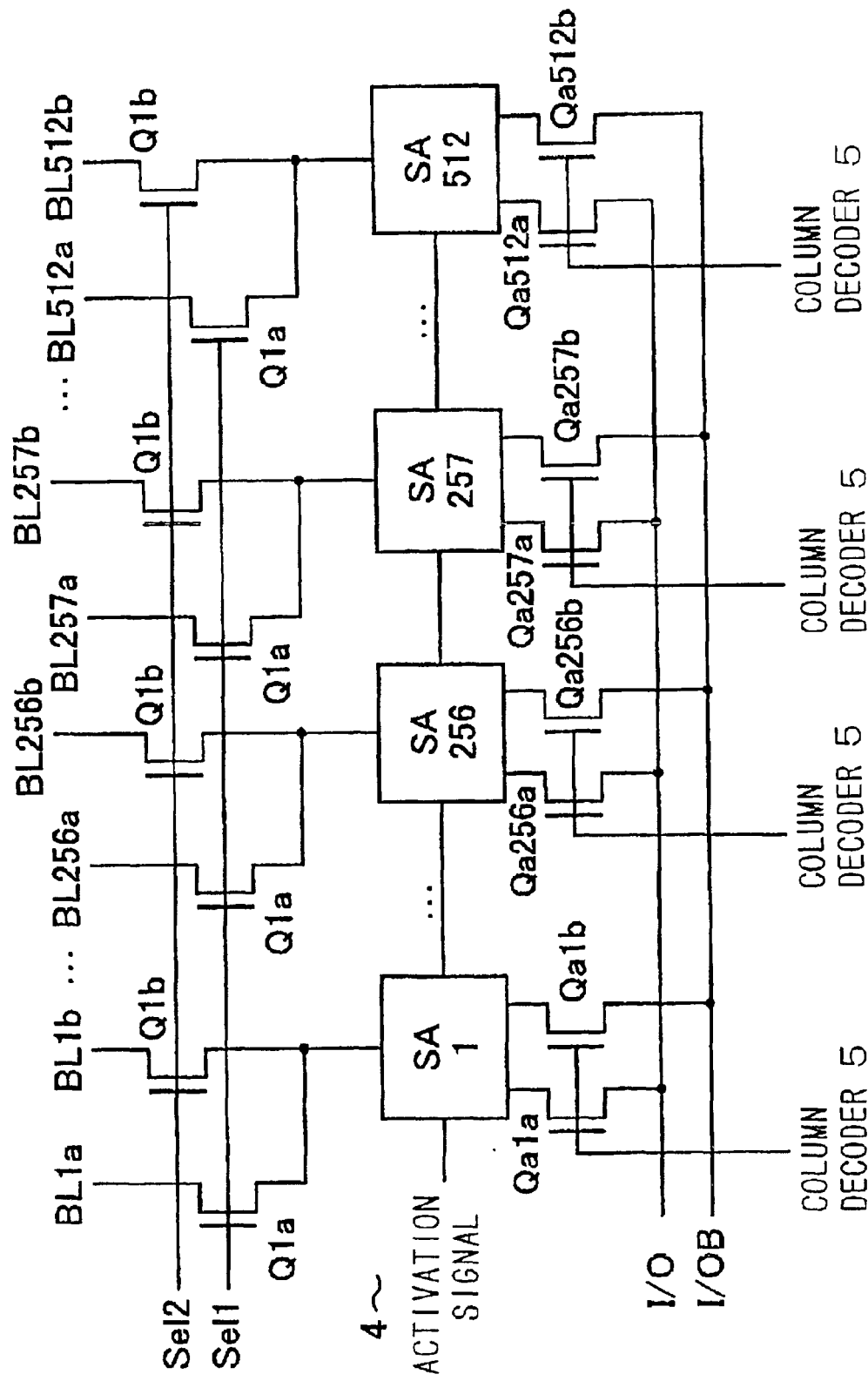
FIG. 3 is a block diagram showing the configuration of a sense amplifier circuit section of the EEPROM in the first embodiment.

As shown in FIG. 3, bit lines BLxa, BLxb (where x=1, 2, ... and 512) shared among the plural NAND cell units 20 in the column direction are connected, through transistors Qxa and Qxb, to one sense amplifier SAx in the sense amplifier circuit 4. Since the sense amplifier circuit 4 requires a larger transistor than the single memory cell, one sense amplifier SAx is shared among a plurality of bit lines to thereby reduce an area occupied by the sense amplifiers. While FIG. 3 shows that the number of bit lines BL's connected to one sense amplifier is 2, the number may be, for example, 1 or 4. Preferably, the number of bit lines BL's is $2^n$ (where n is a natural number) since the address decoding circuit can be simplified.

As described above, the sense amplifier circuit 4 functions to not only read data from a memory cell but also temporarily hold data written to the memory cell, i.e., functions as a data register. Further, the sense amplifier 4 is connected, through transistors Qaxa and Qaxb, to data lines I/O and I/OB connected to the data input/output buffer 7. It is preferable that the data lines I/O and I/OB are formed in the cell row direction so as to reduce capacitance coupling noise given to the bit lines BL's and caused by the voltage change of the data lines I/O and I/OB. The gate of each of the transistors Qaxa and Qaxb is controlled according to the output of the column decoder 5, whereby it is possible to read data applied to the data line I/O or I/OB to the sense amplifier circuit 4 or to output data from the sense amplifier circuit 4 to the data line I/O or I/OB.

In FIG. 2, the common source line SL is arranged to be common to a plurality of NAND cell units 20 in the row direction of the memory cell array 1. Further, wirings SLy's short-circuiting this common source line SL in the column direction are provided. The wirings SLy's and the common source line SL form a mesh structure as a whole. This mesh structure can suppress potential rise due to the read current of the common source line SL. Since the wirings SLy's are formed out of the same wiring layer as that of diffused regions or the data transfer lines on the semiconductor substrate of the memory cell array 1, no memory cell cannot be arranged in the wiring SLy regions. Therefore, by making the line density of the bit lines BL's higher than that of the wirings SLy's, the cell occupied area is secured.

While one short-circuit wiring SLy is provided for 512 bit lines BL's in the example of FIG. 2, the number of bit lines per wiring SLy may be arbitrarily set to be not lower than 2. This common source line SL is electrically connected to the source line voltage control circuit 10. The source line voltage control circuit 10 outputs the ground potential GND during data write.

The sense amplifiers in the sense amplifier circuit 4 are simultaneously activated in response to an activation signal applied from the control circuit 8 to enable simultaneously reading data of a plurality of bit lines. The gates of the transistors Qxa's are connected to the control line sel1 in common in the row direction and those of the transistors Qxb's are connected to the control line sel2 in common. By so connecting, it is possible to conduct the selection of the densely arranged memory cell array 1 with a small wiring area using the select signals sel1 and sel2.

Figure 4A:
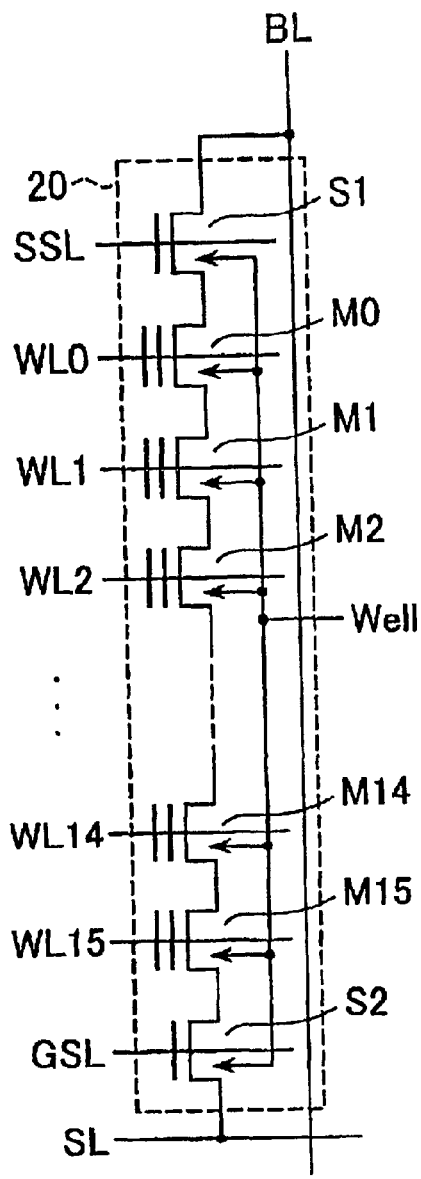
FIG. 4A is a circuit diagram of an equivalent circuit of a NAND cell unit of the EEPROM and FIG. 4B is a plan view of the NAND cell units of the EEPROM in the first embodiment.
Figure 4B:
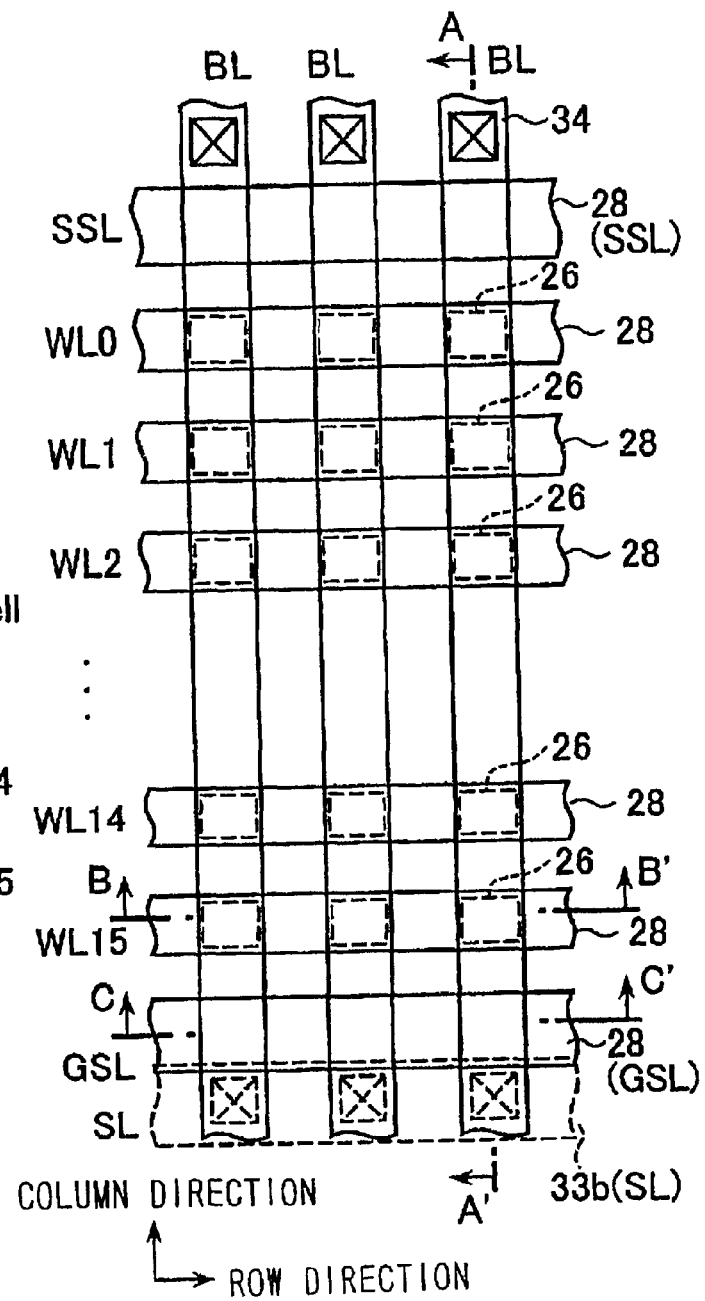

FIGS. 4A and 4B are an equivalent circuit of one NAND cell unit 20 and a plan view of three NAND cell units 20, respectively. In the NAND cell unit 20, nonvolatile memory cells M0 to M15 of the MISFET structure, each having a floating gate 26 which serves as the charge accumulation layer, are connected in series. One end of the NAND cell unit 20 is connected, through a select transistor S1 which consists of a MISFET, to the bit line BL and the other end thereof is connected, through a select transistor S2 which consists of a MISFET, to the common source line SL. The control gates of the memory cells M0 to M15 are connected to a word lines 28 (WL0 to WL15), respectively. The gate electrodes of the select transistors S1 and S2 are connected to the select gate lines 28 (SSL) and 28 (GSL) (block select lines) SSL and GSL, respectively so as to select one NAND cell unit from among a plurality of NAND cell units along the bit line BL and to connect the selected NAND cell unit to the bit line BL.

The select gate lines SSL and GSL to which the gates of the select transistors S1 and S2 are connected, respectively, are continuously formed out of a conductor on the same layer as that of the floating gates of the word lines WL0 to WL15 to which the control gates of the memory cells are connected, respectively, in the row direction of the memory cell array 1. It is noted that the NAND cell unit 20 may include at least not less than one select gate line SSL and not less than one select gate line GSL. In this embodiment, an example in which 16=$2^4$ memory cells are connected in one NAND cell unit 20. The number of memory cells connected to the bit lines and the word lines may be plural but preferably $2^n$ (where n is a positive integer) in light of address decoding.

Figure 5:
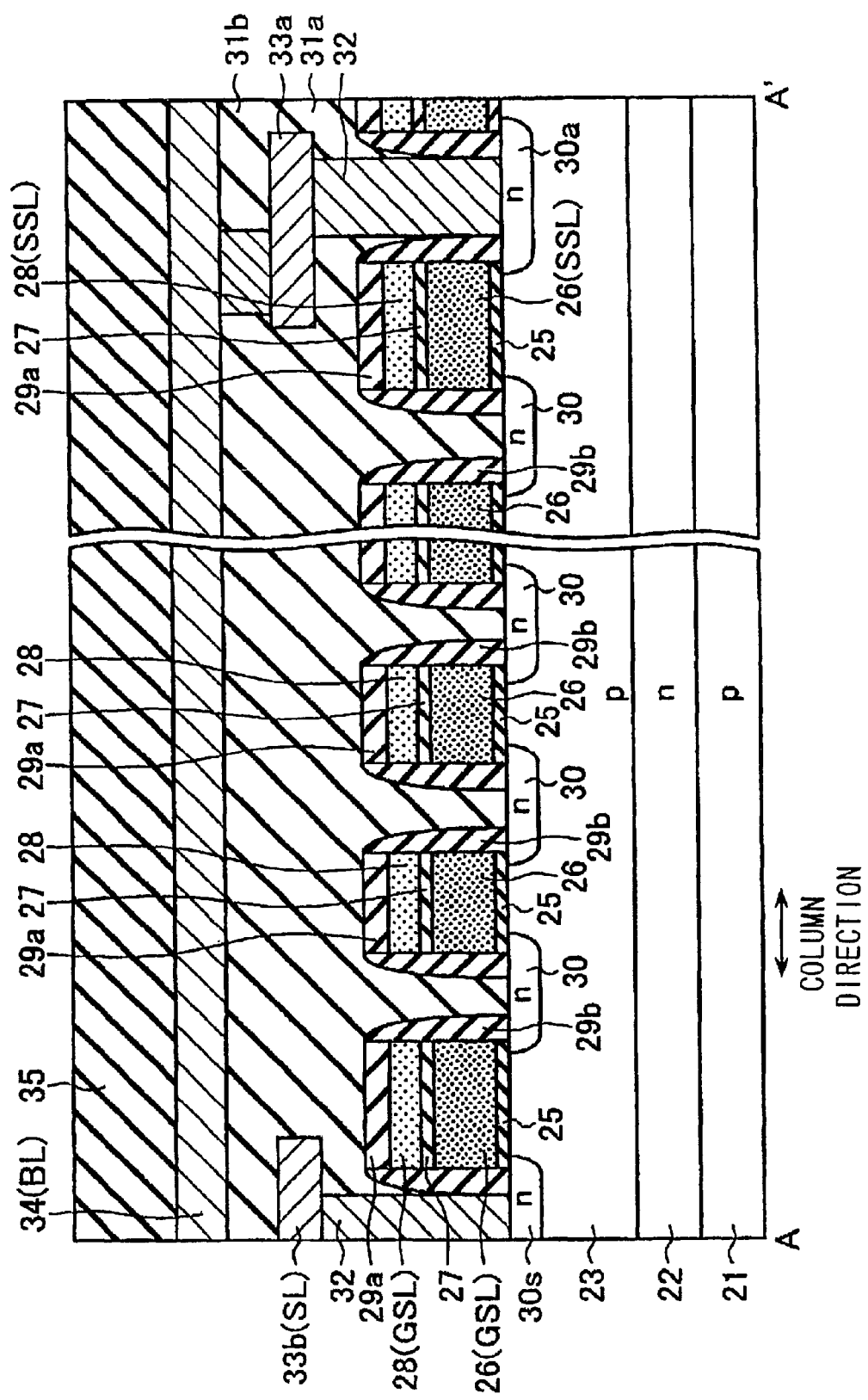
FIG. 5 is a cross-sectional view taken along line A–A' of FIG. 4B.
Figure 6:
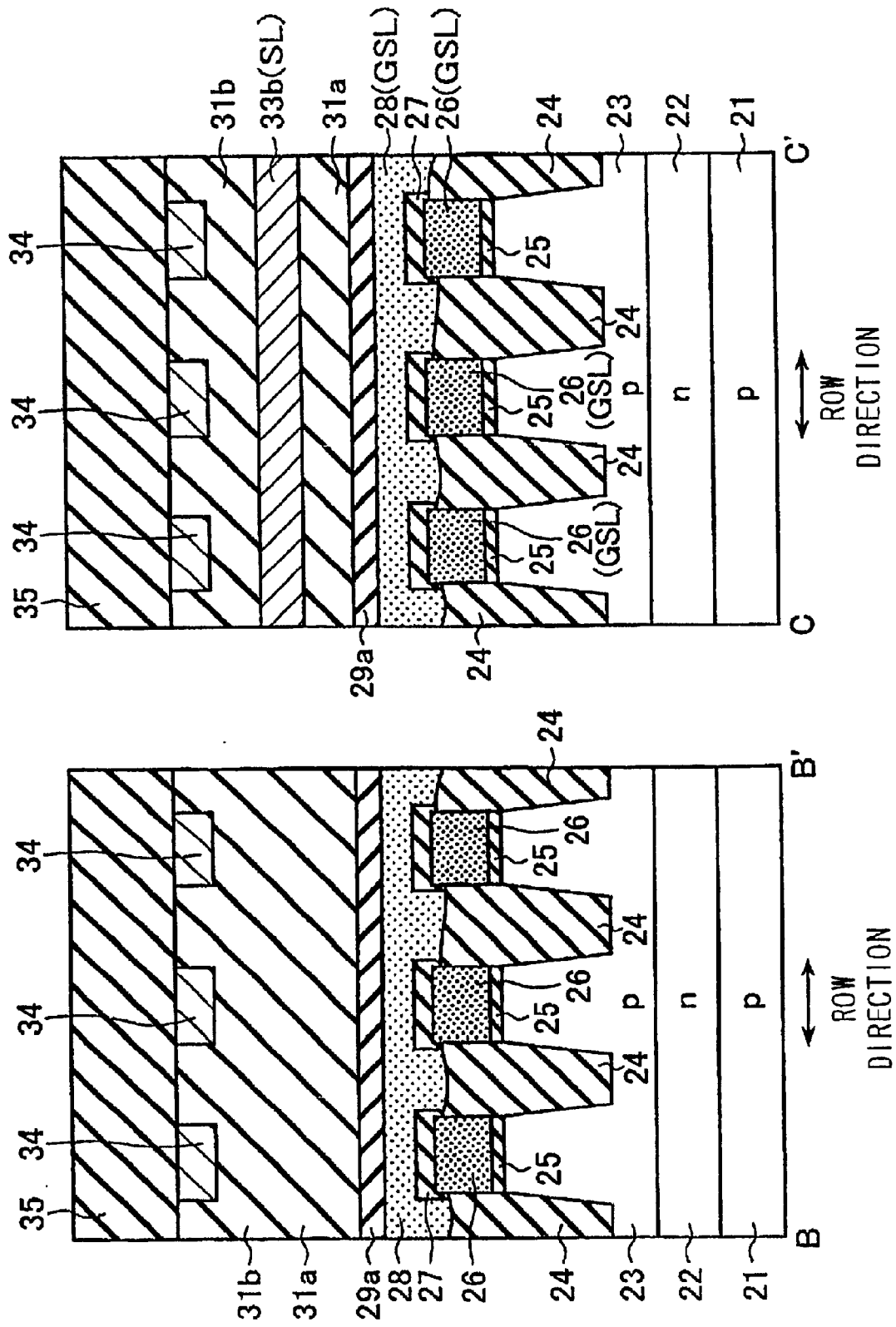
FIG. 6 is a cross-sectional view taken along line B–B' of FIG. 4B.

FIGS. 5 and 6 show cross-sections taken along lines A–A', B–B' and C–C' of FIG. 4B. The cell array is formed in a p type well 23 which is formed in the n type well 22 of a p type silicon substrate 21. The boron density of the p type well 23 is set to fall within a range between, for example, $10^{14}$ cm$^{-3}$ and $10^{19}$ cm$^{-3}$. The p type well 23 is isolated from the p type silicon substrate 21 by the n type well 22, so that a voltage can be applied to the p type well 23 independently of the p silicon substrate 21. This can reduce load on the booster circuit and to suppress consumption power during data erasure.

The floating gate 26 of each memory cell and the gate electrodes 26 (SSL), 26 (GSL) of the select transistors S1 and S2 formed simultaneously with the memory cells are formed out of polysilicon, to which phosphorus or arsenic having a S2 which consists of a MISFET, to the common source line SL. The control gates of the memory cells M0 to M15 are connected to a word lines 28 (WL0 to WL15), respectively. The gate electrodes of the select transistors S1 and S2 are connected to the select gate lines 28 (SSL) and 28 (GSL) (block select lines) SSL and GSL, respectively so as to select one NAND cell unit from among a plurality of NAND cell units along the bit line BL and to connect the selected NAND cell unit to the bit line BL.

The select gate lines SSL and GSL to which the gates of the select transistors S1 and S2 are connected, respectively, are continuously formed out of a conductor on the same layer as that of the floating gates of the word lines WL0 to WL15 to which the control gates of the memory cells are connected, respectively, in the row direction of the memory cell array 1. It is noted that the NAND cell unit 20 may include at least not less than one select gate line SSL and not less than one select gate line GSL. In this embodiment, an example in which 16=$2^4$ memory cells are connected in one NAND cell unit 20. The number of memory cells connected to the bit lines and the word lines may be plural but preferably $2^n$ (where n is a positive integer) in light of address decoding.

FIGS. 5 and 6 show cross-sections taken along lines A–A', B–B' and C–C' of FIG. 4B. The cell array is formed in a p type well 23 which is formed in the n type well 22 of a p type silicon substrate 21. The boron density of the p type well 23 is set to fall within a range between, for example, $10^{14}$ cm$^{-3}$ and $10^{19}$ cm$^{-3}$. The p type well 23 is isolated from the p type silicon substrate 21 by the n type well 22, so that a voltage can be applied to the p type well 23 independently of the p silicon substrate 21. This can reduce load on the booster circuit and to suppress consumption power during data erasure.

The floating gate 26 of each memory cell and the gate electrodes 26 (SSL), 26 (GSL) of the select transistors S1 and S2 formed simultaneously with the memory cells are formed out of polysilicon, to which phosphorus or arsenic having a concentration of $10^{18}$ to $10^{21}$ cm$^{03}$ is added, are formed on the surface of the p type well 23 to have a thickness of 10 nm to 500 nm through gate insulating films 25 each having a thickness of 3 nm to 15 nm and consisting of a silicon oxide film or an oxynitride film. The gate insulating films having the same thickness are used for the memory cells M0 to M15 and the select transistors S1 and S2.

Each floating gate 26 is formed in an element formation region defined by an element isolation insulating film 24 formed out of a silicon oxide film. The floating gate 26 can be formed by, for example, depositing the material film of the floating gate 26 on the entire surface of the p type well 23 through the gate insulating film 25, patterning the deposited material film, etching the p type well 23 by a depth of, for example, 0.05 to 0.5 μm and then embedding the element isolation insulating film 24 in the p type well 23. As a result, the floating gates 26 can be formed entirely on a non-irregular flat surface.

The gate electrodes 26 (SSL) and 26 (GSL) formed out of the same material as that of the floating gates 26 are continuously formed in the row direction of the cell array 1 as the select gate lines SSL and GSL, respectively.

Control gates 28, 28 (SSL) and 28 (GSL) each made of polysilicon to which phosphorus, arsenic or boron having a concentration of $10^{17}$ to $10^{21}$ cm$^{-3}$, for example, is added, a layered structure of Wsi (tungsten silicide) and polysilicon or a layered structure of NiSi, MoSi, TiSi, CoSi and polysilicon, are formed, through block insulating films 27 each formed out of a silicon oxide film, an oxynitride film or a silicon oxide film/silicon nitride film/silicon oxide film and having a thickness of 5 nm to 30 nm, on the floating gates 26 by a thickness of 10 nm to 50 nm, respectively. These control gates 28 are continuously formed in the row direction of the cell array 1 and become the word lines WL0 to WL15, respectively. Likewise, control gates 28 (SSL) and 28 (GSL) are continuously formed in the row direction, short-circuited with the gate electrodes 26 (SSL) and 26 (GSL) and thereby constitute the select gate lines SSL and GSL, respectively.

According to the gate structure in this embodiment, the sidewalls of the element formation region of the p type well 23 are covered with the insulating films 24. It is, therefore, possible to prevent the p type well 23 from being exposed by etching performed prior to the formation of the floating gates 26 and to prevent the floating gates 26 from being located below the p type well 23. This makes it difficult to concentrate the gate field and generate a parasitic transistor having a lowered threshold voltage in the boundary between the p type well 23 and the insulating film 24. In addition, it is difficult to generate a write threshold voltage drop phenomenon resulting from the field concentration, thereby making it possible to form a transistor having higher reliability.

As shown in FIG. 5, the upper surface of the gate structure is covered with a silicon nitride film 29a, and a side wall insulating film 29b made of a silicon nitride film (or silicon oxide film) and having a thickness of, for example, 5 nm to 200 nm is formed on each side surface of the gate structure. In addition, n type diffused layers 30 which become a source and a drain, respectively, are formed on the gate electrode in a self-aligned manner. A floating gate type EEPROM cell having the quantity of charges accumulated in the floating gate 26 as information quantity is formed out of the diffused layers 30, the floating gate 26 and the control gate 28. The gate length of the floating gate type EEPROM cell is set at, for example, not higher than 0.5 um and not lower than 0.01 um. The source and drain n type diffused layers 30 are formed out of, for example, phosphorus, arsenic or antimony having a surface concentration of $10^{17}$ to $10^{21}$ cm$^{-3}$ to each have a thickness of 10 to 500 nm. Further, these n type diffused layers 30 are shared among the adjacent memory cells to thereby realize a NAND cell unit.

In this embodiment, the gate length (channel length) of each of the gate electrodes 26 (SSL) and 26 (GSL) of the select transistors S1 and S2 is set larger than the gate length of each memory cell to, for example, not higher than 1 um and not lower than 0.02 um. By so forming, it is possible to secure a high on-off ratio of block selection to block non-selection and to prevent writing error or reading error. Further, it is preferable that each of the select transistors S1 and S2 has the same gate insulating film 25 as that of the memory cell so as to decrease the number of steps and to reduce cost.

The n type diffused layer 30d out of the n type diffused layers 30d and 30s formed on the both ends of the NAND cell unit, respectively, is connected to a relay electrode 33a through a contact plug 32 embedded into an interlayer insulating film 31a and further connected to the bit line 34 through an interlayer insulating film 31b. The bit line 34 is formed out of tungsten, tungsten silicide, titanium, titanium nitride, aluminum or the like and continuously provided in the column direction of the cell array 1. The other n type diffused layer 30s is connected to a common source line 33b which is formed simultaneously with the relay electrode 33a and which is continuous in the row direction of the cell array 1, through a contact plug 32. The common source line 33b can be formed out of the same material as that of the bit line 34. The contact plug 32 is formed out of impurity-doped polycrystalline silicon, tungsten, tungsten silicide, aluminum, titanium, titanium nitride or the like.

It is also possible to continuously form the n type diffused layer 30s in the row direction of the cell array 1 to be used as the common source line SL. An insulating film protection layer 35 of SiO$_2$, SiN, polyimide or the like is covered on the bit line BL 34. In addition, although not shown, an upper wiring of W, Al or Cu is formed on the bit line BL 34.

The present invention is characterized by a data read method for the NAND type EEPROM constituted as stated above as will be described later in detail. Data erasure and data write are performed by conventional methods, e.g., methods disclosed by Japanese Patent Application Laid-open Publication No. 2000-76882. Briefly, data erasure is batch erasure in each NAND cell block, indicated by the broken line of FIG. 2, among which word lines are shared. In the data erasure, a boosted erasure voltage Vera generated from the substrate potential control circuit 9 is applied to the p type well in which the memory cell array 1 is formed and all the word lines in the selected NAND cell block are set at 0V. By doing so, the electrons of the floating gates of all the memory cells in the selected NAND cell block are emitted to the substrate by a tunnel current and all the memory cells turn into "1" state (erasure state) in which threshold voltage is low.

In data write, Vcc (in case of "1" data, i.e., write prohibition) or Vss (in case of "0" data) is applied to the bit line BL in accordance with data to be written, thereby precharging a NAND cell channel. The NAND cell channel thus precharged to high level turns into a floating state when the bit line side select transistor S1 is turned off. Thereafter, the boosted write voltage Vpgm is applied to the selected word line and the pass voltage Vpass is applied to each unselected word line.

As a result, a high field is generated between the selected word line and the channel which is set to have low level, electrons are injected into each floating gate and "0" data having a high threshold voltage is written to each memory cell. The potential of the channel precharged to high level is raised by capacitive coupling and no electrons are injected to the channel, whereby the channel is maintained in the "1" data state (erasure state). Likewise, no electrons are injected to the memory cells along the unselected word lines each applied with the pass voltage Vpass and each of the memory cell is maintained in the "1" data state.

During data erasure and data write, verification read is carried out in order to check data erasure and data write. That is, the application of an erasure pulse and verification read for data erasure are repeated to force each memory cell into a certain erasure threshold voltage range. Likewise, during the data write, the application of a write pulse and the verification read for data write are repeated to force each memory cell into a certain write threshold voltage range.

The data read operation in this embodiment will next be specifically described.

Figure 7:
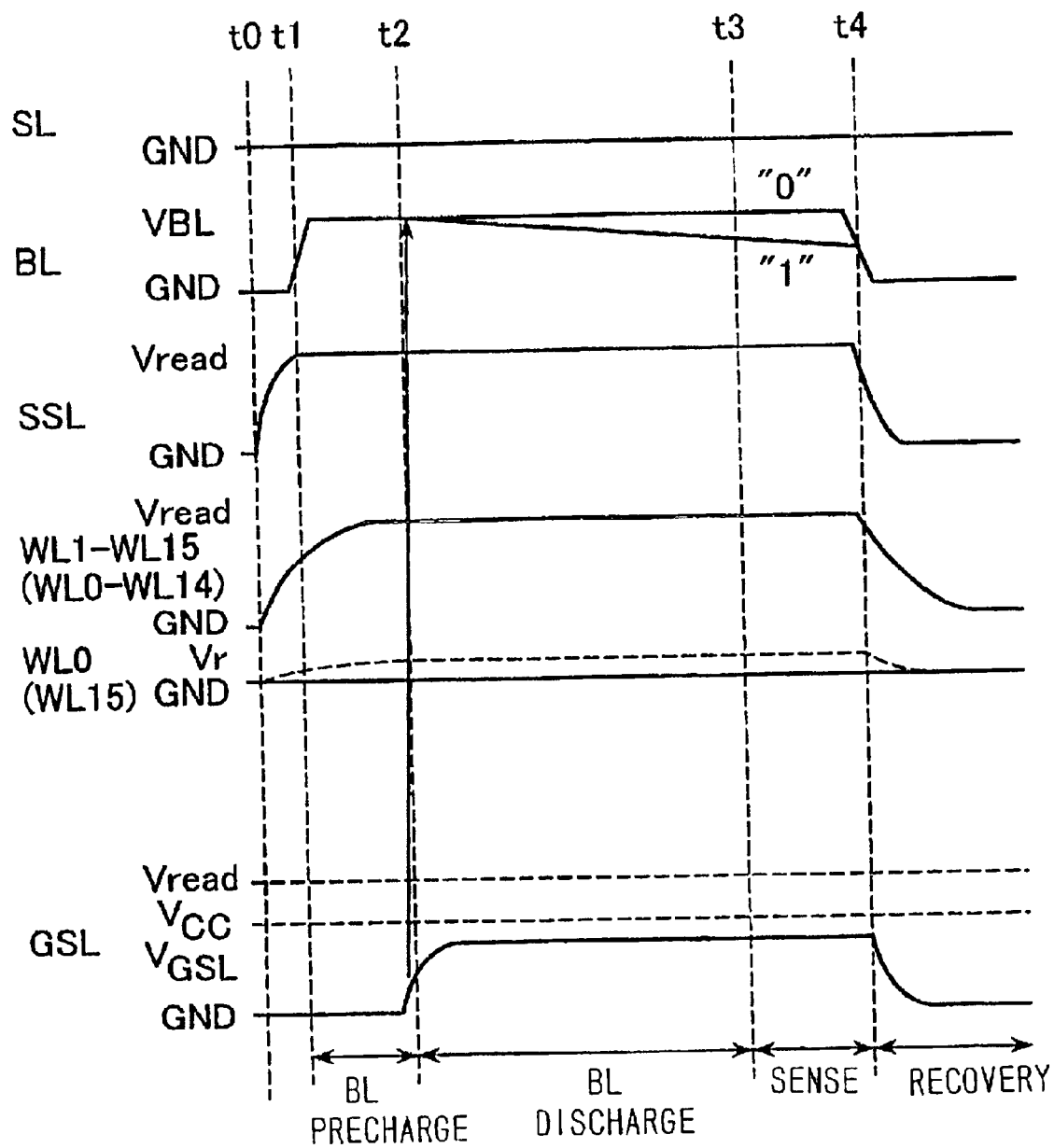
FIG. 7 is a timing chart showing data read operation timing in the first embodiment.

FIG. 7 is a data read timing chart in case of selecting the word line WL0 and carrying a read current from the bit line BL to the common source line SL. FIG. 8 shows the relationship of voltages applied to the memory cells while noting one selected NAND cell unit 20 during a bit line discharge period and a sense period following the bit line discharge period shown in FIG. 7.

While showing a case in which the memory cell M0 closest to the bit line BL in the NAND cell unit 20 is selected, FIGS. 7 and 8 also show a case in which the memory cell M15 on the common source line SL side is selected instead of the memory cell M0.

During data read, the row decoder 3 and the data control line driver 2 corresponding to the block from which data is to be read are activated, the pass voltage Vread is applied to the select gate line SSL, the read voltage Vr is applied to the word line WL0, the pass voltage Vread is applied to each of the remaining unselected word lines WL1 to WL15 and the ground potential GND is applied to the select gate line GSL (at time t0). The select gates SSL, GSL and the word lines WL0 to WL15 in the unselected block are each maintained in a floating state or to have a voltage 0V during data read so as to prevent data reading error or data destruction from occurring.

Figure 9:
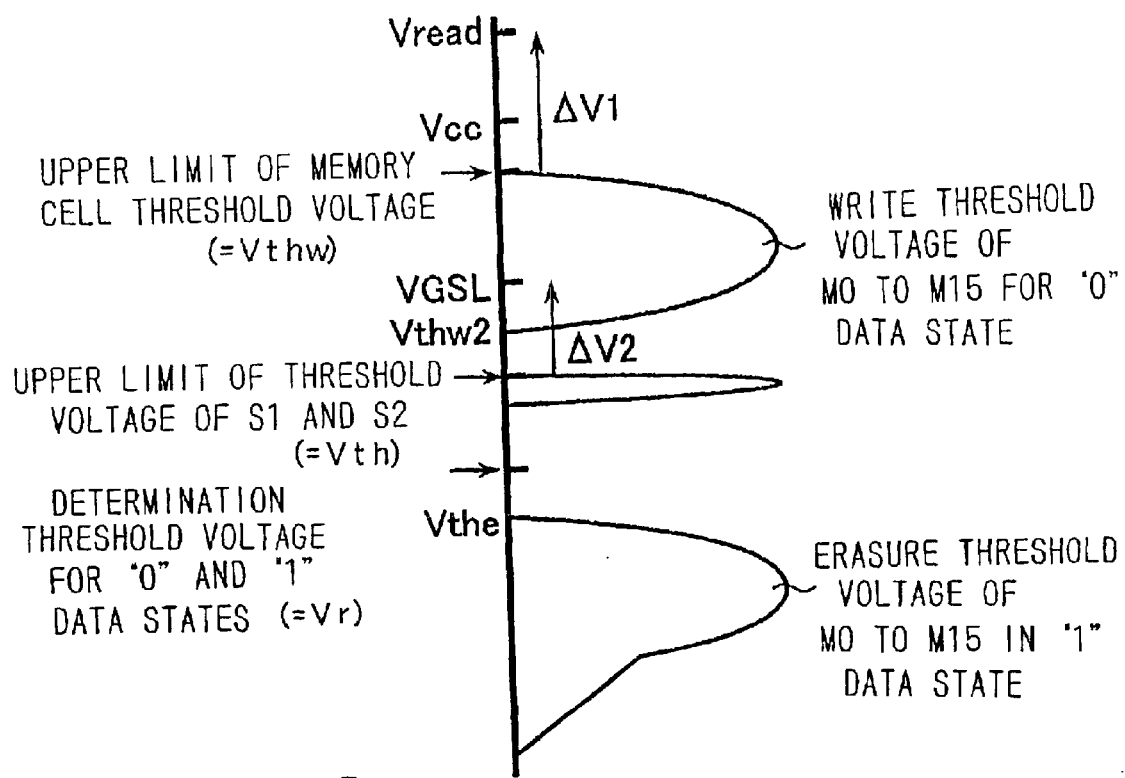
FIG. 9 shows the relationship between data threshold voltage distributions and read operating voltages.

The read voltage Vr is a voltage in a range between Vthw2 and Vthe, where Vthw2 is the lower limit of the threshold voltage distribution after the "0" data write and Vthe is the upper limit of the threshold voltage distribution after the "1" data erasure shown in FIG. 9. It is most preferable that the read voltage Vr is set at about (Vthw2+Vthe)/2, e.g., between −0.5 and 4V in light of a read margin. It is particularly desirable that Vthe is set negative and Vthw2 is set positive. This is because the read voltage Vr can be set at the ground potential GND and it is, therefore, possible to dispense with the Vr generation circuit 11d.

In addition, the read voltage Vr is preferably set to be not lower than the ground potential GND. By so setting, no negative voltage is applied to the diffused layers of the transistor of, the data control line driver 2, connected to the word line WL0 to WL15 and it is, therefore, possible to dispense with the negative voltage generation circuit. As a result, the p type well, in which the n channel MISFET of the data control line driver 2 is formed, can be set to have the ground potential GND and formed without being separated between the p type substrate 21 and the n type region. It is thereby possible to reduce the circuit area of the data control line driver 2. Further, no negative voltage is applied to the diffused layers, even a few carriers are not injected there into due to the forward bias of the diffused layers, making it possible to prevent latch-up. Besides, even if short-circuit error occurs to the word lines WL0 to WL15 or in the memory cell array 1, no negative voltage is applied to the p type well 23 or the n type diffused layers 30 of the memory cell array 1 and read data destruction does not occur as a result of injection of a few carriers.

The pass voltage Vread applied to the unselected word lines WL1 to WL15 and the select gate line SSL is outputted from the Vread generation circuit 11c and set to be higher than the upper limit Vthw of the threshold voltage distribution of the "0" data of the memory cell.

In this embodiment, as shown in FIG. 5, the gate length (channel length) of each of the select transistors S1 and S2 is larger than that of the control gate of each of the memory cells M0 to M15. On the other hand, it is known that abnormal resistance increase effect that if line width is narrower, resistance rises, occurs to CoSi or TiSi which is the material of these gates. Therefore, the gate electrode of each of the select transistors S1 and S2 is lower in resistance than the control gate of each of the memory cells M0 to M15 and the voltage of the gate electrode of the select transistor S1 is boosted to the pass voltage Vread faster than the control gate of each of the memory cells M0 to M15. Further, by driving the select gate line GSL lower in resistance than the word lines WL0 to WL15 during a bit line discharge period, it is possible to decrease the variation of the timing of reading the memory cells connected in parallel.

The bit line BL is charged with the voltage VBL using a power supply node included in the sense amplifier circuit 4 slightly later than the rise of the word lines WL0 to WL15 and the select gate line SSL (at time t1). At this time, it is preferable that VBL is not lower than the ground potential GND and not higher than the power supply potential Vcc. This is because the reliability of the transistors which constitute the sense amplifier circuit 4 can be ensured about at the power supply voltage Vcc by so setting.

If an n channel MISFET is used as a sense amplifier transistor, it is desirable that the voltage VBL is set to be not lower than the threshold voltage of the MISFET, e.g., about 1V so as to improve the sensitivity of the sense amplifier. Thereafter, if the memory cell M0 is in the "1" data state, i.e., erasure state, the sources, drains and channel regions of the select transistor S1 and the memory cells M0 to M15 are charged with the voltage VBL. In other words, the period described so far corresponds to the bit line (BL) precharge period in which the bit line BL and the NAND cell unit are charged.

This BL precharge period needs to be longer than the time required until the voltage of each unselected word line is sufficiently boosted up to the pass voltage Vread, e.g., 100 nS to 10 uS. Next, the select gate line GSL on the common source line SL side is set to have the positive control voltage VGSL (at time t2). As shown in FIG. 9, the control voltage VGSL is set to be not lower than the upper limit Vth of the threshold voltage of each of the select transistors S1 and S2 and not higher than the pass voltage Vread. By so setting, if the threshold voltage of the memory cell M0 is not higher than Vr, the NAND cell unit becomes conductive and the potential of the bit line BL is lowered. If the threshold voltage of the memory cell M0 is higher than the read voltage Vr, i.e., if the memory cell M0 has "0" data, the memory cell M0 is turned off and the potential of the bit line BL is not lowered. In other words, the bit line BL is discharged according to the data state of the memory cell M0, and a period in which the bit line BL is discharged corresponds to the bit line (BL) discharge period. This discharge period needs to be not shorter than the time required until the bit line BL is sufficiently discharged, e.g., 100 ns to 100 uS.

Next, the potential change of the bit line BL is determined by the sense amplifier circuit 4 and data is read to a data register (at time t3). At this time, if a voltage clamp circuit for the bit line is provided in the sense amplifier circuit 4, data can be read with high sensitivity without greatly changing the potential of the bit line BL. The sense amplifier circuit 4 is not necessarily a current sense type circuit.

After the end of the sense period, at time t4, a recovery period in which the potentials of the select gate lines GSL, SSL, the word lines WL0 to WL15 and the bit line BL are returned to initial values, respectively, starts.

Differently from the conventional memory, the NAND type EEPROM in this embodiment is characterized in that the control voltage for driving the select transistor S2 on the common source line SL side is set at the voltage VGSL which is lower than the pass voltage Vread applied to each unselected word line. By so setting, the conductance of the select transistor S2 becomes lower than that of the memory cell which has the highest threshold voltage among the unselected memory cells M1 to M15 other than the selected memory cell M0.

The relationship in magnitude between the conductance of the select transistor S2 and that of the memory cell having the highest threshold voltage will be described hereinafter in detail.

FIG. 9 shows the relationship among the threshold voltages in this embodiment. Namely, in this embodiment, the difference ?V2 between the voltage VGSL of the select gate line GSL and the upper limit (=Vth) of the threshold voltage of the select transistor S2 is smaller than the difference ?V1 between the pass voltage Vread and the upper limit Vthw of the write threshold voltage distribution of each memory cell so as to realize the relationship in magnitude between the conductances described above.

Figure 10:
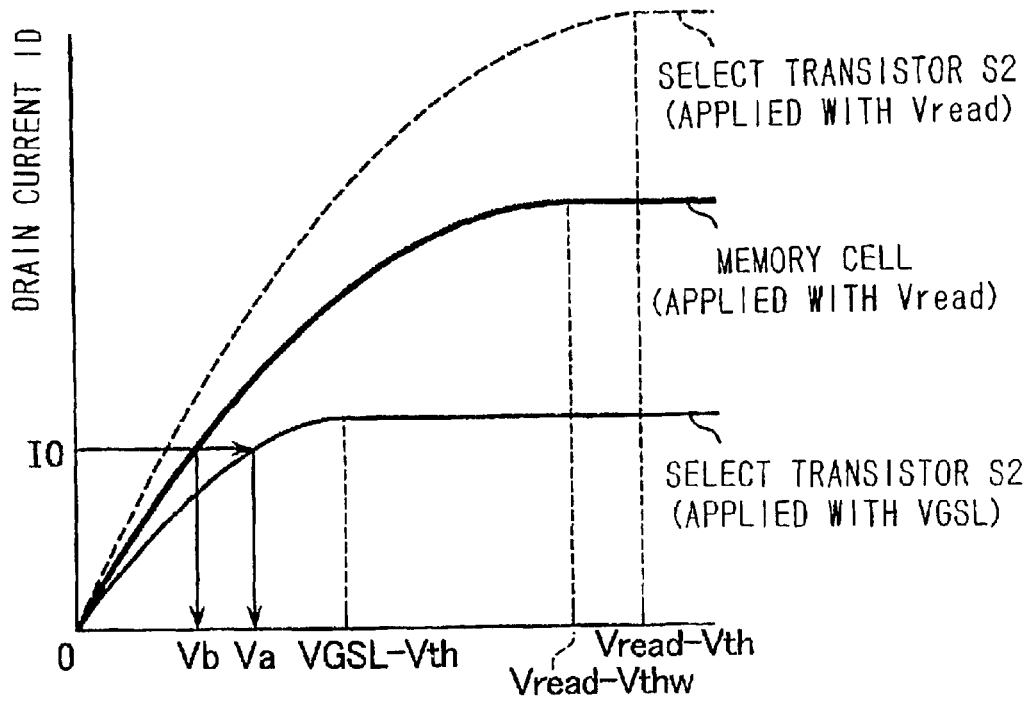
FIG. 10 shows the relationship between the drain current and the drain voltage of each of select transistors and memory cells in the first embodiment.

FIG. 10 shows the typical characteristics of the memory cell and the select transistor S2 with regards to the drain current ID and the drain voltage VD in the case that a source is grounded in the gate voltage conditions described above. In FIG. 10, a thick solid line indicates the characteristic of the memory cell and shows that if the drain voltage VD of the memory cell rises to not lower than (Vread–Vthw), the memory cell turns into a pinch-off region (pentode action region, that is, a saturation region in which a drain current is saturated). A thin solid line indicates the characteristic of the select transistor S2 and shows that if the drain voltage of the select transistor S2 rises to not lower than (VGSL–Vth), the select transistor S2 turns into a saturation region. In addition, the thin solid line shows that if the drain voltage is not higher than (VGSL–Vth), the select transistor S2 turns a triode action region, that is, a linear region.

Figure 43:
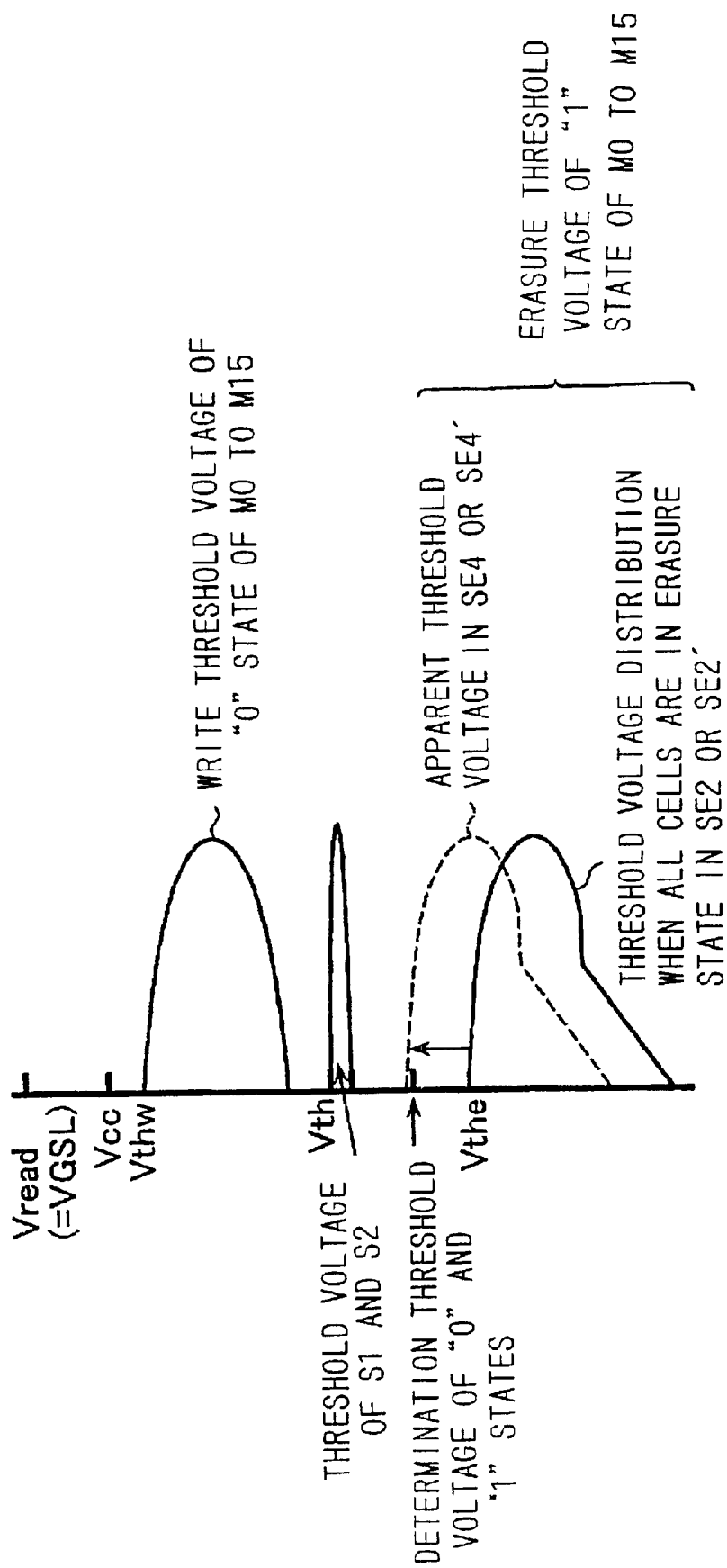
FIG. 43 shows data threshold voltage distributions according to the prior art.

A broken line shown in FIG. 10 indicates the drain current-to-drain voltage characteristic of the conventional select transistor S2 having the gate applied with the voltage Vread. According to the conventional memory, the drain voltage of each memory cell other than the read memory cell is higher than that of the select transistor in the case that the characteristic is observed under the condition of an arbitrary current of not lower than 0. This is due to the fact that Vthw and Vth have a relationship of Vthw>Vth as described with reference to FIG. 43 and that the drain current coefficient $\beta_{SL}$ of the select transistor S2 and the drain current constant $\beta_{cell}$ of the memory cell have a relationship of $\beta_{SL} > \beta_{cell}$.

Here, the drain current coefficient $\beta$ is also referred to as a conductive coefficient and expressed as $\beta = (W \times \mu)/(Cgate \times L)$ as is well known, where p is the mean mobility of carriers in the channel, and Cgate is a gate capacitance per unit area relative to the channel seen from the control gate. In the memory cell, the gate capacitance Cgate per unit area relative to the channel seen from the control gate of the memory cell may be expressed as Cgate=Cox/?cr, where ?cr is the ratio of the capacitance between the control gate and the floating gate to entire capacitance, i.e., coupling ratio and Cox is the capacitance between the floating gate and the control gate per unit area.

On the other hand, according to the configuration of the EEPROM 1 in this embodiment, the gate electrode of the select transistor S2 is short-circuited with the floating gate thereof and the gate capacitance per unit area relative to the channel seen from the gate electrode is Cox. Normally, as shown in FIG. 4B, in a NAND flash memory, the channel width W of a memory cell is equal to that of a select transistor. The gate length $L_{gate}$ of the memory cell and the gate length $L_{SL}$ of the select transistor S2 have a relationship of $L_{SL} < L_{gate}/?cr$ in general. Since the mean mobility $\mu$ of carriers in the channel is almost equal in the same field of the gate insulating film, the relationship between the select transistor S2 and the drain current coefficient of the memory cell is expressed as the following formula 1. In this embodiment, the same thing is true for the relationship between the select transistor S1 and a memory cell.

$$\beta_{SL} > B_{cell} \quad \text{Formula 1}$$

On the other hand, the drain voltage Va of the select transistor S2 indicated by the thin solid line in FIG. 10 of which voltage is measured at a certain current IO is higher than the voltage Vb of the memory cell indicated by the thick solid line in FIG. 10. In other words, if the current IO is carried, the conductance of the select transistor S2 is IO/Va and that of the memory cell is IO/Vb, and IO/Va is lower than IO/Vb. Therefore, with regards to the serially connected section between the memory cell M15 and the select transistor S2, the current between the drain of the memory cell M15 and the source of the select transistor S2 is restricted by the memory cell M15 according to the conventional memory whereas the current therebetween is restricted by the select transistor S2 under the conditions described in this embodiment. That is, in this embodiment, the read current of a NAND cell is dominantly restricted by the select transistor S2 irrespectively of the threshold voltage state of the memory cell M15, whereby a uniform cell current can be carried to the memory cell.

Here, the conductance ID/VD of the select transistor S2 is proportional to $\beta_{SL} \times (VGSL-Vth-VD/2)$ in the linear region and proportional to $(\beta_{SL}/2) \times (VGSL-Vth)^2/VD$ in the saturation region. As a result, the higher the drain voltage VD of the select transistor S2, the lower the conductance ID/VD thereof. In other words, if the read current increases, the voltage drop quantity due to the select transistor S2 increases and the voltage between the current terminals of the cell from which data is read decreases in a negative feedback manner.

Moreover, this effect is greater than that of a case in which resistance components having a constant conductance are connected to the memory cell in series. It is, therefore, possible to suppress the variation of read currents caused by the data of the unselected memory cells other than the read memory cell and the position of the read memory cell and to suppress the maximum threshold voltage rise quantity compared with the conventional memory.

If the conductance of the select transistor S2 is lower than that of a memory cell in the saturation region, it is possible to obtain the advantage of this embodiment by employing the select transistor S2 in the saturation region. The condition therefor is to satisfy the following formula irrespective of the formula 1 stated above.

$$(\beta_{SL})^{0.5} \times (VGSL-Vth) < (\beta_{cell})^{0.5} \times (Vread-Vthw) \quad \text{Formula 2}$$

Further, if the linear region is used, it suffices to satisfy the conditions of the following formula 3 so that the conductance of the select transistor S2 becomes lower than that of the memory cell.

$$(\beta_{SL}) \times (VGSL-Vth) < (B_{cell}) \times (Vread-Vthw) \quad \text{Formula 3}$$

That is, the advantage of this embodiment can be obtained by satisfying the conditions of the formulas 2 and 3 no matter which transistor active region is used to read data.

As indicated by the formula 1, in this embodiment, it is necessary to satisfy the conditions of the following formula 4 so as to establish the formula 2 or 3 despite $\beta_{SL} > B_{cell}$ and to obtain the advantage of this embodiment.

$$(VGSL-Vth) < (Vread-Vthw) \quad \text{Formula 4.}$$

Figure 11:
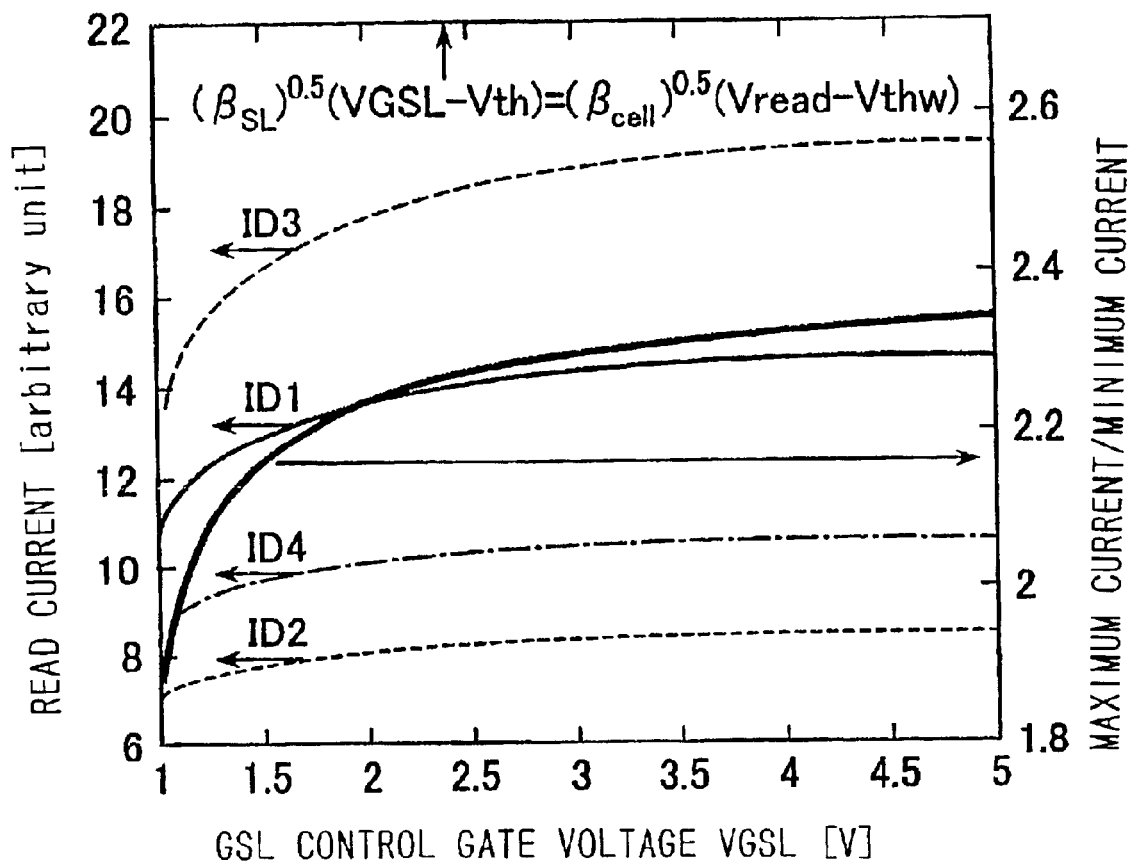
FIG. 11 shows the relationship between read current and the gate voltage of the select transistor in the first embodiment.
Figure 41A:
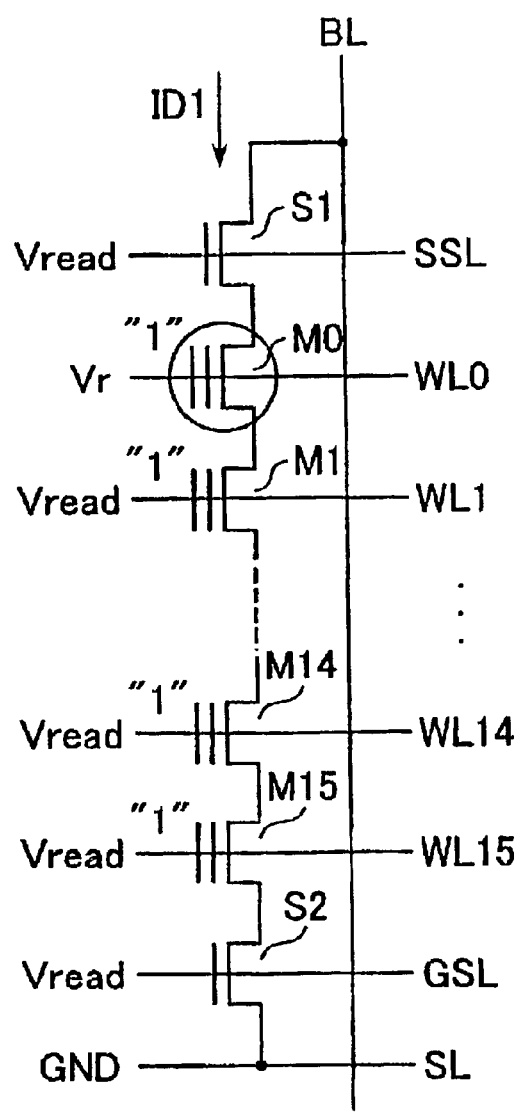
FIGS. 41A–41B shows voltage relationship when data is read from a memory cell M0 according to the prior art.
Figure 41B:
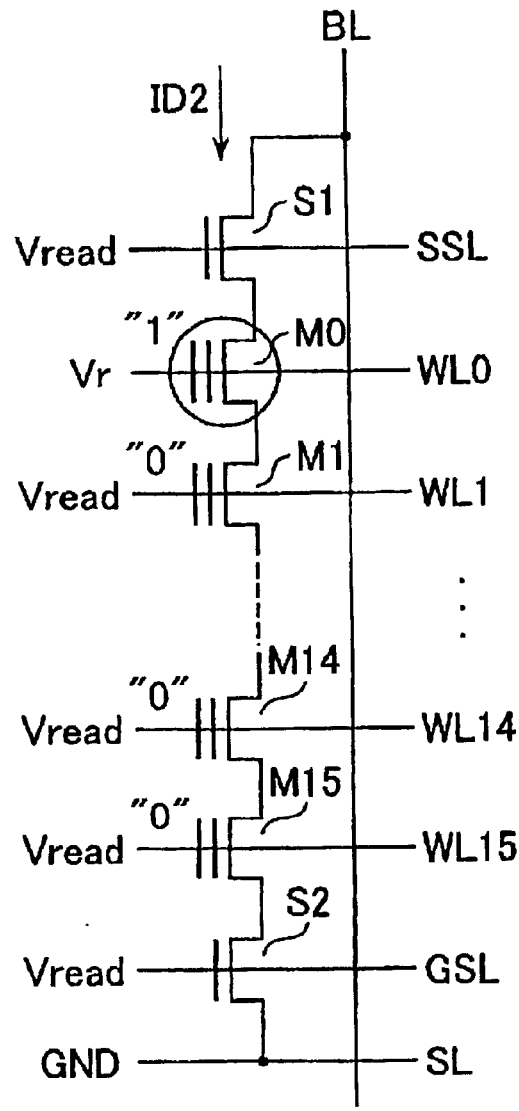

FIG. 11 shows read currents ID1 to ID4 in four read states described with reference to FIGS. 41 and 42, relative to the voltage VGSL in case of VBL=1V, Vread=5V, Vr=GND, Vthw=2V, Vthe=−1V and VSSL=5V, a threshold voltage of 0.5V at a substrate bias of 0V when the sources of the select transistors S1 and S2 are grounded and $\beta_{SL} = 2.5\ \beta_{cell}$. In FIG. 11, the substrate bias effect constant is $0.5[V^{0.5}]$, drain induced barrier lowering constant is 0.49 [V/V].

In FIG. 11, the right axis indicates maximum current/minimum current ratios of the read currents ID1 to ID4. The corresponding memory corresponds to VGSL=5V in FIG. 11. As can be seen from FIG. 11, if the voltage VGSL is made lower than the voltage Vread, the maximum current/ minimum current ratio decreases and the above-stated advantage can be obtained. In FIG. 11, the conditions of $(\beta_{SL})^{0.5} \times (VGSL-Vth) < (\beta_{cell})^{0.5} \times (Vread-Vthw)$ relative to the voltage VGSL at which the advantage of this embodiment is obtained are indicated by arrows.

The effect of decreasing the maximum current/minimum current ratio has large increase almost under the conditions for satisfying $(\beta_{SL})^{0.5} \times (VGSL-Vth) < (\beta_{cell})^{0.5} \times (Vread-Vthw)$, i.e., VGSL<2.4 [V], which shows that a critical behavior is seen under the conditions. In addition, since the power supply voltage Vcc of a flash NAND memory is conventionally not lower than 2.5V, the maximum current/minimum current ratio decreases and the above-stated effect grows by setting the voltage VGSL to be not higher than the power supply voltage.

Figure 12:
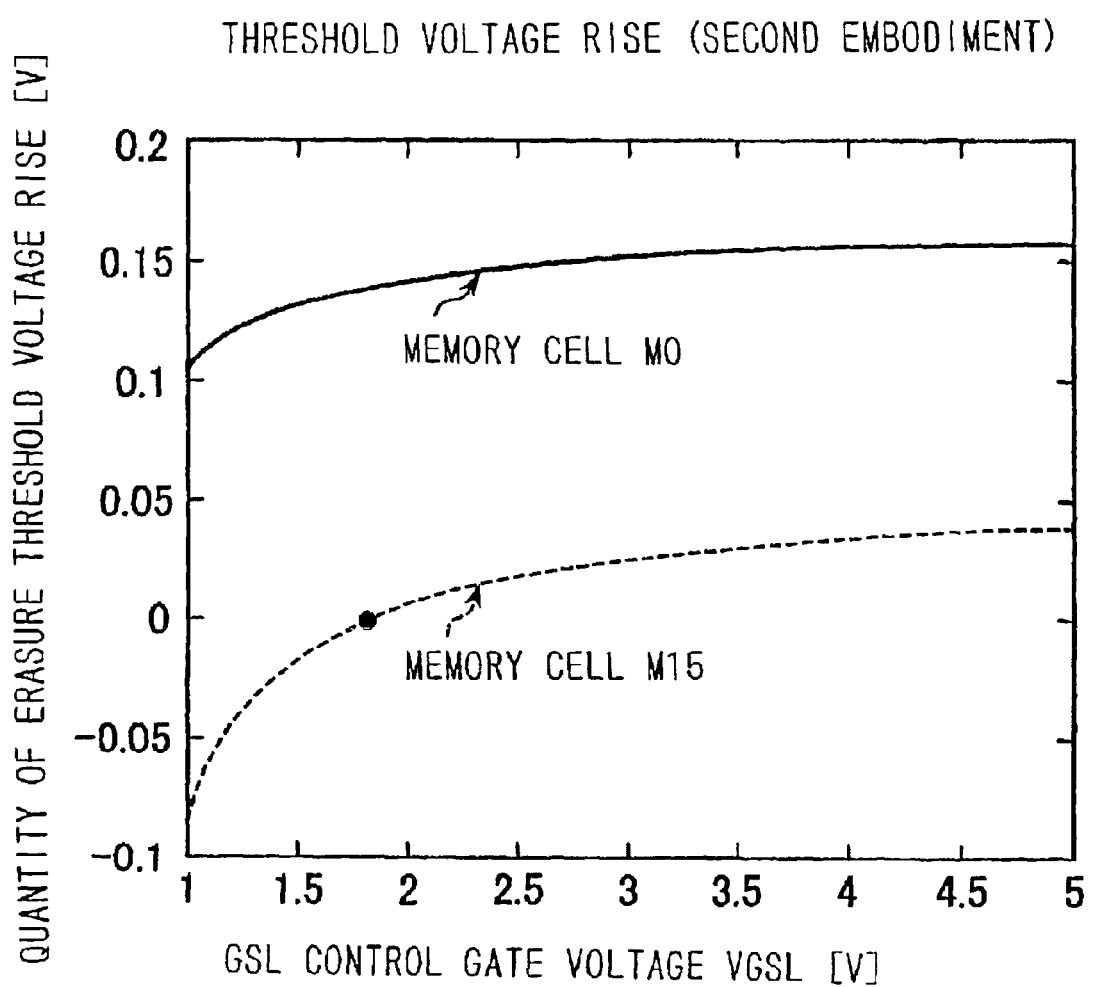
FIG. 12 shows the relationship between threshold voltage rise and the gate voltage of the select transistor in the first embodiment.

In FIG. 12, the erasure threshold voltage rise quantity of the memory cell M0 according to the sequence shown in FIG. 44A is denoted by a solid line and that of the memory cell M15 according to the sequence shown in FIG. 44B is denoted by a dashed line. The voltage conditions therefor are the same as those shown in FIG. 11. As can be seen from FIG. 12, if the voltage VGSL is made lower than the pass voltage Vread, the threshold voltage rise quantity of the memory cell M0 and that of the memory cell M15 decrease. This indicates that both the effect of lowering the maximum current/minimum current ratio and that of decreasing the threshold voltage rise quantity are obtained.

In the current changes shown in FIG. 11, the highest current pattern and the lowest current pattern are selected as the data patterns of the unselected memory cells other than the read memory cell. It is obvious that the other arbitrary pattern is within the range between the maximum current and the minimum current. Further, while FIG. 11 only shows the memory cell M0 closest to the bit line BL and the memory cell M15 closest to the common source line SL, the current changes of the other memory cells M1 to M15 are also between the maximum current and the minimum current shown in FIG. 11. In other words, FIG. 11 show the worst read current change quantity if data is written and read to and from the word lines WL0 to WL15 in a random order.

Figure 13:
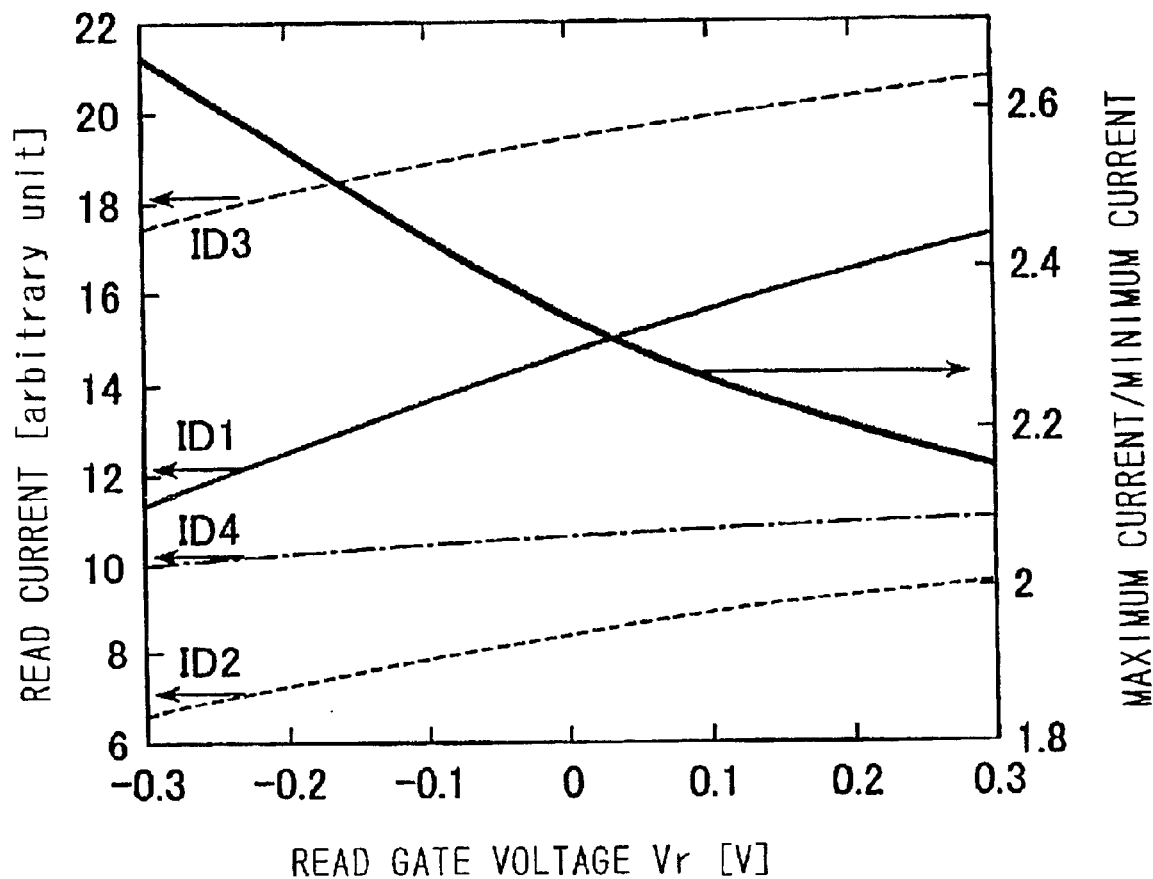
FIG. 13 shows the relationship between read current and the gate voltage of the select transistor according to the prior art.
Figure 14:
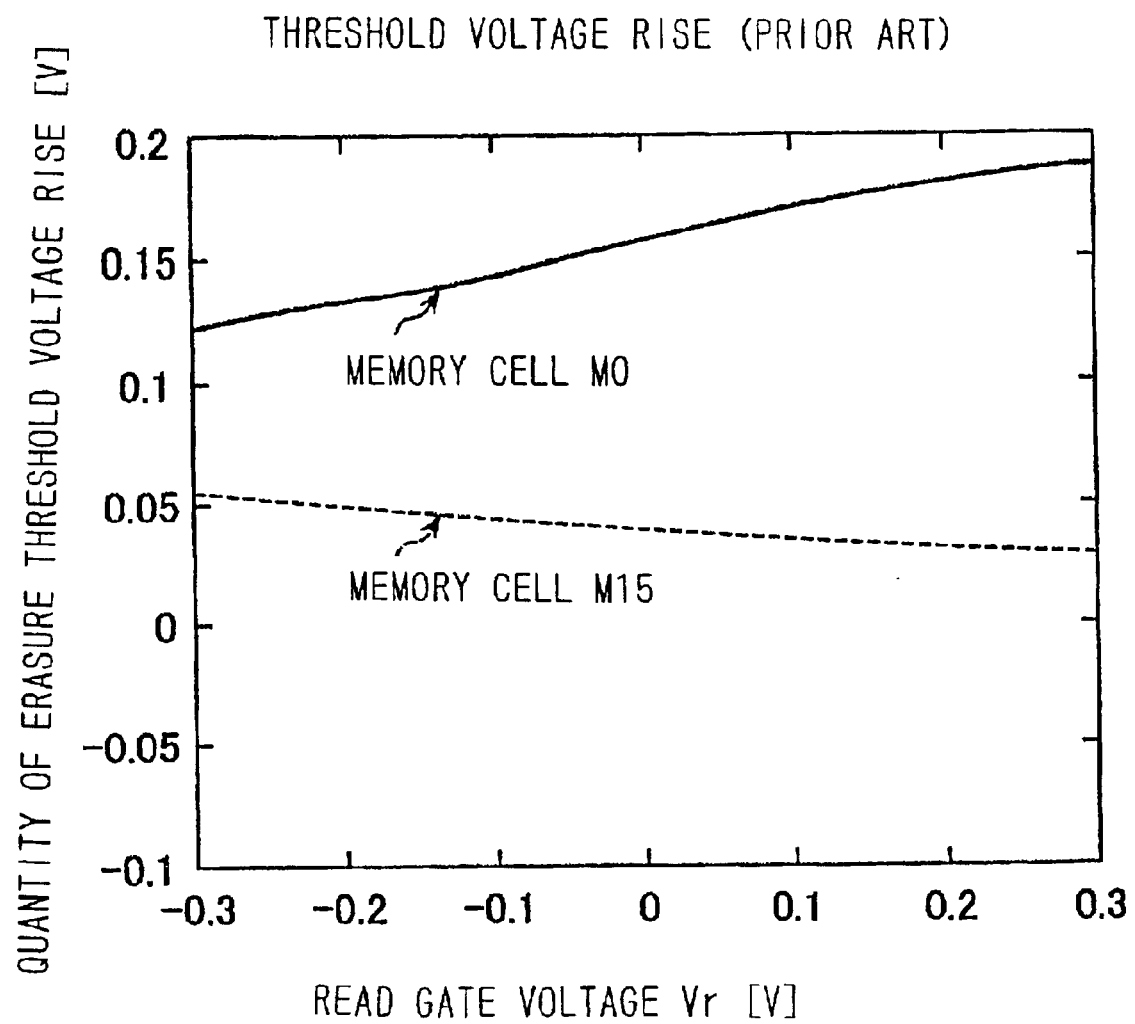
FIG. 14 shows the relationship between threshold voltage rise and the gate voltage of the select transistor according to the prior art.

By comparison, FIGS. 13 and 14 show the conventional case for adjusting maximum current/minimum current ratios by changing only the read voltage Vr while setting the voltage VGSL at the pass voltage Vread. FIGS. 13 and 14 correspond to FIGS. 11 and 12, respectively and are also equal in conditions to FIGS. 11 and 12 except for those of VGSL and Vr. As show in FIG. 13, if only the read voltage Vr is raised, each maximum current/minimum current ratio decreases but monotonously changes relative to the read voltage Vr and no critical change characteristic is seen.

Further, as shown in FIG. 14, if only the read voltage Vr is raised, the threshold voltage rise quantity of the memory cell M0 increases. Due to this, it is impossible to satisfy both the decrease of the threshold voltage rise quantities of the memory cells M0 and M15 and the decrease of the maximum current/minimum current ratios. In addition, as shown in FIG. 13, if only the read voltage Vr is raised, the read current ID3 highest among the read currents ID1 to ID3 rises, making it difficult to decrease the maximum electromagnetic noise caused by the cell current.

Moreover, if the current of the read cell increases, the floating of the potential of the common source line SL increases and the defect that "1" data cannot be sufficiently written to "0" data occurs as pointed out in, for example, Japanese Patent Application Laid-open Publication No. 11-260076. Needless to say, the maximum current carried to the data transfer line also increases. As a result, the rise of wiring resistance and the deterioration of reliability due to electro-migration generated by current stress and the change of the threshold voltage of the transistor and the increase of the leakage current caused by the increase of heat emission disadvantageously occur.

In this embodiment, by contrast, if the voltage VGSL is lowered, the read current ID3 highest among the read currents ID1 to ID4 can be decreased as shown in FIG. 11. It is thereby possible to reduce the maximum electromagnetic noise caused by the read current of the memory cell while making the maximum read time constant. It is, therefore, possible to carry out data read without any influence of electromagnetic noise, e.g., potential change due to the capacitance coupling between the adjacent data transfer lines even if a lower cell current is employed, to determine data at high rate, to decrease the probability of reading error resulting from the electromagnetic noise and to ensure high reliability.

Further, in this embodiment, since the maximum current of the read cell can be kept low, the floating of the potential of the common source line SL decreases and the defect that "1" data cannot be sufficiently written to the "0" data during verification write operation less occurs. In addition, since the maximum current carried to the data transfer line increases, the rise of wiring resistance due to the electro-migration caused by current stress does not occur and the deterioration of reliability can be suppressed. Besides, it is possible to decrease the change of the threshold voltage of the transistor and the increase of the leakage current caused by the increase of heat emission.

As indicated by black circle marks in FIG. 12, the inventors of the present application discovered, in particular, that the rise of the threshold voltage is made zero with the read voltage Vr kept to be GND by decreasing, for example, the voltage VGSL when reading data from the memory cell M15. As is obvious from FIG. 14, to make the rise of the threshold voltage zero, it is conventionally possible only to set the read voltage Vr far higher than 0.3V, which disadvantageously prevents the rise of the gate determination threshold voltage and makes it difficult to separate "0" data from the determination threshold voltage. In this embodiment, since the read voltage Vr applied to the memory cell is kept GND, the problem that it is difficult to separate the "0" data of the memory cell from the determination threshold voltage does not occur and it is possible to stably detect data while setting the threshold voltage distribution in the same state as that in which the voltage VGSL is set at Vread.

Figure 42A:
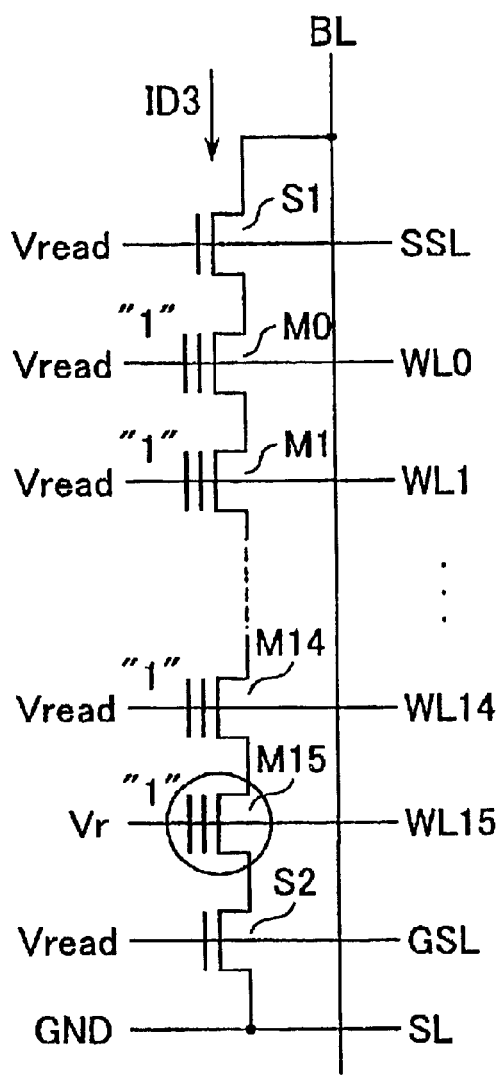
FIGS. 42A–42B shows voltage relationship when data is read from a memory cell M15 according to the prior art.
Figure 42B:
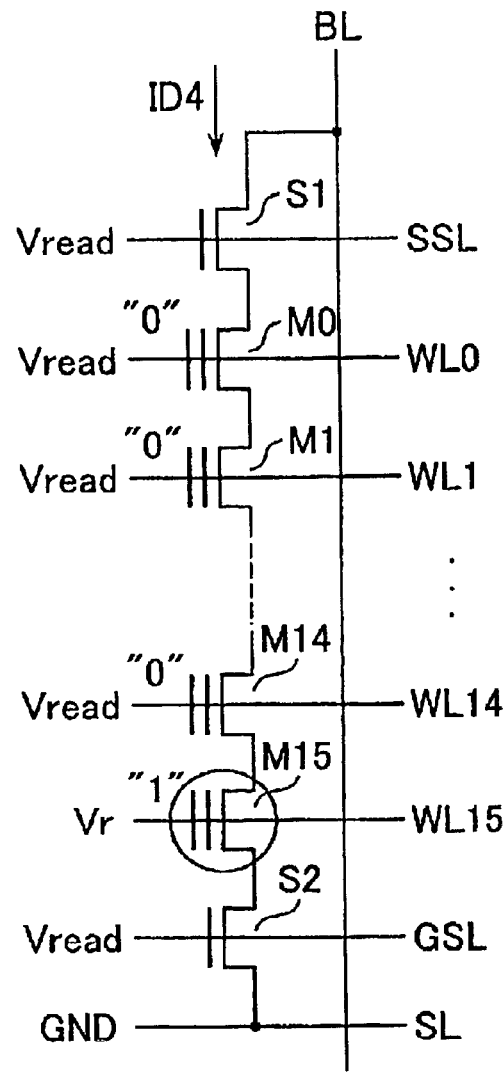

After carefully considering and analyzing the component of the rise of the threshold voltage of the memory cell M15, the inventors of the present application also discovered that if the read current decreases due to the substrate bias effect, the threshold voltage can be advantageously decreased. According to the conventional case, if the state shown in FIG. 42A is changed to that shown in FIG. 42B and a read current is lowered, the source potential of the memory cell M15 hardly changes. This is because the conductance of the select transistor S2 is higher than those of the unselected memory cells other than the read memory cell. As a result, the threshold voltage of the memory cell M15 increases at a certain current level Ith as already described in "Related Background Art" part.

In this embodiment, by contrast, the conductance of the select transistor S2 is lower than those of the unselected memory cells other than the read memory cell. Due to this, if the read current is lowered, the source potential of the read memory cell M15 greatly decreases. As a result, if the read current is lowered, the threshold voltage measured at the gate of the memory cell M15 is decreased by as much as (decrease of source potential) +(decrease of substrate bias effect). Accordingly, in FIGS. 7 and 8, if the voltage of the select gate line SSL is higher than (VGSL+VBL), the conductance of the bit line-side select transistor S1 is higher than that of the common source line-side select transistor S2, thereby obtaining the advantage of this embodiment. The analysis result, therefore, proves that it is not always necessary to boost the gate voltage of the select transistor S1 up to the pass voltage Vread.

The advantages of this embodiment stated above will be enumerated as follows:

(a) By lowering the gate control voltage of the select transistor, it is possible to decrease read current change caused by the data of the unselected memory cells connected in series to the selected memory cell and the position of the selected memory cell and, at the same time, to suppress the threshold voltage rise quantity caused by the data states of the unselected memory cells.

(b) Since the changes of the read currents can be decreased, it is possible to decrease the difference between the maximum read time and the minimum read time and to make read timing uniform. It is thereby possible to reduce the maximum electromagnetic noise generated by the cell read current while making the maximum read time constant.

(c) Accordingly and additionally, it is possible to read data using a lower cell current without any influence of potential change due to the capacitance coupling between the adjacent data transfer lines and to determine the data at high rate, whereby it is possible to decrease the probability of reading error resulting from the electromagnetic noise and to obtain high reliability.

(d) Since the maximum current of the read cell can be kept low, the floating of the potential of the common source line is decreased and the defect that data cannot be sufficiently written when "0" data is written less occurs.

(e) Since the maximum current carried to the bit line can be suppressed, the rise of wiring resistance due to the electro-migration caused by current stress does not occur and the deterioration of reliability can be suppressed. In addition, the change of the threshold voltage of the transistor and the increase of leakage current due to the increase of heat emission can be suppressed.

(f) The maximum current of the read cell can be kept low. Due to this, even if the area of the wirings for short-circuiting the common source line which is formed in the row direction, in the column direction is made smaller than that of the cells, it is possible to decrease the floating of the common source line. Further, the number of wirings short-circuiting the common source line in the column direction is decreased, and it is possible to improve the occupation rate of the memory cell array in a chip.

(g) Since the increase of the upper limit of the threshold voltage of the "1" data can be suppressed, it is possible to secure the larger separation voltage width between the threshold voltages of the "1" and "0" data than that of the conventional memory. Therefore, even if threshold voltage shift occurs due to the deterioration of the charge holding characteristic or temperature change, it is possible to decrease data destruction resulting from the overlapping of the threshold voltage distributions of different data with one another.

(h) The increase of the upper limit of the threshold voltage of the "1" data can be suppressed. Due to this, even if the separation voltage width between the threshold voltages of the "1" and "0" data is made narrower than that of the conventional memory by as much as the suppression of the increase of the upper limit for the "1" data, it is possible to decrease data destruction resulting from the overlapping of the threshold voltage distributions of different data. As a result, it is possible to lower the threshold voltage of the "0" data, to thereby set the maximum voltage of the threshold voltage distribution of each cell lower than that of the conventional memory and to shorten time required for data write.

(i) Even if data write field is lowered, data can be written at high rate and it is, therefore, possible to decrease the deterioration of the reliability of the tunnel insulating film and the ONO film of the memory cell caused by the repetition of data write. In addition, the self electric field of accumulated charges is made smaller and it is thereby possible to keep good charge holding characteristic. Further, it is possible to decrease a voltage applied to each of the unselected memory cells at the time of reading data. As a result, it is possible to suppress the situation in which negative charges are injected into the charge accumulation layer by repeating read operation and the threshold voltage of the cell rises. It is particularly possible to ensure good separation width for the threshold voltages of the "1" and "0" data.

(j) Since it is possible to secure the large separation voltage width between the determination threshold voltage and that of the stored data during data read, it is possible to decrease reading error frequency and to secure a high gate driving voltage for data read determination. As a result, it is possible to increase the quantity of the current carried to the data cell in a case in which the threshold voltage of the stored data is lower than the determination threshold voltage and to accelerate read rate with the current while keeping the current carried to the data cell if the threshold voltage of the stored data is higher than the determination threshold voltage.

(k) By using, as the select transistor, the MISFET the channel length of which is larger than that of each memory cell and the substantial gate insulating film thickness of which is smaller than that of the memory cell, it is possible to suppress the select transistor short channel effect. As a result, it is possible to decrease threshold voltage change due to process change or drain voltage change and to decrease the ratio of the maximum current to the minimum current more stably.

(l) Since the number of the select transistors is smaller than that of the memory cells, it is possible to employ a select gate line the gate length of which is larger than the control gate width of each memory cell, which has low abnormal resistance-increase effect and which is low in resistance and thereby possible to read data at high rate.

(m) Since the gate control voltage of the select transistor can be lowered, it is possible to improve the reliability of the gate insulating film of the select transistor and to reduce power for charging and discharging the gate voltage of the select transistor and the area of the gate driving circuit of the select transistor.

Modification of First Embodiment

Figure 15:
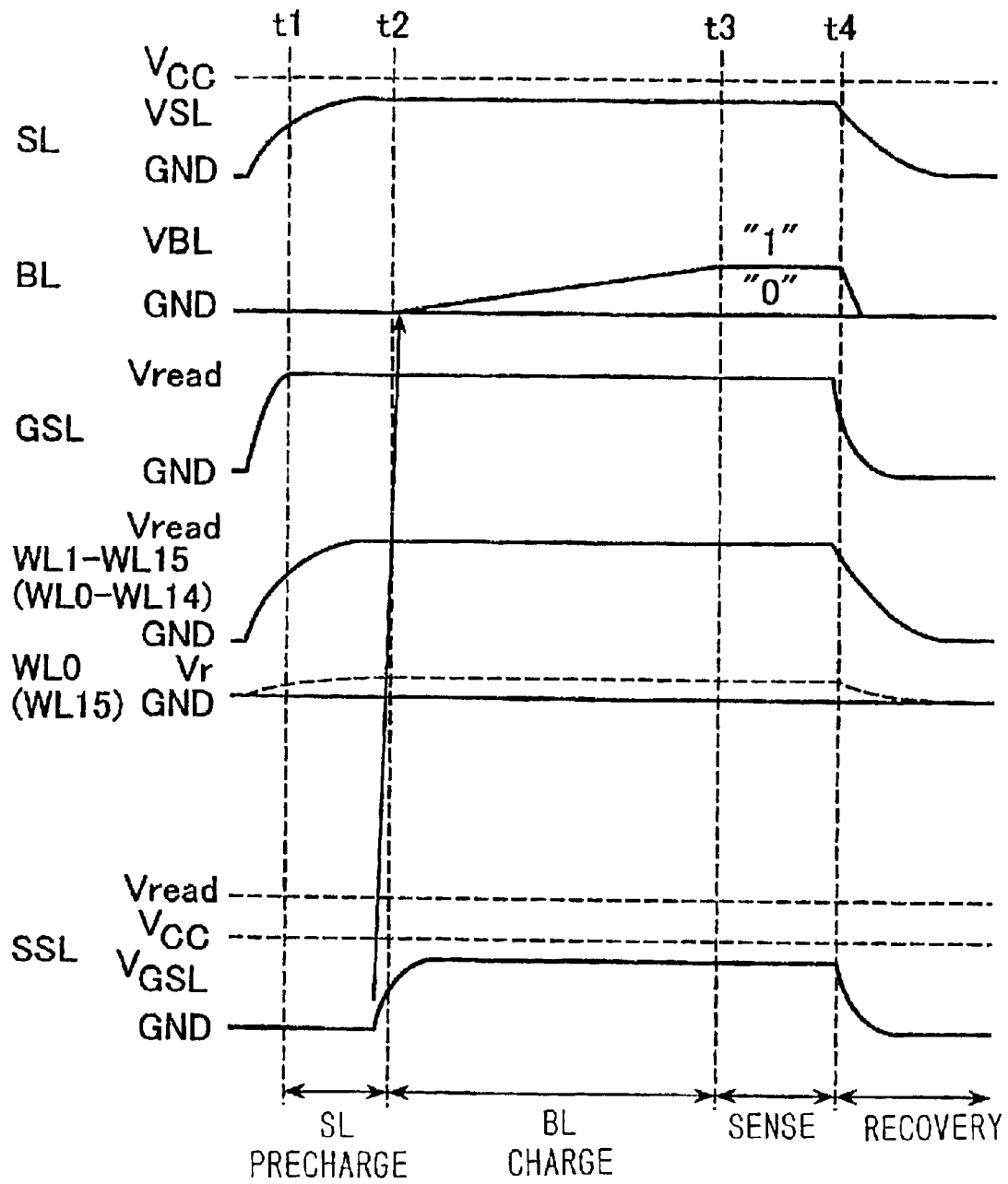
FIG. 15 is a timing chart showing data read operation timing in a modification of the first embodiment.

FIG. 15 is a data read operation waveform view in a modification in which a current is carried from the common source line SL to the bit line BL. FIG. 16 shows the relationship of voltages during the bit line charge period and the sense period in respect of one of the NAND cells at the time shown in FIG. 15. In this modification, a case of selecting the word line WL0 is shown and a case of reading data from the memory cell M15 instead of the memory cell M0 is shown in brackets. Data can be read from the other memory cells M1 to M14 by the same operation as that for the memory cell M0.

During data read, the row decoder 3 and the data control line driver 2 of the data read target block are activated, the read voltage Vr is applied to the selected word line WL0, the pass voltage Vread is applied to each of unselected word lines WL1 to WL15 and the pass voltage Vread is applied to the select gate line GSL (at time t1). The lines SSL, WL0 to WL15 and GSL in unselected blocks are kept in a floating state or at 0V during the data read period so as to prevent data reading error or data destruction.

Simultaneously with or prior to the application of voltages stated above, the voltage of the common source line SL is boosted to the voltage VSL which is, for example, not lower than the ground voltage GND and not higher than the power supply voltage Vcc using the source voltage control circuit 10 and the bit line BL is discharged to have the ground voltage GND and then turned into a floating state. The voltage VSL thus set is desirable because if the voltage is not lower than the ground voltage GND and not higher than the power supply voltage Vcc, the reliability of the transistors which constitute the sense amplifier circuit can be ensured at a voltage of about Vcc. Further, if the n channel MISFET is used as the sense amplifier transistor, the voltage VSL is desirably set to be not lower than the threshold voltage of the n channel MISFET, e.g., about 2V so as to improve the sensitivity of the sense amplifier.

If it is assumed, for example, that the lower limit of the threshold voltage distribution of the "0" data for writing the "0" data is Vthw2 and the upper limit of the threshold voltage distribution of the "1" data after data erasure is Vthe, the read voltage Vr is a voltage in a range between Vthw2 and Vthe. It is most preferable that the read voltage Vr is set at about (Vthw2+Vthe)/2, e.g., between −0.5 and 4V to obtain read margin. It is particularly desirable that Vthe is set negative and Vthw2 is set positive. This is because the read voltage Vr can be set at the ground potential GND and it is, therefore, possible to dispense with the Vr generation circuit 11d.

It is preferable that the read voltage Vr is set to be not lower than the ground potential GND. By so setting, no negative voltage is applied to the diffused layers of the transistor, of the data control line driver 2, connected to the word line WL0 to WL15 and it is, therefore, possible to dispense with the negative voltage generation circuit. As a result, the p type well, in which the n channel MISFET of the data control line driver 2 is formed, can be set to have the ground potential GND and formed without being separated between the p type substrate 21 and the n type region. It is thereby possible to reduce the circuit area of the data control line driver 2. Further, no negative voltage is applied to the diffused layers, even a few carriers are not injected thereinto due to the forward bias of the diffused layers, making it possible to prevent latch-up. Besides, even if short-circuit error occurs to the word lines WL0 to WL15 or in the memory cell array 1, no negative voltage is applied to the p type well 23 or the n type diffused layers 30 of the memory cell array 1 and read data destruction does not occur as a result of injection of a few carriers.

The word lines WL1 to WL15 connected to the unselected memory cells are set to have the voltage Vread outputted from the Vread generation circuit 11c and higher than the upper limit of the threshold voltage distribution of the memory cell. In addition, the voltage Vread is applied from the VGSL generation circuit 11c to the common source line SL-side select gate line GSL.

In this embodiment, the gate electrode length of each of the select transistors S1 and S2 is larger than that of the control gate of each of the memory cells M0 to M15. On the other hand, it is known that abnormal resistance increase effect that if line width is narrower, resistance rises, occurs to CoSi or TiSi which is the material of these gate electrodes. Therefore, the gate of each of the select transistors S1 and S2 is lower in resistance than the gate of each of the memory cells M0 to M15 and the select transistor S2 can be boosted to the voltage Vread faster than the memory cells M0 to M15.

Further, by driving the select transistor S1 lower in resistance than driving the word lines WL0 to WL15 during a bit line charge period, it is possible to decrease the variation of the timing of reading the memory cells connected in parallel. By doing so, if the memory cell M0 is in the "1" data state, i.e., erasure state, the sources, drains and channel regions of the select transistor S2 and the memory cells M0 to M15 are charged with VSL. The period between time t0 and time t1 corresponds to a common source line (SL) precharge period in which the common source line SL and the NAND cell unit 20 are charged.

This SL precharge period needs to be longer than the time required until the voltage of each of the word lines WL1 to WL15 is sufficiently boosted up to the pass voltage Vread, e.g., 100 nS to 10 uS. Next, the bit line BL-side select gate line SSL is set to have the positive control voltage VGSL (at time t2). Here, the control voltage VGSL is set to be not lower than the upper limit Vth of the threshold voltage of the select transistor S1 and not higher than the pass voltage Vread. By so setting, if the threshold voltage of the memory cell M0 is not higher than Vr, the common source line SL and the bit line BL become conductive and the potential of the bit line BL is raised from GND.

If the threshold voltage of the memory cell M0 is higher than the read voltage Vr, the memory cell M0 turns into a cutoff state and the potential of the bit line BL is not, therefore, raised. A period between time t2 and time t3 correspond to a bit line (BL) charge period in which the bit line BL is charged when the data of the memory cell M0 is "1". This BL charge period needs to be not shorter than the time required until the bit line BL is sufficiently charged, e.g., 100 ns to 100 uS.

After the time t3, the potential change of the bit line BL is determined by the sense amplifier circuit 4 and data is read to a data register. At this time, if a voltage clamp circuit for the bit line is employed as described in, for example, Japanese Patent Application Laid-open Publication No. 2000-76882, data can be read with high sensitivity without greatly changing the potential of the bit line BL. Needless to say, if a current sense type circuit is used as the sense amplifier, the data can be read in the same manner. A period between the time t3 and time t4 corresponds to a sense period in which the data of the memory cell M0 is sensed. Further, a recovery period in which the potentials of the lines SSL, WL0 to WL15, GSL and the bit line BL are returned to initial values, respectively, starts.

In this modification, the direction in which the read current flows is opposite to the direction in the preceding first embodiment. Therefore, the gate voltage of the bit line BL-side select transistor S1 is set at the voltage VSGL lower than the other pass voltage Vread, the same advantages as those described in the first embodiment can be obtained.

Second Embodiment

In the first embodiment, the voltage applied to the control gate line GSL for driving the common source line SL-side select transistor S2 is set lower than the pass voltage Vread applied to the unselected word lines for driving the unselected memory cells. In the second embodiment, by contrast, while using the same EEPROM structure, the voltage of the select gate line SSL for driving the gate electrode of the bit line BL-side select transistor S1 is set lower than the pass voltage Vread applied to unselected word lines for driving unselected memory cells as will be described hereinafter.

Figure 17:
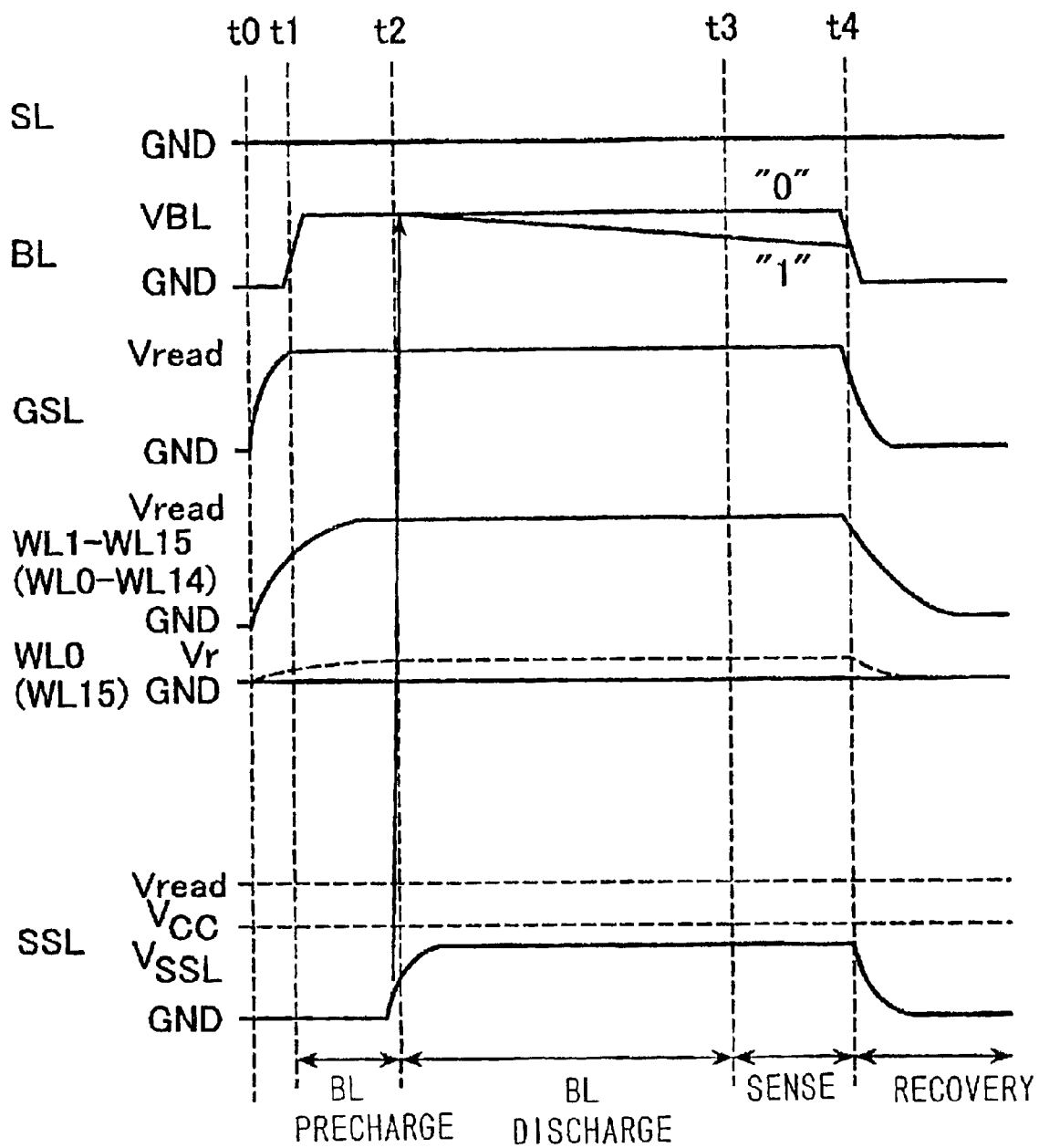
FIG. 17 shows the relationship between data threshold voltage distributions and read operating voltage in the second embodiment of the present invention.

FIG. 17 shows read operation waveforms in the case that the memory cell M0 is selected in the second embodiment while showing the waveforms corresponding to those shown in FIG. 7 in the first embodiment. FIG. 18 shows the relationship of voltages corresponding to those shown in FIG. 8 in the first embodiment. It is assumed that the second embodiment is the same as the first embodiment except for the voltage relationship.

During data read, the row decoder 3 and the data control line driver 2 corresponding to a block from which data is to be read are activated, the pass voltage Vread is applied to the source line-side select gate line SSL, the read voltage Vr is applied to the selected word line WL0, the pass voltage Vread is applied to each of the remaining unselected word lines WL1 to WL15 and the ground potential GND is applied to the common source line-side select gate line GSL (at time t0). The select gates SSL, GSL and the word lines WL0 to WL15 in the unselected block are each maintained in a floating state or to have a voltage 0V during data read so as to prevent data reading error or data destruction from occurring.

The read voltage Vr is a voltage in a range between Vthw2 and Vthe, where Vthw2 is the lower limit of the threshold voltage distribution of the "0" data after data write and Vthe is the upper limit of the threshold voltage distribution of the "1" data after data erasure shown in FIG. 9. It is most preferable that the read voltage Vr is set at about (Vthw2+ Vthe)/2, e.g., between −0.5 and 4V in light of a read margin. It is particularly desirable that Vthe is set negative and Vthw2 is set positive. This is because the read voltage Vr can be set at the ground potential GND and it is, therefore, possible to dispense with the Vr generation circuit 11d.

In addition, the read voltage Vr is preferably set to be not lower than the ground potential GND. By so setting, no negative voltage is applied to the diffused layers of the transistor of, the data control line driver 2, connected to the word line WL0 to WL15 and it is, therefore, possible to dispense with the negative voltage generation circuit. As a result, the p type well, in which the n channel MISFET of the data control line driver 2 is formed, can be set to have the ground potential GND and formed without being separated between the p type substrate 21 and the n type region. It is thereby possible to reduce the circuit area of the data control line driver 2. Further, no negative voltage is applied to the diffused layers, even a few carriers are not injected thereinto due to the forward bias of the diffused layers, making it possible to prevent latch-up. Besides, even if short-circuit error occurs to the word lines WL0 to WL15 or in the memory cell array 1, no negative voltage is applied to the p type well 23 or the n type diffused layers 30 of the memory cell array 1 and read data destruction does not occur as a result of injection of a few carriers.

The pass voltage Vread applied to the unselected word lines WL1 to WL15 and the select gate line GSL is outputted from the Vread generation circuit 11c and set to be higher than the maximum voltage of the threshold voltage distribution of the "1" data of the memory cell.

In this embodiment, as shown in FIG. 5, the gate length (channel length) of each of the select transistors S1 and S2 is larger than that of the control gate of each of the memory cells M0 to M15. On the other hand, it is known that abnormal resistance increase effect that if line width is narrower, resistance rises, occurs to CoSi or TiSi which is the material of these gates. Therefore, the gate electrode of each of the select transistors S1 and S2 is lower in resistance than the control gate of each of the memory cells M0 to M5 and the voltage of the gate electrode of the select transistor S2 is boosted to the pass voltage Vread faster than the control gate of each of the memory cells M0 to M15. Further, by driving the select gate line SSL lower in resistance than the word lines WL0 to WL15 during a bit line discharge period, it is possible to decrease the variation of the timing of reading the memory cells connected in parallel.

The bit line BL is charged with the voltage VBL using a power supply node included in the sense amplifier circuit 4 slightly later than the rise of the word lines WL0 to WL15 and the select gate line GSL (at time t11). At this time, it is preferable that VBL is not lower than the ground potential GND and not higher than the power supply potential Vcc. This is because the reliability of the transistors which constitute the sense amplifier circuit 4 can be ensured about at the power supply voltage Vcc by so setting.

If an n channel MISFET is used as a sense amplifier transistor, it is desirable that the voltage VBL is set to be not lower than the threshold voltage of the MISFET, e.g., about 1V so as to improve the sensitivity of the sense amplifier. Thereafter, if the memory cell M0 is in the "1" data state, i.e., erasure state, the sources, drains and channel regions of the select transistor S1 and the memory cells M0 to M15 are charged with the voltage GND. The period described so far corresponds to the bit line (BL) precharge period in which the bit line BL and the NAND cell unit are charged.

This BL precharge period needs to be longer than the time required until the voltage of each unselected word line is sufficiently boosted up to the pass voltage Vread, e.g., 100 nS to 10 uS. Next, the bit line-side select gate line SSL is set to have a positive control voltage VSSL (at time t2). At this time, the control voltage VSSL is set to be not lower than the upper limit Vth of the threshold voltage of the select transistor S1 and not higher than the pass voltage Vread. By so setting, if the threshold voltage of the memory cell M0 is not higher than Vr, the NAND cell unit becomes conductive and the potential of the bit line BL is lowered. If the threshold voltage of the memory cell M0 is higher than the read voltage Vr, the memory cell M0 is turned off and the potential of the bit line BL is not lowered. In other words, the bit line BL is discharged according to the data state of the memory cell M0, and a period in which the bit line BL is discharged corresponds to the bit line (BL) discharge period. This BL discharge period needs to be not shorter than the time required until the bit line BL is sufficiently discharged, e.g., 100 ns to 100 uS.

Next, the potential change of the bit line BL is determined by the sense amplifier circuit 4 and data is read to a data register (at time t3). At this time, if a voltage clamp circuit for the bit line is provided in the sense amplifier circuit 4, data can be read with high sensitivity without greatly changing the potential of the bit line BL. The sense amplifier circuit 4 is not necessarily a current sense type circuit.

After the end of the sense period, at time t4, a recovery period in which the potentials of the select gate lines GSL, SSL, the word lines WL0 to WL15 and the bit line BL are returned to initial values, respectively, starts.

Figure 19:
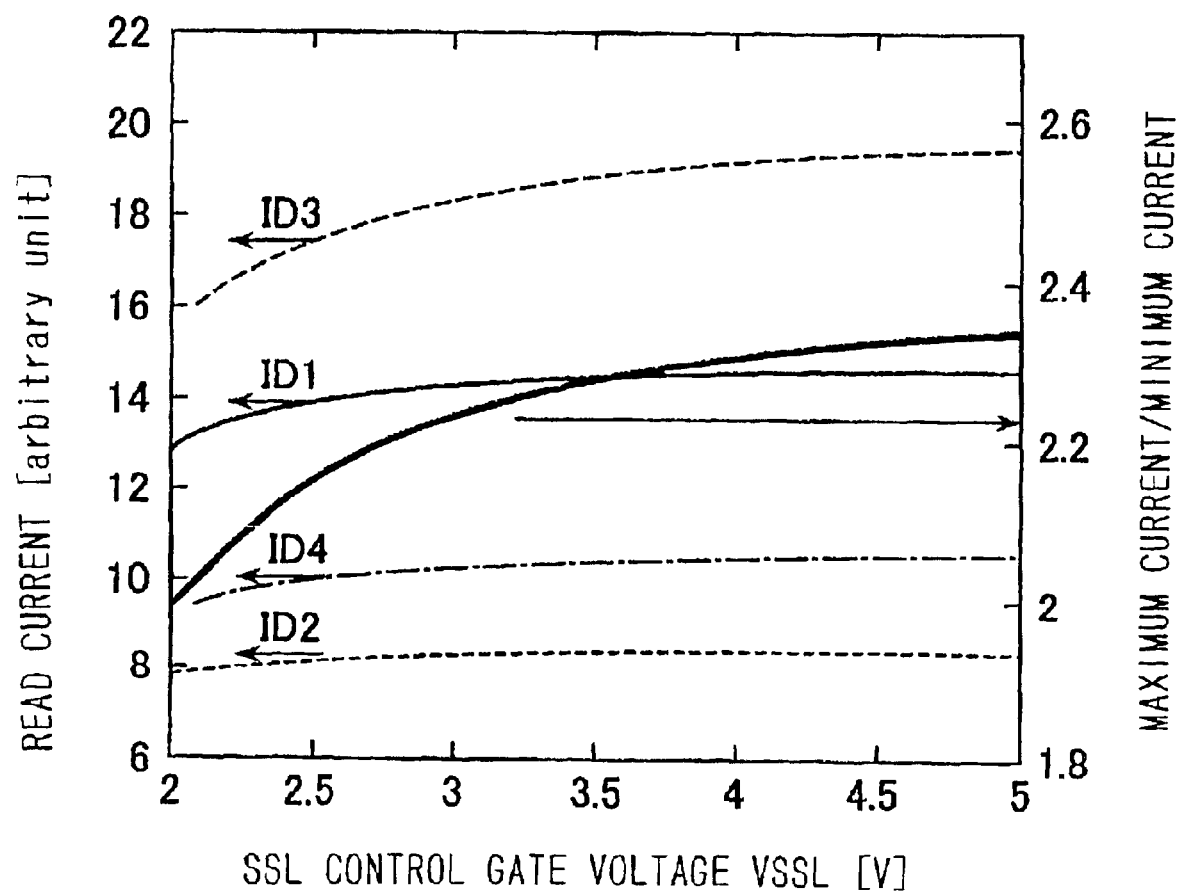
FIG. 19 shows the relationship between read current and the gate voltage of the select transistor in the second embodiment.

FIG. 19 shows read currents ID1 to ID4 in four read states described with reference to FIGS. 41 and 42, relative to the voltage VSSL in case of VBL=1V, Vread=5V, Vr=GND, Vthw=2V and Vthe=−1V, a threshold voltage of 0.5V at a substrate bias of 0V when the sources of the select transistors S1 and S2 are grounded and $\beta_{SL}=2.5\beta_{cell}$. In FIG. 19, the substrate bias effect constant is $0.5[V^{0.5}]$, drain induced barrier lowering constant is 0.49 [V/V].

In FIG. 19, the right axis indicates maximum current/minimum current ratios of the read currents ID1 to ID4. The corresponding memory corresponds to VSSL=5V in FIG. 19. As can be seen from FIG. 19, if the voltage VSSL is made lower than the voltage Vread, the maximum current/minimum current ratio decreases and the same advantage as those of the first embodiment can be obtained. The effect of decreasing the maximum current/minimum current ratio has large increase almost under the condition of VSSL<2.5 [V], which shows that a critical behavior is seen under the conditions. In addition, since the power supply voltage Vcc of a flash NAND memory is conventionally not lower than 2.5V, the maximum current/minimum current ratio decreases and the above-stated effect grows by setting the voltage VSSL to be not higher than the power supply voltage.

Figure 20:
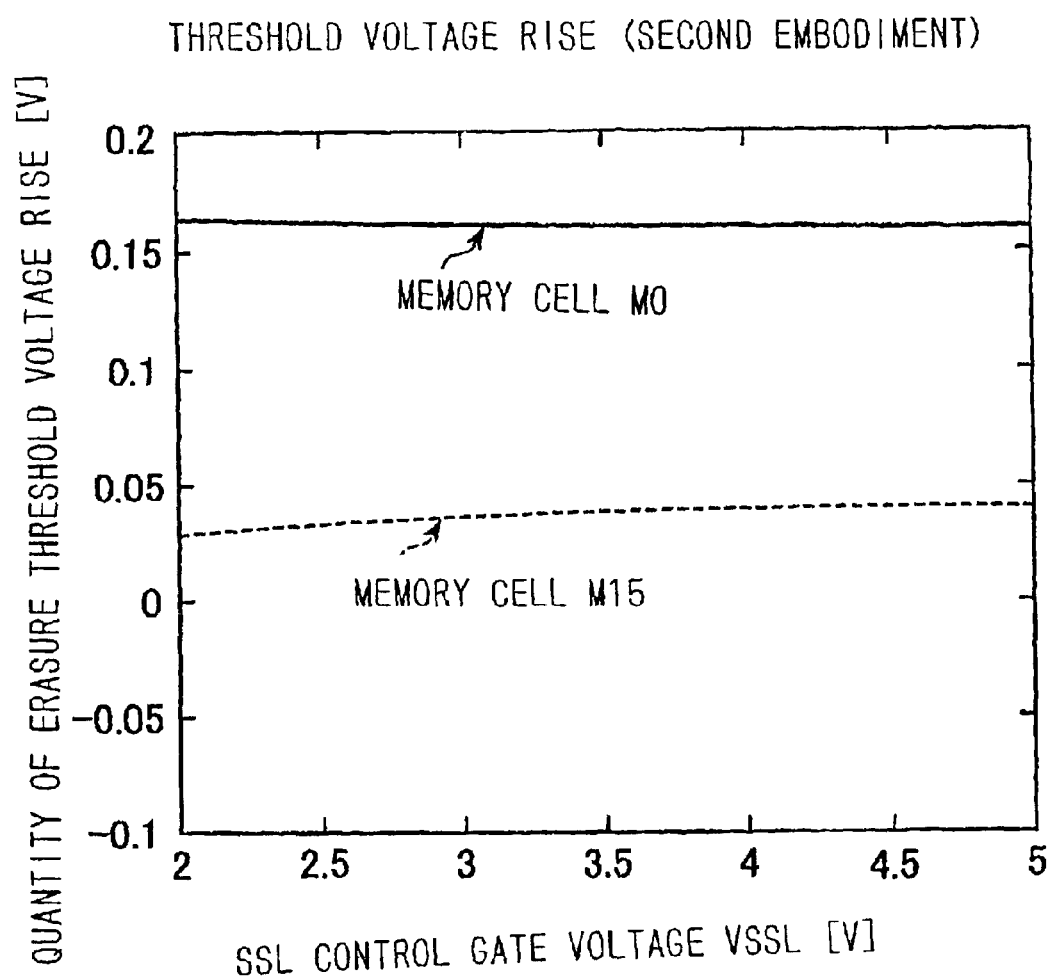
FIG. 20 shows the relationship between threshold voltage rise and the gate voltage of the select transistor in the second embodiment.

In FIG. 20, the erasure threshold voltage rise quantity of the memory cell M0 according to the sequence shown in FIG. 44A is denoted by a solid line and that of the memory cell M15 according to the sequence shown in FIG. 44B is denoted by a dashed line. The voltage conditions therefor are the same as those shown in FIG. 19. Even if the voltage VGSL is made lower than the pass voltage Vread, the threshold voltage rise quantity of the memory cell M0 and that of the memory cell M15 hardly change and no disadvantage of the increase of the threshold voltage rise quantity as seen in the conventional memory occurs.

Further, in this embodiment, if the voltage VGSL is lowered, the read current ID3 highest among the read currents ID1 to ID4 can be decreased. It is thereby possible to reduce the maximum electromagnetic noise caused by the read current of the memory cell while making the maximum read time constant. It is, therefore, possible to carry out data read without any influence of electromagnetic noise, e.g., potential change due to the capacitance coupling between the adjacent data transfer lines even if a lower cell current is employed, to determine data at high rate, to decrease the probability of reading error resulting from the electromagnetic noise and to ensure high reliability.

Further, since the maximum current of the read cell can be kept low, the floating of the potential of the common source line SL decreases and the defect that "1" data cannot be sufficiently written to the "0" data during verification write operation less occurs. In addition, since the maximum current carried to the data transfer line increases, the rise of wiring resistance due to the electro-migration caused by current stress does not occur and the deterioration of reliability can be suppressed. Besides, it is possible to decrease the change of the threshold voltage of the transistor and the increase of the leakage current caused by the increase of heat emission.

In this embodiment, it is obvious that if the voltage of the common source line-side select gate line GSL is higher than the voltage VSSL of the bit line-side select gate line, the conductance of the select transistor S2 is higher than that of the select transistor S1, thereby obtaining the advantage of this embodiment. It is not always necessary to boost the voltage of the select gate line GSL up to the pass voltage Vread.

Modification of Second Embodiment

Figure 21:
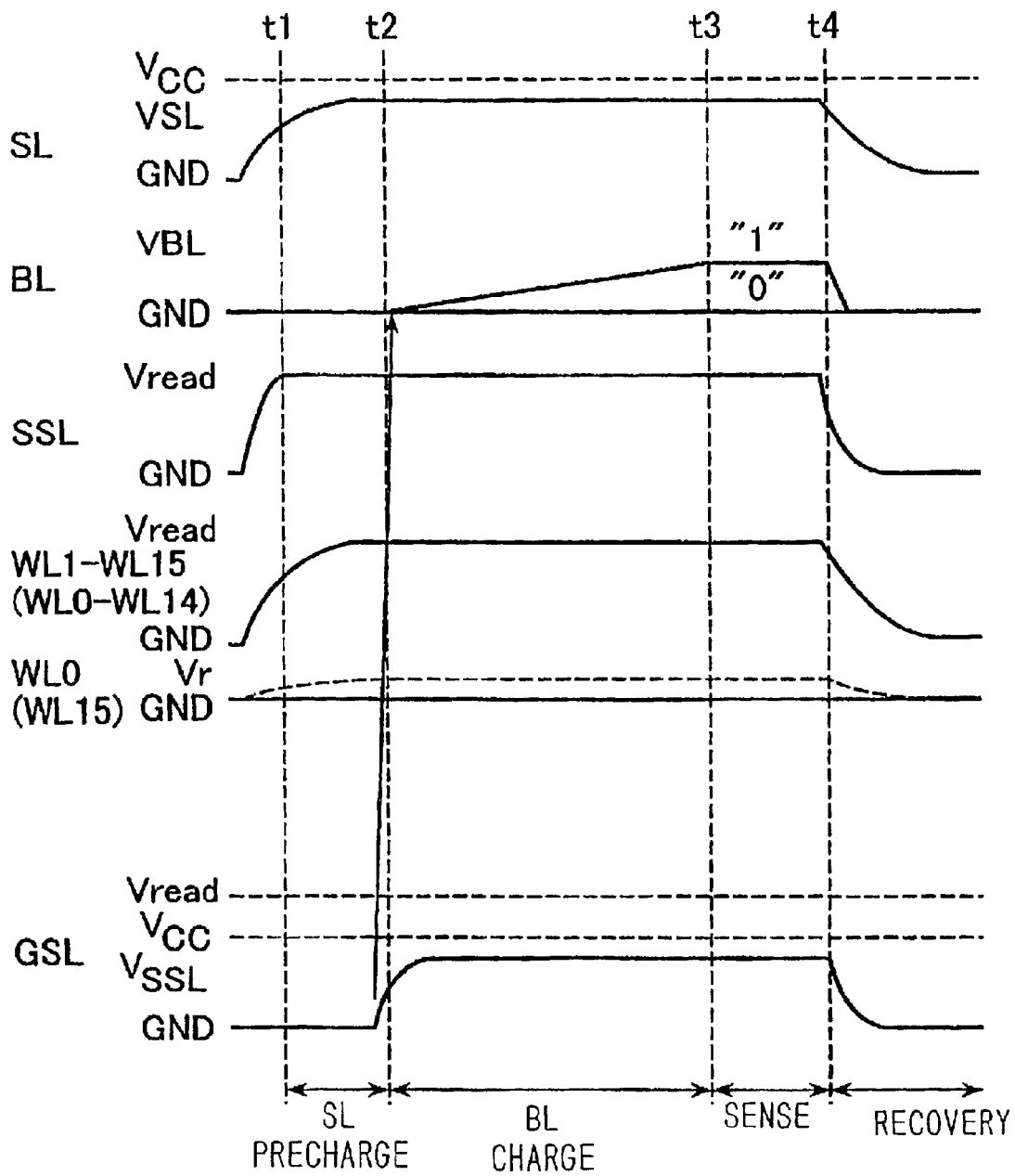
FIG. 21 is a timing chart showing data read operation timing in a modification of the second embodiment.

FIGS. 21 and 22 show operation waveforms and voltage relationship if a read current is carried from the common source line to the bit line as the modification of the second embodiment, and correspond to FIGS. 15 and 16, respectively. In FIGS. 21 and 22 as in the case of FIGS. 15 and 16, a case of selecting the word line WL0 is shown and a case of reading data from the memory cell M15 instead of the memory cell M0 is shown in brackets. Data can be read from the other memory cells M1 to M14 by the same operation as that for the memory cell M0.

During data read, the row decoder 3 and the data control line driver 2 of the data read target block are activated, the read voltage Vr is applied to the selected word line WL0, the pass voltage Vread is applied to each of unselected word lines WL1 to WL15 and the pass voltage Vread is applied to the select gate line SSL (at time t1). The lines SSL, WL0 to WL15 and SSL in unselected blocks are kept in a floating state or at 0V during the data read period so as to prevent data reading error or data destruction.

Simultaneously with or prior to the application of voltages stated above, the voltage of the common source line SL is boosted to the voltage VSL which is, for example, not lower than the ground voltage GND and not higher than the power supply voltage Vcc using the source voltage control circuit 10 and the bit line BL is discharged to have the ground voltage GND and then turned into a floating state. The voltage VSL thus set is desirable because if the voltage is not lower than the ground voltage GND and not higher than the power supply voltage Vcc, the reliability of the transistors which constitute the sense amplifier circuit can be ensured at a voltage of about Vcc. Further, if then channel MISFET is used as the sense amplifier transistor, the voltage VSL is desirably set to be not lower than the threshold voltage of the n channel MISFET, e.g., about 2V so as to improve the sensitivity of the sense amplifier.

If it is assumed, for example, that the lower limit of the threshold voltage distribution of the "0" data after data write is Vthw2 and that the upper limit of the threshold voltage distribution of the "1" data after data erasure is Vthe, the read voltage Vr is a voltage in a range between Vthw2 and Vthe. It is most preferable that the read voltage Vr is set at about (Vthw2+Vthe)/2, e.g., between −0.5 and 4V to obtain read margin. It is particularly desirable that Vthe is set negative and Vthw2 is set positive. This is because the read voltage Vr can be set at the ground potential GND and it is, therefore, possible to dispense with the Vr generation circuit 11d.

It is preferable that the read voltage Vr is set to be not lower than the ground potential GND. By so setting, no negative voltage is applied to the diffused layers of the transistor, of the data control line driver 2, connected to the word line WL0 to WL15 and it is, therefore, possible to dispense with the negative voltage generation circuit. As a result, the p type well, in which the n channel MISFET of the data control line driver 2 is formed, can be set to have the ground potential GND and formed without being separated between the p type substrate 21 and the n type region. It is thereby possible to reduce the circuit area of the data control line driver 2. Further, no negative voltage is applied to the diffused layers, even a few carriers are not injected thereinto due to the forward bias of the diffused layers, making it possible to prevent latch-up. Besides, even if short-circuit error occurs to the word lines WL0 to WL15 or in the memory cell array 1, no negative voltage is applied to the p type well 23 or the n type diffused layers 30 of the memory cell array 1 and read data destruction does not occur as a result of injection of a few carriers.

The word lines WL1 to WL15 connected to the unselected memory cells are set to have the voltage Vread outputted from the Vread generation circuit 11c and higher than the upper limit of the threshold voltage distribution of the memory cell. The voltage Vread is also applied to the bit line-side select gate line SSL.

In this embodiment, the gate electrode length of each of the select transistors S1 and S2 is larger than that of the control gate of each of the memory cells M0 to M15. On the other hand, it is known that abnormal resistance increase effect that if line width is narrower, resistance rises, occurs to CoSi or TiSi which is the material of these gate electrodes. Therefore, the gate of each of the select transistors S1 and S2 is lower in resistance than the gate of each of the memory cells M0 to M15 and the select transistor S1 can be boosted to the voltage Vread faster than the memory cells M0 to M15.

Further, by driving the select transistor S1 lower in resistance than driving the word lines WL0 to WL15 during a bit line discharge period, it is possible to decrease the variation of the timing of reading the memory cells connected in parallel. By doing so, if the memory cell M0 is in the "1" data state, i.e., erasure state, the sources, drains and channel regions of the select transistor S2 and the memory cells M0 to M15 are charged with GND. The period between time t0 and time t1 corresponds to a common source line (SL) precharge period in which the common source line SL and the NAND cell unit 20 are charged.

This SL precharge period needs to be longer than the time required until the voltage of each of the word lines WL1 to WL15 is sufficiently boosted up to the pass voltage Vread, e.g., 100 nS to 10 uS. Next, the common source line-side select gate line GSL is set to have the positive control voltage VGSL (at time t2). Here, the control voltage VGSL is set to be not lower than the upper limit Vth of the threshold voltage of the select transistor S2 and not higher than the pass voltage Vread. By so setting, if the threshold voltage of the memory cell M0 is not higher than Vr, the common source line SL and the bit line BL become conductive and the potential of the bit line BL is raised from GND. If the threshold voltage of the memory cell M0 is higher than the read voltage Vr ("0" data), the memory cell M0 turns into a cutoff state and the potential of the bit line BL is not, therefore, raised. A period between time t2 and time t3 corresponds to a bit line (BL) charge period in which the bit line BL is charged when the data of the memory cell M0 is "1". This BL charge period needs to be not shorter than the time required until the bit line BL is sufficiently charged, e.g., 100 ns to 100 uS.

After the time t3, the potential change of the bit line BL is determined by the sense amplifier circuit 4 and data is read to a data register. At this time, if a voltage clamp circuit for the data transfer line is employed as described in, for example, Japanese Patent Application Laid-open Publication No. 2000-76882, data can be read with high sensitivity without greatly changing the potential of the bit line BL. Needless to say, if a current sense type circuit is used as the sense amplifier, the data can be read in the same manner. A period between the time t3 and time t4 corresponds to a sense period in which the data of the memory cell M0 is sensed. Further, a recovery period in which the potentials of the lines SSL, WL0 to WL15, GSL and the bit line BL are returned to initial values, respectively, starts.

In this modification, the direction in which the read current flows is opposite to the direction in the preceding second embodiment. Therefore, the gate voltage of the common source line SL-side select transistor S2 is set lower than the other pass voltage Vread, the same advantages as those described in the second embodiment can be obtained. Also in this case, when the voltage of the select gate lines SSL is higher than the one of (VGSL+VSL), the conductance of the select transistor S1 becomes larger than the conductance of the select transistor S2, so that it is obvious that the effect described in the second embodiment can be gained. Accordingly, the select gate lines SSL is not necessarily to be pressured up to Vread.

Third Embodiment

Figure 23:
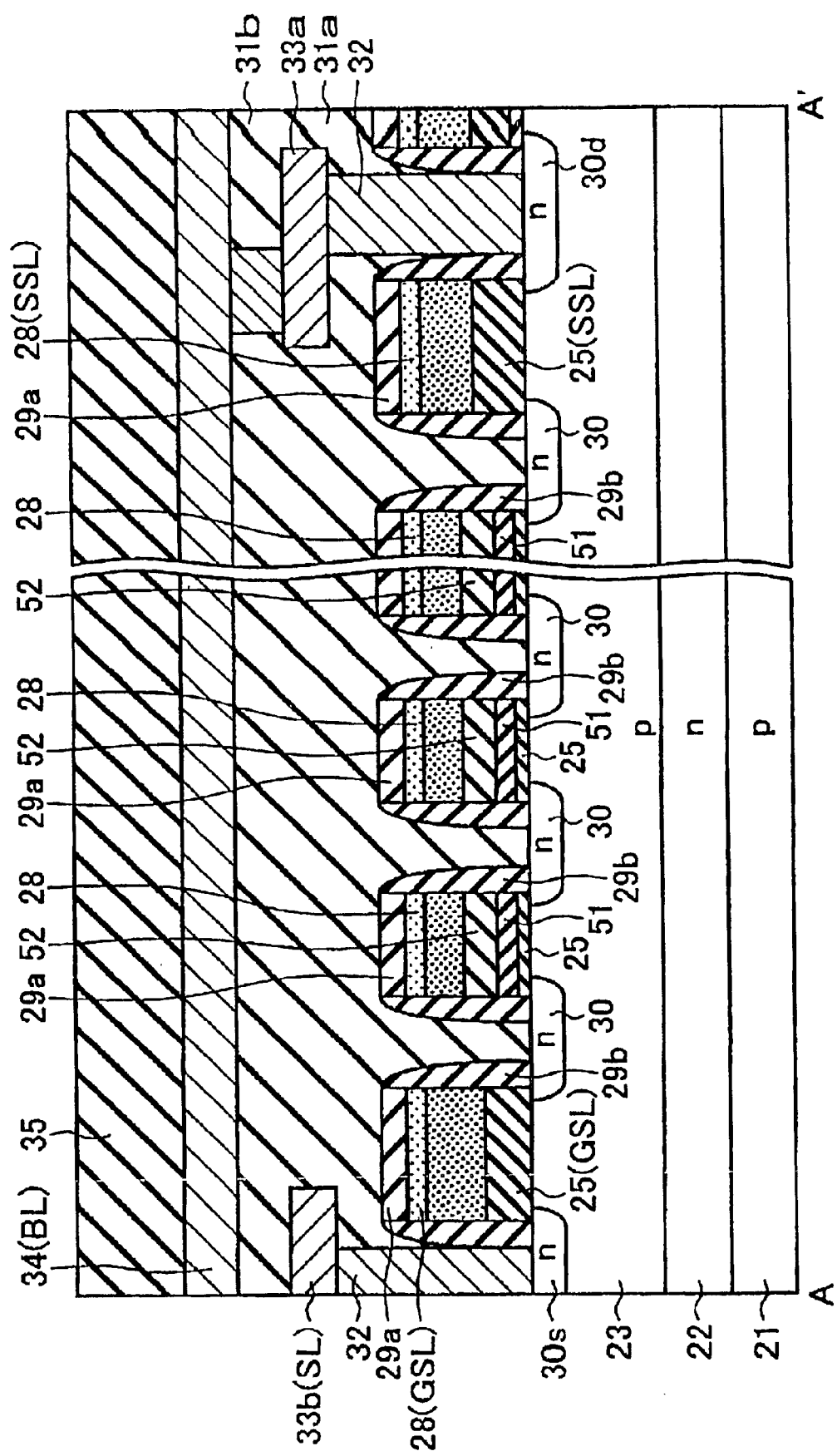
FIG. 23 shows the cross-sectional structure of a memory array in the third embodiment of the present invention while corresponding to FIG. 5.

FIGS. 23 and 24 show the structure of a memory cell array in the third embodiment of the present invention. In this embodiment, not a floating gate type but a MONOS type memory cell structure is employed. The plan view of the cell array is the same as that shown in FIG. 4B. FIGS. 23 and 24 are cross-sectional views taken along lines A–A' and B–B' of FIG. 4B, respectively.

The cell array is formed in a p type well 23 which is formed in the n type well 22 of a p type silicon substrate 21. The boron density of the p type well 23 is set to fall within a range between, for example, $10^{14}$ cm$^{-3}$ and $10^{19}$ cm$^{-3}$. The p type well 23 is isolated from the p type silicon substrate 21 by the n type well 22, so that a voltage can be applied to the p type well 23 independently of the p silicon substrate 21. This can reduce load on the booster circuit and to suppress consumption power during data erasure.

In this embodiment, the gate insulating film of each of the memory cells M0 to M15 is formed as follows. A charge accumulation layer 51 formed out of, for example, SiN or SiON and having a thickness of 3 nm to 50 nm is formed on the surface of the p type well 23 through a tunnel insulating film 25 which is formed out of a silicon oxide film or an oxynitride film having a thickness of 1 nm to 10 nm. On the charge accumulation layer 51, an interlayer insulating film 52 formed out of a silicon oxide film and having a thickness of 2 nm to 10 nm is layered to thereby provide an ONO structure. The select transistors S1 and S2 have gate insulating films 25 (GSL) and 25 (SSL) different in film thickness from the memory cell, respectively.

Gate electrodes 28, 28 (GSL) and 28 (SSL) formed out of polycrystalline silicon are formed on these gate insulating films, respectively. Each of the gate electrodes has a two-layer structure consisting of the first polycrystalline silicon film which is arranged only in an element region and the second polycrystalline silicon layer which is superposed on the first polycrystalline silicon film and is continuous as each of word lines WL0 to WL15 and select gate lines GSL and SSL.

This two-layer structure can be obtained by depositing the first polycrystalline silicon film on the entire surface of the p type well 23 through the gate insulating film 25, patterning the deposited first polycrystalline silicon film, etching the p type well 23 by a thickness of, for example, 0.05 to 0.5 um, embedding an element isolation insulating film 24 and depositing and patterning the second polycrystalline silicon film.

In the gate structure of this embodiment as in the case of the first embodiment, the upper surface of the gate structure is covered with a silicon nitride film 29a, and a sidewall insulating film 29b made of a silicon nitride film (or silicon oxide film) and having a thickness of, for example, 5 nm to 200 nm is formed on each side surface of the gate structure. In addition, n type diffused layers 30 which become a source and a drain, respectively, are formed on the gate electrode in a self-aligned manner. The gate length of the memory cell is set at, for example, not higher than 0.5 um and not lower than 0.01 um. The source and drain n type diffused layers 30 are formed out of, for example, phosphorus, arsenic or antimony having a surface concentration of $10^{17}$ to $10^{21}$ $cm^{-3}$ to each have a thickness of 10 to 500 nm. Further, these n type diffused layers 30 are shared among the adjacent memory cells to thereby realize a NAND cell unit.

In this embodiment, the gate length (channel length) of each of the gate electrodes 26 (SSL) and 26 (GSL) of the select transistors S1 and S2 is set larger than the gate length of each memory cell to, for example, not higher than 1 um and not lower than 0.02 um. By so forming, it is possible to secure a high on-off ratio of block selection to block non-selection and to prevent writing error or reading error.

The n type diffused layer 30d out of the n type diffused layers 30d and 30s formed on the both ends of the NAND cell unit, respectively, is connected to a relay electrode 33a through a contact plug 32 embedded into an interlayer insulating film 31a and further connected to the bit line 34 through an interlayer insulating film 31b. The bit line 34 is formed out of tungsten, tungsten silicide, titanium, titanium nitride, aluminum or the like and continuously provided in the column direction of the cell array. The other n type diffused layer 30s is connected to a common source line 33b which is formed simultaneously with the relay electrode 33a and which is continuous in the row direction of the cell array, through a contact plug 32. The common source line 33b can be formed out of the same material as that of the bit line 34. The contact plug 32 is formed out of impurity-doped polycrystalline silicon, tungsten, tungsten silicide, aluminum, titanium, titanium nitride or the like.

It is also possible to continuously form the n type diffused layer 30s in the row direction of the cell array 1 to be used as the common source line SL. An insulating film protection layer 35 of $SiO_2$, SiN, polyimide or the like is covered on the bit line BL 34. In addition, although not shown, an upper wiring of W, Al or Cu is formed on the bit line BL 34.

Since the MONOS type cell is used in this embodiment, it is possible to make a write voltage and an erasure voltage lower than those of the floating gate type cell in the first embodiment and to maintain withstand voltage even if the element separation distance is narrowed and the gate insulating film is thinned. It is, therefore, possible to reduce the area of circuits applied with high voltage and to further reduce a chip area. Further, compared with the first embodiment, it is possible to reduce the thickness of the ONO film which forms the charge accumulation layer to not larger than 20 nm, to further reduce the aspect ratio during gate formation, to improve the processed shape of the gate electrode, to improve the embedding of the interlayer insulating film 28 between the gates and to further improve withstand voltage.

Moreover, in this embodiment, a process for forming floating gate electrodes and a slit formation process are unnecessary, thereby making it possible to shorten manufacturing process. In addition, since the charge accumulation layer is made of an insulator and charges are captured by a charge trap, it is possible to make it difficult to pull out charges by radiation and to ensure high radiation resistance. Moreover, even if the sidewall insulating films of the charge accumulation layer are thinned, all of the captured charges are not pulled out to thereby maintain good charge holding characteristic. Besides, the charge accumulation layer and the semiconductor device region can be formed without causing any misalignment, to make it possible to realize more uniform capacitances of the charge accumulation layer and the semiconductor device region. It is thereby possible to decrease the capacitance variation of each memory cell and that between the memory cells.

Even if the cell array structure in this embodiment is employed, the same advantages as the first and second embodiment can be obtained by reading data in the manner described in the first and second embodiment.

In this embodiment, the select transistors S1 and S2 are MISFET's without a charge accumulation layer differently from the memory cells. However, each select transistor may be the same MONOS structure type as the memory cells. In addition, while the charge accumulation layer of each memory cell is formed out of an insulator, the sidewall insulating films separating the memory cells from one another are not always necessary.

Fourth Embodiment

Figure 25:
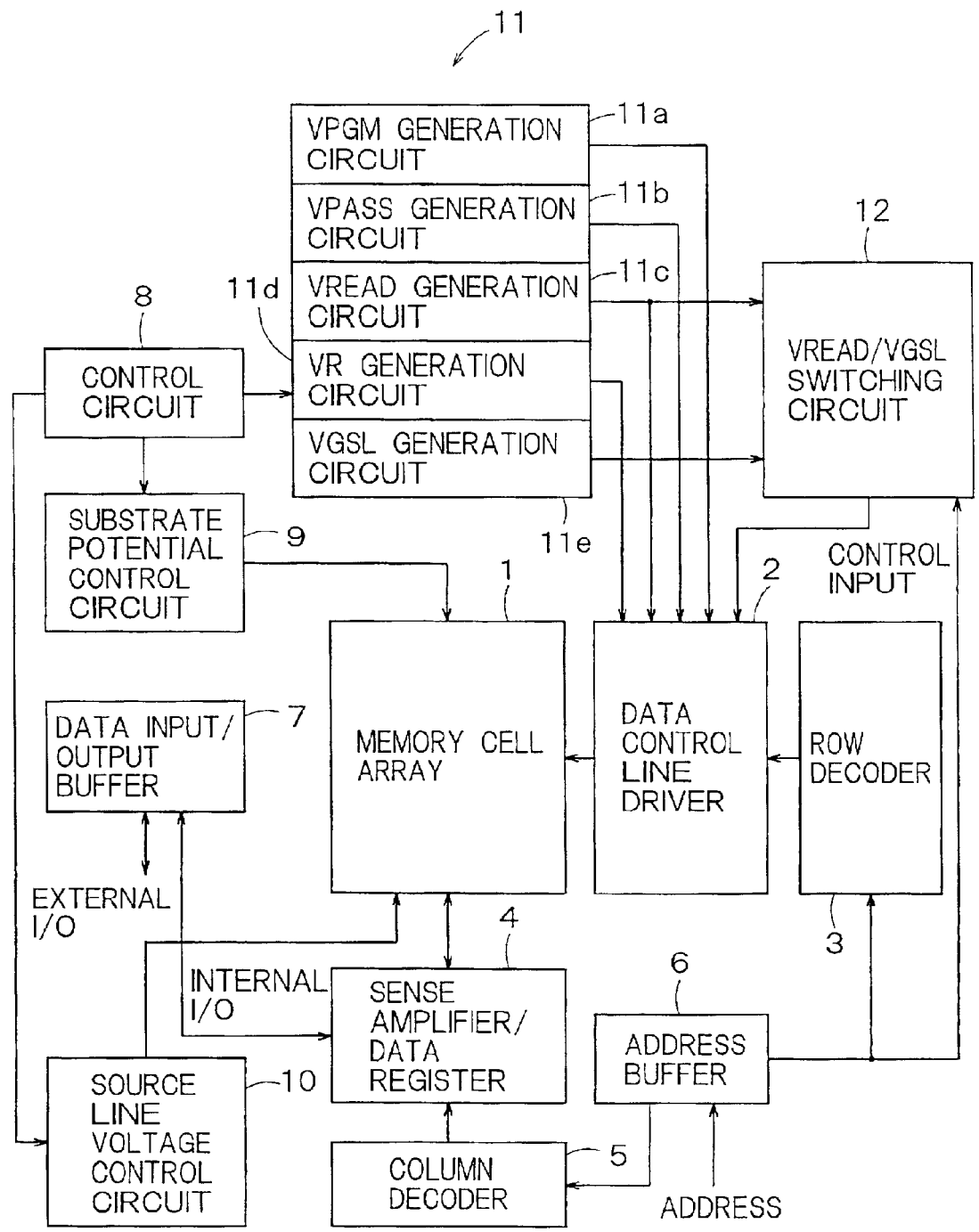
FIG. 25 is a block diagram of an EEPROM in the fourth embodiment of the present invention while corresponding to FIG. 1.

Next, the fourth embodiment in which the voltage VGSL applied to the gate electrode (select gate line GSL) of the select transistor S2 is switched in accordance with the position of the selected word line in the NAND cell unit during data read, will be described. The basic EEPROM configuration is the same as that in the first or third embodiment. However, to switch the voltage applied to the select gate line GSL, a Vread/VGSL switching circuit 12 is added to the configuration shown in FIG. 1, as shown in FIG. 25.

The output of the switching circuit 12 is connected to the select gate line GSL of the memory cell array 1. If a range of the word lines WL15 to WL(15-x) is selected in accordance with internal addresses outputted from the address buffer 6, the switching circuit 12 outputs the voltage VGSL. If a range of the word lines WL(15-x-1) to WL0 is selected, the switching circuit 12 outputs the voltage Vread. It is noted that symbol x denotes an integer not lower than 0 and not higher than 14. Data read operation timing is the same as that in the first embodiment.

FIG. 26 shows the dependency of read current change on word line position in data read in this embodiment and that in conventional data read. Concrete read conditions are basically conformable to those in the first embodiment, i.e., VBL=1V, Vread=5V, Vr=GND, Vthw=2V, Vthe=-1V and VSSL=1.8V. If a source is grounded and a substrate bias is 0V, the threshold voltage of each of the select transistors S1 and S2 is 0.5V.

In addition, the data shown in FIG. 26 relates to currents during verification read operation if data write and write verification read are sequentially carried out from the common source line SL side. Marks ○ and □ denote a case in which the voltage of the select gate line GSL is fixed to Vread=5V as in the case of the conventional memory. Marks ● and ■ denote a case of x=3 in this embodiment, i.e., a case in which if the word lines WL15 to WL12 are selected, the voltage VGSL=1.8 V is applied and if the word lines WL11 to WL0 are selected, the voltage Vread=5V is applied.

The marks □ and ■ indicate that the memory cells on the common source line SL side relative to a selected cell have all "1" data (maximum cell current) and the marks ○ and ● indicate that the memory cells on the common source line SL side relative to the selected cell have all "0" data (minimum cell current).

As can be seen from FIG. 26, if the word line WL0 is selected, the cell current becomes the lowest. This is because all the unselected cells are connected to the source of the selected cell and a high substrate bias is applied to the unselected cells as already described in the preceding embodiments. If the word line WL15 is selected, the cell current becomes the highest.

In this embodiment, if the word line WL15 is selected, the select gate line GSL is applied with the voltage VGSL=1.8V lower than Vcc. As a result of making the conductance of the select transistor S2 lower than that in case of applying the voltage Vread=5V to the select gate line GSL, the maximum cell current is lowered. If the word line WL0 is selected, the select gate line GSL is applied with the voltage Vread=5V as in the case of the conventional memory and the minimum cell current is maintained as in the case of the conventional memory.

As can be understood from the above, in the third embodiment, it is possible to decrease the difference (maximum current change width) between the maximum current and the minimum current carried to the memory cells as shown in FIG. 26. It is thereby possible to reduce the maximum electromagnetic noise generated by the read current while keeping the maximum read time constant. It is, therefore, possible to read data without any influence of the electromagnetic noise, e.g., potential change due to the capacitance coupling between the adjacent data transfer lines even if a lower cell current is used, to determine the data at high rate, to decrease the probability of reading error resulting from the electromagnetic noise and to obtain high reliability.

Further, since the maximum current of the read cell can be maintained low, the floating of the potential of the common source line SL becomes smaller and the defect that "1" data cannot be sufficiently written to "0" data during verification write less occurs. In addition, since the maximum current carried to the data transfer lines rises, the rise of wiring resistance due to electro-migration caused by current stress does not occur and the deterioration of reliability can be suppressed. Besides, since the change of the threshold voltage of the transistor and the increase of leakage current due to the increase of heat emission can be decreased. Since the minimum read current can be kept the same as that of the conventional memory, read time is not lengthened.

Figure 27:
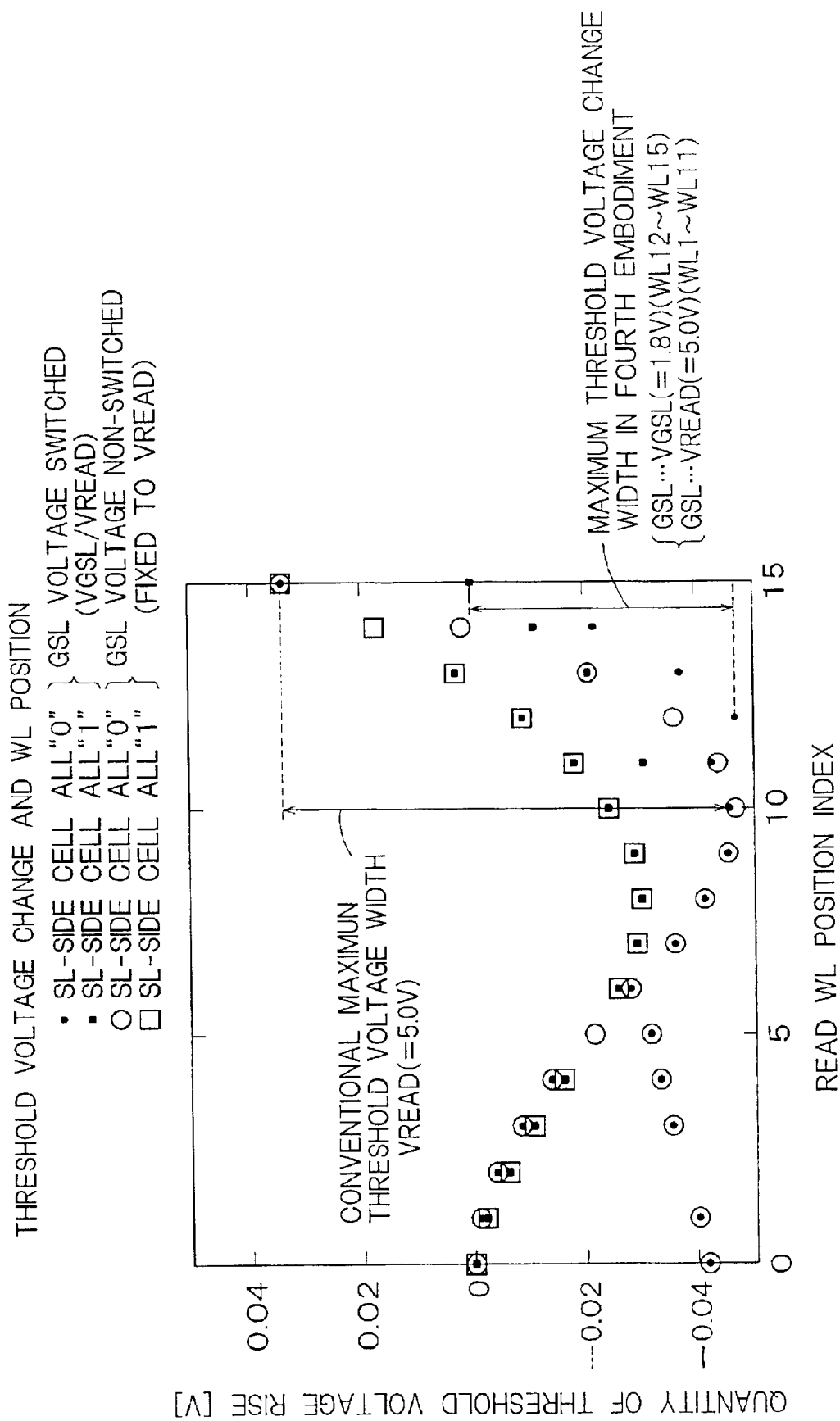
FIG. 27 shows the dependency of threshold voltage on word line position in the fourth embodiment and that according to the prior art.

FIG. 27, which corresponds to FIG. 26, shows the change of the threshold voltage of the selected cell according to the states of the unselected cells other than the selected cell in this embodiment. As is obvious from FIG. 27, in this embodiment, the width of the threshold voltage change according to the position of the word line is smaller than that of the conventional memory and the effect of decreasing the maximum cell current while keeping the minimum cell current the same as that of the conventional memory and the effect of suppressing the threshold voltage change can be obtained. Further, in this embodiment, the read voltage Vr is GND as in the case of the conventional memory, whereby it is not difficult to separate "0" write data and it is possible to stably read data with the threshold voltage distribution set to be the same as the conventional memory.

While FIGS. 26 and 27 show the data at x=3, it is evident from FIGS. 26 and 27 that the same advantages can be obtained at x=1, 2 or 3.

Furthermore, as described in the modification of the first embodiment, even if the gate voltage VSSL of the bit line-side select transistor S1 is made lower than the pass voltage Vread, this embodiment is effectively applicable. In this case, the output of the switching circuit 12 shown in FIG. 25 is connected to the select gate line SSL. In addition, the switching circuit 12 may conduct switching control so that if the word lines WL0 to WLx are selected in accordance with addresses from the address buffer 6, the voltage VSSL lower than the pass voltage Vread is outputted and that if the word lines WL(x+1)–WL15 are selected, the pass voltage Vread is outputted.

Needless to say, the fourth embodiment is also effective if using the memory cell structure described in the first or third embodiment.

Fifth Embodiment

According to the NAND type EEPROM, it is necessary to keep the unselected cells connected in series to the selected cell conductive irrespectively of the threshold voltages thereof and to apply the sum of a voltage and a source potential higher than the upper limit of the write threshold voltage to each of the control gates of the unselected cells during data read as already stated above. At this moment, write stress is applied to the unselected cells due to the pass voltage and writing error occurs. This phenomenon is referred to as "read disturbance".

Figure 28:
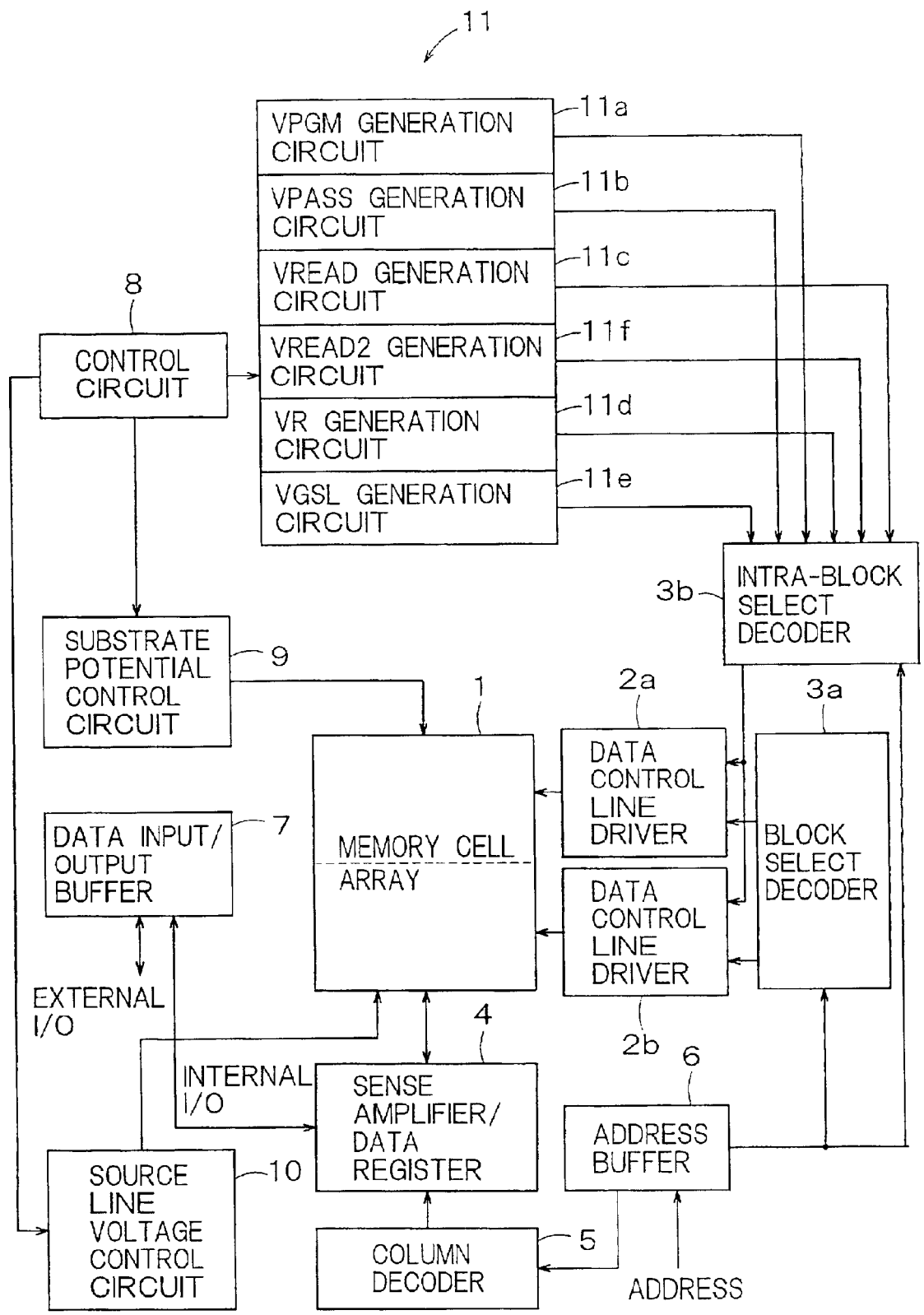
FIG. 28 is a block diagram showing the configuration of an EEPROM in the fifth embodiment of the present invention.

In this fifth embodiment, the voltage relationship of the control gates of unselected cells preferable to suppress the read disturbance in a data read mode will be specified. FIG. 28 shows the configuration of an EEPROM in the fifth embodiment corresponding to that shown in FIG. 1. The cell layout, circuit arrangement and element structure are the same as those in the first or third embodiment.

The fifth embodiment differs from the first embodiment shown in FIG. 1 as follows. First, the internal voltage generation circuit 11 includes a Vread2 generation circuit 11f. That is, besides the Vread generation circuit 11c which generates the pass voltage Vread applied to the control gate (word line) of each of the unselected cells during data read, the Vread2 generation circuit 11f which generates another pass voltage Vread2 lower than the pass voltage Vread, is added in the fifth embodiment.

Second, data line driver blocks 2a and 2b in place of the data control line driver 2 shown in FIG. 1 are provided for each block of the memory cell array 1. In addition, the row decoder 3 has a decoder 3a for block selection and a intra-block decoder (intra-block data select line control circuit) 3b for data select line control in a block. The output of intra-block decoder 3b is connected to a plurality of data select line driver 2a and 2b in parallel, and the intra-block decoder 3b applies the voltage Vread or Vread2 as the voltage of the data select line, of which voltage is conventionally Vread, in accordance with an input from the address buffer and read position. Specifically, the pass voltage Vread2 is applied to the control gate of each of unselected memory cells located on the source line SL-side relative to the selected memory cell and the pass voltage Vread is applied to the control gate electrode of each of unselected memory cells on the bit line BL-side relative to the selected memory cell.

As stated above, the configuration in which the output of the intra-block decoder 3b is shared among a plurality of blocks enables reducing the circuit area of the data select line control circuit and enables realizing a memory circuit with high density compared with the configuration in which the data select line control circuit is provided per memory block. FIG. 28 shows a case in which the memory cell array is divided into two blocks as indicated by a broken line to help understand the configuration. Needless to say, the memory cell array may be divided into a plurality of blocks or not less than two blocks and data control line drivers may be formed for the respective blocks.

The Vread2 generation circuit 11f is equal in configuration to the Vread generation circuit 11c, and that (Vread−Vread2) is not higher than the VBL which is the absolute value of the maximum potential difference between the bit line BL and the common source line SL during data read and not lower than 0V (GND). More preferably, (Vread−Vread2) is set to be higher than the upper limit of the voltage change of the reference potential line due to the change of the cell current of the selected memory cell, e.g., higher than 0.1V and not higher than VBL. By so setting, the advantages of this embodiment can be obtained irrespectively of the potential change of the common source line.

Figure 29:
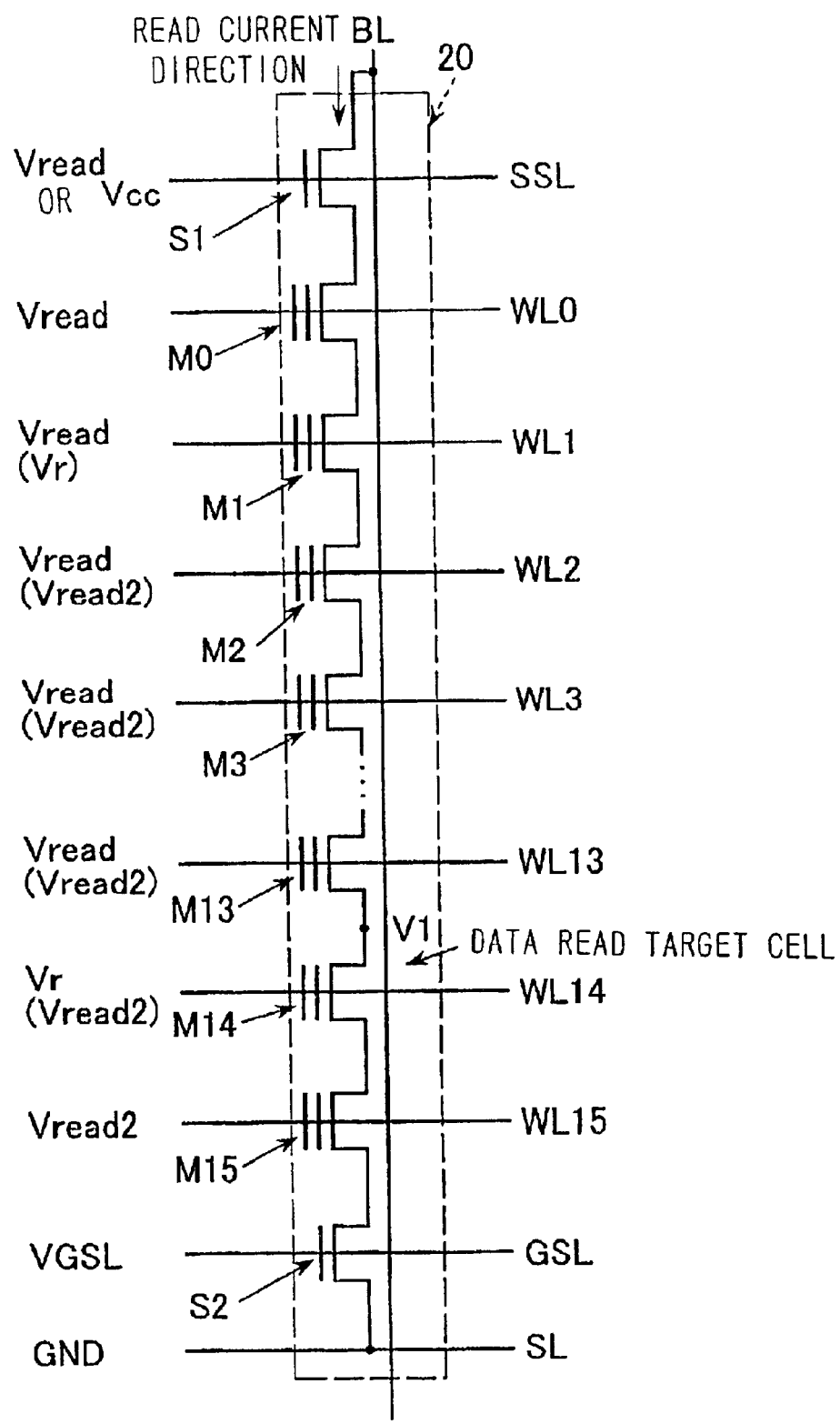
FIG. 29 shows the voltage relationship of the NAND cell unit in the data read operation in the fifth embodiment.

FIG. 29 shows the relationship of voltages in a memory cell block during data read operation in this embodiment. Since the internal configuration of the memory cell block is the same as that in the first embodiment, it will not be described herein. It is considered here that data is read from memory cells connected to a certain word line WLx among the 16 word lines WL0 to WL15. In the configuration in which a current is carried from the bit line BL to the common source line SL during data read, the pass voltage Vread is applied to each of the word lines WL0 to WL(x−1) on the drain side of the selected memory cell and the pass voltage Vread2 lower than the pass voltage Vread is applied to each of the word lines WL(x+1) to WL15 on the source side of the selected memory cell. It is assumed that symbol x is an integer not lower than 1 and not higher than 14.

The data read operation at x=14, i.e., if the word line WL14 is selected and the memory cell M14 is selected, will be specifically described with reference to FIGS. 29 and 30. In FIG. 29, the relationship of voltages in case of selecting the memory cell M1 is also shown in brackets. During data read, the row decoder and the data control line driver 2 corresponding to the data read target block are activated. At time t0, the pass voltage Vread is applied to the bit line-side select gate line SSL, the pass voltage Vread is applied to each of the unselected word lines WL0 to WL13, the read voltage Vr is applied to the selected word line WL14 and the pass voltage Vread2 is applied to the unselected word line WL15. At time t1, the bit line BL is precharged with VBL. During this time, the source-side select gate line GSL has a voltage GND. At time t2, the voltage VGSL is applied to the common source line-side select gate GSL. As a result, if the selected memory cell has "0" data, the bit line is not discharged. If the selected memory cell has "1" data, the bit line is discharged.

The read voltage Vr is a voltage in a range between Vthw2 and Vthe, where Vthw2 is, for example, the lower limit of the threshold voltage distribution after data write and Vthe is, for example, the upper limit of the threshold voltage distribution after data erasure. It is most preferable that the read voltage Vr is set at about (Vthw2+Vthe)/2 to obtain a read margin. Specifically, the read voltage Vr is set between −0.5 and 4V. The lines SSL, WL0 to WL15 and GSL in unselected blocks are each turned into a floating state or maintained to have 0V during data read so as to prevent data reading error or data destruction from occurring.

The read voltage Vr is preferably set so that the erasure threshold voltage Vthe is negative and the write threshold voltage Vthw2 is positive. By so setting, the read voltage Vr can be set at GND and the Vr generation circuit 11d becomes unnecessary. If the read voltage Vr is set to be not lower than GND, no negative voltage is applied to the diffused layers of the transistors of the data control line driver 2 connected to the word lines WL0 to WL15, making it possible to dispense with the negative voltage generation circuit. As a result, the voltage of the p type well in which the n type MISFET's of the data control line driver 2 are formed, can be set at GND and the p-type well 23 can be formed without separating the p type substrate 21 from the n type region. It is thereby possible to reduce the circuit area of the data control line driver 2. Further, no negative voltage is applied to the diffused layers, even a few carriers are not injected thereinto due to the forward bias of the diffused layers, making it possible to prevent latch-up.

Besides, even if short-circuit error occurs to the word lines WL0 to WL15 or in the memory cell array 1, no negative voltage is applied to the p type well 23 or the n type diffused layers 30 of the memory cell array 1 and data destruction does not occur as a result of injection of a few carriers. As shown in FIG. 30, the word lines WL0 to WL13 connected to the remaining unselected memory cells are set to have voltage higher than (maximum write threshold voltage of the memory cell)+VBL outputted from the Vread generation circuit 11c and the voltage Vread is also applied to the bit line-side select transistor SSL.

This embodiment is characterized in that the pass voltage Vread2 lower than the pass voltage Vread applied to the drain-side unselected cells, is applied to the control gate of the unselected cell, i.e., the word line WL15 in this case, connected in the direction in which a current is carried from the selected cell from which data is read, i.e., connected to the selected cell source side. The advantage of using different pass voltages applied to the unselected memory cells will next be described with regards to a case in which the conductance of the drain of the memory is low and a case in which the conductance thereof is high.

If the drain conductance of the selected cell is sufficiently lower than that of each unselected cell or that of the select transistor and the selected cell operates in a saturation region, then most of the voltage between the bit line and the common source line is applied to the region between the source electrode and the drain electrode. Due to this, the potential of the source electrode of the selected cell becomes far lower than the potential of the drain electrode thereof. That is, the potentials of the source and the drain of each of the unselected memory cells connected to the source side of the selected memory cell are closer to the potential GND of the common source line than the potentials of the source and the drain of each of the unselected memory cells connected to the drain side of the selected memory cell.

On the other hand, the source potential of the memory cell M0 closest to the bit line is almost equal to VBL and the source potential of the memory cell M15 closest to the common source line is GND. Accordingly, if only the pass voltage Vread is used as in the case of the conventional memory and all the unselected memory cells are in the erasure state, then the writing error stress of each unselected cell becomes nearly (Vread−VBL) in the memory cell M0 and (Vread−GND) in the memory cell M15 and higher writing error stress is applied to the memory cell M15.

In this embodiment, by contrast, the pass voltage Vread2 is set lower than the pass voltage Vread, e.g., not lower than (Vread−VBL). By so setting, it is possible to effectively reduce the writing error stress applied to the memory cell M15.

Further, the drain conductance of the read memory cell is set sufficiently lower than that of each of the serially-connected, unselected memory cells or that of the selected switching transistor and the read memory cell operates in a saturation region. In this case, the gate voltage measured from the source and drain electrodes of the memory cell M0 is almost equal to (Vread−VBL) as in the case of the conventional memory, no writing error stress is applied from the memory cell M15 and it is possible to maintain good data holding characteristic.

Furthermore, if the drain conductance of the selected memory cell becomes equal to or higher than that of each unselected memory cell, the drain conductance of the select switching transistor S2 is set lower than that of each unselected cell by the same method as that described in the first embodiment. The inventors of the present application consequently discovered that the configuration in this embodiment enables further reducing the writing error stress following the read operation irrespectively of the unselected memory cell storage states, as will be described below.

It is assumed, for example, that the selected memory cell is M14, each of the unselected memory cells M0 to M12 is in a data "0" state (i.e., write state) and low in drain conductance, each of the memory cells M13 and M15 is in a data "1" state (i.e., erasure state) and high in drain conductances and the selected memory M14 is also in an erasure state or data "1" state and high in drain conductance. In this memory storage pattern, it is assumed that the voltage VGSL of the common source line-side select gate line is set at Vread while the drain conductance of the select memory cell is almost equal to that of each of the unselected memory cells and the selected memory cell operates in a linear region.

At this time, the potential difference between the bit line BL and the common source line SL (reference potential line) is applied convergently to memory cell parts having low drain conductance, i.e., the memory cells M0 to M12. By doing so, the potential V1 of the drain node of the selected memory cell M14 (i.e., the source node of the unselected memory cell M13) shown in FIG. 29 becomes almost equal to GND. As a result, the writing error stress of the unselected memory cell M13 becomes (Vread GND), which shows that the same high writing error stress as that of the conventional memory cell is applied to the unselected memory cell M13.

In this embodiment, by contrast, as in the case of the first embodiment, if the VGSL is kept lower than Vcc, the selected switching element (MISFET) S2 operates as a current limiting element when cell current rises. Due to this, if the drain conductance of the selected memory cell is equal to or higher than that of each of the unselected memory cell connected in series, the cell current rises and the voltage drop between the drain and the source of the selected memory cell M13 rises, so that the source node of the unselected memory cell (node V1 shown in FIG. 29) rises to not lower than GND and not higher than VBL. As a result, the writing error stress of the unselected memory cell M13 becomes lower than (Vread−GND).

Figure 30:
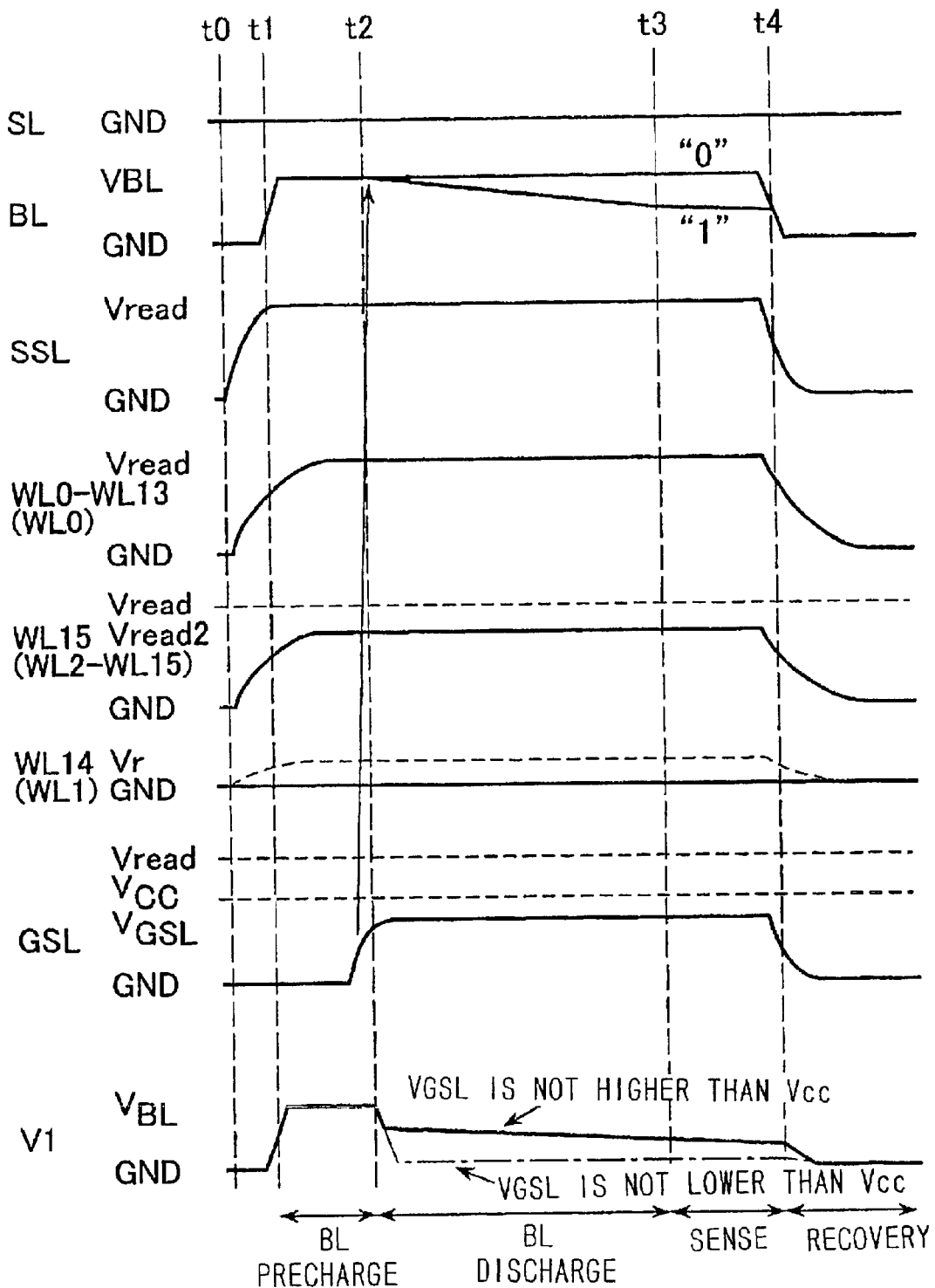
FIG. 30 is a timing chart showing data read operation timing in the fifth embodiment.

FIG. 30 also shows the potential change of the node V1 which is the source of the unselected memory cell M13 stated above. In FIG. 30, a chain line shown indicates that VGSL is not lower than Vcc and a solid line indicates that VGSL is not higher than Vcc. Quite naturally, the writing error stresses applied to the unselected memory cells M0 to M12 located upstream of the memory cell M13 in a current flow direction are smaller than those of the conventional memory.

If the drain conductance of the selected transistor S2 is set higher than that of the selected cell at the threshold current (cell current in the vicinity of the threshold voltage), e.g., three times or more as high as that of the selected cell, and the cell current is almost equal to the threshold current, then 70% or more of the potential difference between the bit line BL and the common source line SL (reference potential line) is applied to the region between the drain and the source of the selected memory cell. Accordingly, the influence of the decrease of the cell current due to the selected transistor S2 is only slight. This is because the select transistor S2 does not simply act as a linear resistor but as a resistor which is quite high in equivalent resistance at a higher current and which is quite low in equivalent resistance at the lower current. It is, therefore, possible to maintain almost the same minimum read current as that of the conventional memory.

If a sense type which compares the magnitudes of a cell current with a current reference value (reference current value) and determines data, in particular, is used, it is quite obvious that the cell current rapidly increases over the threshold current when the drain conductance of the selected memory cell is equal to or higher than that of each of the unselected memory cells connected in series. Due to this, even if the drain conductance of the selected transistor is smaller than that of the conventional but the drain conductance thereof is sufficiently higher than that of the selected memory cell at the threshold current, then the minimum cell current in a case in which the read data is "1" is held and no disadvantage occurs to the threshold determination. Needless to say, the increase of the cell current due to a back pattern can be also suppressed, making it possible to suppress the change of the cell current compared with the conventional memory.

On the other hand, by employing the method of this embodiment, it is possible to decrease the difference between the maximum current and the minimum current carried to the memory cell. It is, therefore, possible to reduce the maximum electromagnetic noise generated by the cell read current while keeping the maximum read time constant. It is thereby possible to read data without any influence of the electromagnetic noise, e.g., potential change due to the capacitance coupling between the adjacent bit lines even if a lower cell current is used. This makes it possible to determine data at high rate, to decrease the probability of reading error resulting from the electromagnetic noise and to obtain high reliability.

Furthermore, since the maximum current carried to the selected memory cell can be kept low, the floating of the potential of the common source line SL becomes smaller. This prevents the occurrence of the defect that "1" data cannot be sufficiently written to the "0" data during verification write. In addition, since the maximum current carried to the bit line falls, as well, the rise of wiring resistance due to electro-migration caused by current stress does not occur and the deterioration of reliability can be suppressed. Further, it is possible to decrease the change of the threshold voltage of the transistor and the increase of leakage current caused by the increase of heat emission. Besides, since the minimum read current can be kept equal to that of the conventional memory, the increase of read time due to the decrease of the minimum read current does not occur.

Moreover, since the writing error stress applied to the unselected memory cells connected in series to the selected memory cell during data read can be reduced, it is possible to narrow the voltage margin between the data "1" and the "0" data. As a result, the pass voltage Vread can be further lowered, whereby it is possible to reduce the area of the booster circuit for generating the pass voltage Vread and boosting time and to thereby realize a memory having higher reliability.

It goes without saying that the configuration in which the voltage VGSL of the select gate line is set lower than Vcc can exhibit the same advantages as those described in the first embodiment.

Neadless to say, the fifth embodiment is also effective if using the memory cell structure described in the first, third, or fourth embodiment.

Sixth Embodiment

Figure 31:
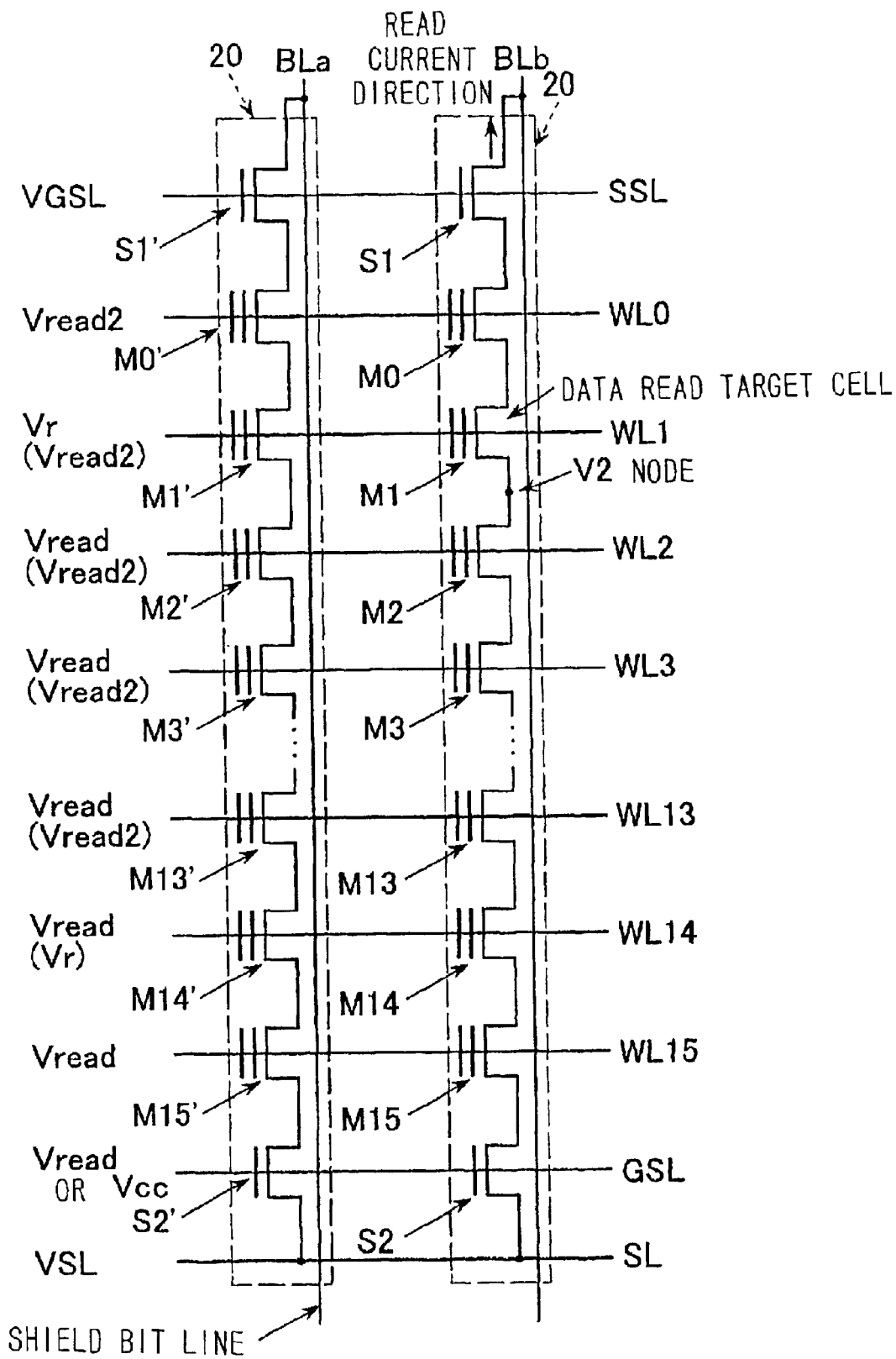
FIG. 31 shows the voltage relationship of the NAND cell unit in the data read operation in the sixth embodiment.

FIG. 31 shows the internal configuration of a memory cell block and voltage relationship during data read operation in the sixth embodiment of the present invention. The overall configuration of an EEPROM is the same as that of the fifth embodiment shown in FIG. 28. In addition, the cell layout, circuit arrangement and element structure are the same as those in the first or third embodiment. The sixth embodiment differs from the fifth embodiment in the direction in which read current flows, in which respect the sixth embodiment is the same as the modification of the first embodiment. FIG. 31 shows parts of bit lines BLa and BLb which share one sense amplifier if fewer sense amplifiers than bit lines are used for a plurality of bit lines.

In this embodiment, data is read from memory cells connected to one bit line BLb by the sense amplifier and the other bit line BLa in an unselected state is kept to have the same potential as that of, for example, the common source line SL during data read to thereby function as a shield line which suppress potential change. For brevity, FIG. 31 only shows the two bit lines BLa and BLb connected to one sense amplifier. However, if a plurality of bit lines are arranged and at least one bit line other than a read bit line is used as a shield line, the advantage of this embodiment can be obtained.

In view of the shield effect, the configuration shown in FIG. 2 in which at least one shield bit line BLa exists between a plurality of bit lines BLb to which read cells are connected, respectively, is particularly preferable to reduce the capacitance coupling noise of the bit lines following data read. In this embodiment it is also possible to suppress the read disturbance of the memory cells connected to the shield bit line.

Since the internal configuration of a memory cell block is the same as that in the first embodiment, it will not be described herein. In this embodiment, a case in which data is read from a memory cell driven by a word line WLx among 16 word lines WL0 to WL15 and connected to the bit line BLb will be considered. In this embodiment in which a current is carried from the common source line SL to the bit line BL during data read, the pass voltage Vread is applied to each of the word lines WL(x+1) to WL15 located on the drain side of the selected memory cell (which drain side is the common source line SL side since current flow is opposite to that in the fifth embodiment) as in the same manner as the conventional memory and the pass voltage Vread2 lower than the pass voltage Vread is applied to each of the word lines WL0 to WL(x−1) located on the source side of the selected memory cell.

Figure 32:
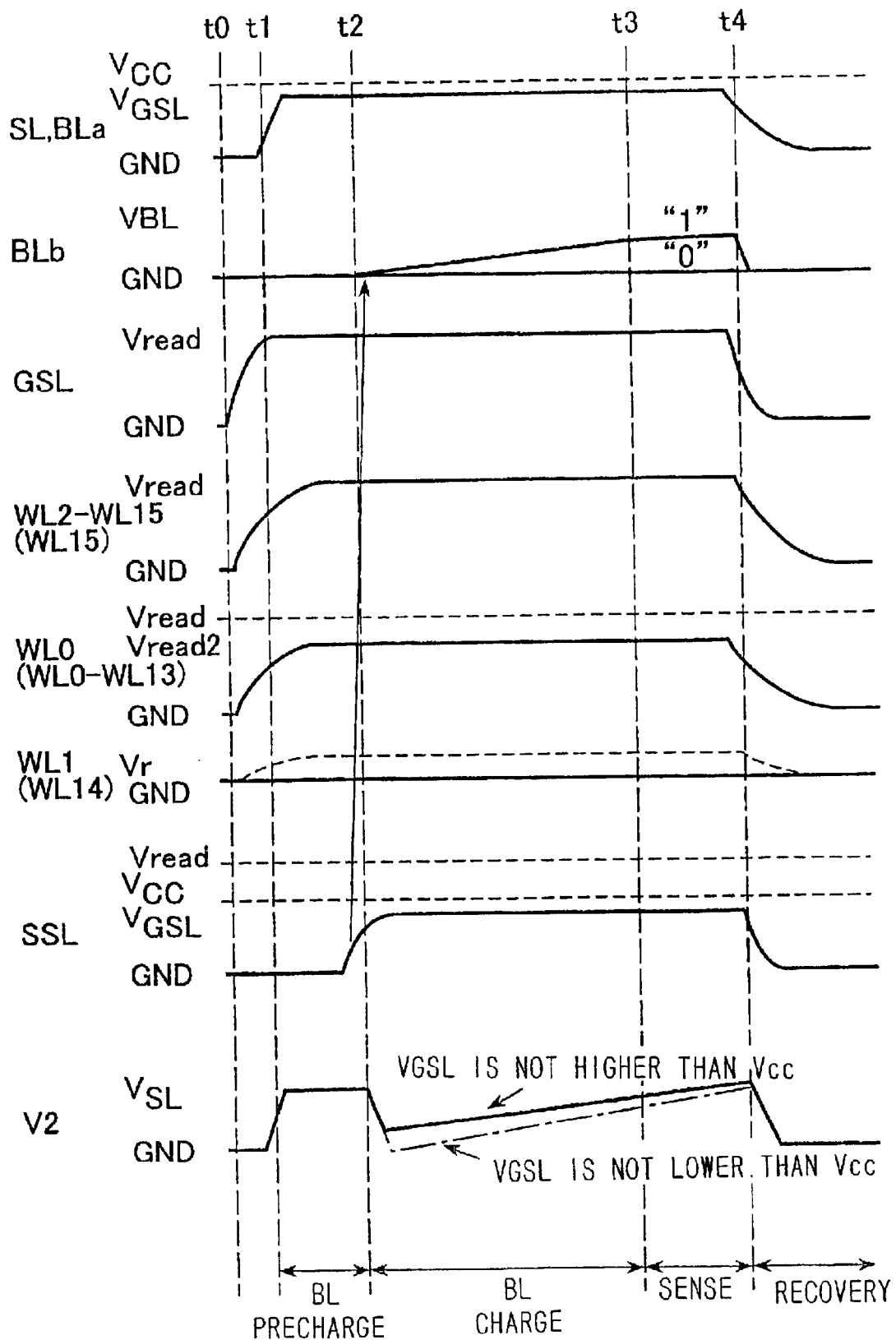
FIG. 32 is a timing chart showing data read operation timing in the sixth embodiment.

It is assumed herein that x is an integer not lower than 1 and not higher than 14. FIG. 31 shows the relationship of voltages at x=1, i.e., in a case in which the memory cell M1 is selected by the word line WL1. FIG. 32 is a timing chart for the read operation. In FIG. 31, the voltage relationship if the memory cell M14 instead of the memory cell M1 is selected is also shown in brackets. The pass voltages applied to the unselected cells on the drain side and the source side of the selected memory cells, respectively, are set in the same manner as that described above even if the other memory cell is selected.

During data read, the data control line driver 2 of the block from which data is read is activated by the block select decoder 3a and the intra-block select decoder 3b. First, at time t0, the pass voltage Vread is applied to the common source line-side select gate line GSL and to the unselected word lines WL2 to WL15, the read voltage Vr is applied to the selected word line WL1, and the pass voltage Vread2 lower than the pass voltage Vread is applied to the unselected word line WL0. At time t1, the voltage VSL is applied to the common source line SL and the unselected bit line BLa. At time t2, the voltage VSL is applied to the bit line-side select gate SSL, whereby the selected bit line BLb is charged by a current carried from the common source line SL in accordance with read data (at data "1") or not charged (at data "0").

Each of the lines SSL, WL0 to WL15 and GSL in unselected blocks is kept in a floating state or to have a voltage 0V during data read so as to prevent data reading error or data destruction from occurring.

The read voltage Vr is a voltage in a range between Vthw2 and Vthe, where Vthw2 is the lower limit of the threshold voltage distribution after data write and Vthe is the upper limit of the threshold voltage distribution after data erasure. It is most preferable that the read voltage Vr is set at about (Vthw2+Vthe)/2 to obtain a read margin. Specifically, the read voltage Vr is set between −0.5 and 4V. If the read voltage Vr is preferably set so that Vthe is negative and Vthw2 is positive, the read voltage Vr can be set at GND and the Vr generation circuit 11d becomes unnecessary.

In addition, it is preferable that the read voltage Vr is set to be not lower than GND. By so setting, no negative voltage is applied to the diffused layers of the transistors of the data control line driver 2 connected to the word lines WL0 to WL15, making it possible to dispense with the negative voltage generation circuit. Further, the voltage of the p type well in which the n type MISFET's of the data control line driver 2 are formed, can be set at GND and the p-type well 23 can be formed without separating the p type substrate 21 from the n type region. As a result, it is possible to reduce the circuit area of the data control line driver 2. Further, since no negative voltage is applied to the diffused layers, even a few carriers are not injected thereinto due to the forward bias of the diffused layers, making it possible to prevent latch-up.

Besides, even if short-circuit error occurs to the word lines WL0 to WL15 or in the memory cell array 1, no negative voltage is applied to the p type well 23 or the n type diffused layers 30 of the memory cell array 1 and data destruction does not occur as a result of injection of a few carriers. As shown in FIG. 28, the word lines WL2 to WL15 connected to the remaining unselected memory cells are set to have voltage higher than the maximum write threshold voltage of the memory cell outputted from the Vread generation circuit 11c and the voltage Vread is also applied to the bit line-side select transistor GSL.

This embodiment is characterized in that the pass voltage Vread2 lower than the pass voltage Vread is applied to the gate electrode of the unselected cell, i.e., the word line WL0 in this case, connected in the direction in which a current is carried from the selected cell from which data is read, i.e., connected to the source side. The advantage of using different pass voltages applied to the unselected memory cells will next be described with regards to a case in which the conductance of the drain of the memory is low and a case in which the conductance thereof is high.

First, it is assumed that the drain conductance of the selected cell from which data is read is sufficiently lower than that of each unselected cell or that of the selected transistor and the selected cell operates in a saturation region. If so, most of the voltage between the bit line and the common source line is applied to the region between the source electrode and the drain electrode of the selected cell and the potential of the source electrode of the selected cell becomes far lower than the potential of the drain electrode thereof. That is, the potentials of the source and the drain of each of the unselected memory cells connected to the drain side of the selected memory cell are closer to the potential VSL applied to the common source line than the potentials of the source and the drain of each of the unselected memory cells connected to the source side of the selected memory cell.

On the other hand, the source potential of the unselected memory cell M0 closest to the bit line BL is almost equal to GND and the source potential of the memory cell M15 closest to the common source line is VSL. Accordingly, if all the unselected memory cells are in the erasure state and the same pass voltage Vread is applied thereto, then the writing error stress of each unselected cell becomes nearly Vread−VSL in the memory cell M15 and Vread−GND in the memory cell M0 and higher writing error stress is applied to the memory cell M0.

In this embodiment, by contrast, the pass voltage Vread2 is set lower than the pass voltage Vread, e.g., not lower than Vread−VSL. By so setting, it is possible to effectively reduce the writing error stress applied to the memory cell M0. If the drain conductance of the selected memory cell is set sufficiently lower than that of each of the serially-connected, unselected memory cells or that of the selected transistor and the selected memory cell operates in a saturation region, then the gate voltage measured from the source and drain electrodes of the memory cell M15 is almost equal to Vread−VSL as in the case of the conventional memory, writing error stress higher than that of the conventional memory is not applied and it is possible to maintain good data holding characteristic.

Furthermore, if the drain conductance of the selected memory cell becomes equal to or higher than that of each serially connected, unselected memory cell, it is effective that the drain conductance of the select transistor S1 is set lower than that of each unselected cell by the same method as that described in the first embodiment. Consequently, it become obvious that the configuration in this embodiment enables further reducing the writing error stress following the read operation irrespectively of the unselected memory cell storage states, as will be described below.

It is assumed, for example, the selected memory cell is M1, each of the unselected memory cells M3 to M15 is in a data "0" state (i.e., write state) and low in drain conductance, and each of the memory cells M0 and M2 is in a data "1" state (i.e., erasure state) and high in drain conductances. It is also assumed that the selected memory M1 is in an erasure state or data "1" state and high in drain conductance. In this memory storage pattern, it is further assumed that the drain conductance of the selected memory cell is almost equal to that of each of the serially connected, unselected memory cells and the selected memory cell operates in a linear region.

At this time, if the voltage VGSL of the select gate line is set at the pass voltage Vpass, the potential difference between the bit line BL and the common source line SL (reference potential line) is applied convergently to memory cell parts having low drain conductance, i.e., the unselected memory cells M3 to M15. By doing so, the potential of the drain node of the selected memory cell M1 (i.e., node V2) shown in FIG. 31 becomes almost equal to GND. As a result, the writing error stress of the unselected memory cell M12 becomes (Vread−GND), which shows that the same high writing error stress as that of the conventional memory cell is applied to the unselected memory cell M12.

In this embodiment, by contrast, as described in the modification of the first embodiment, if the VGSL of the select gate line is kept lower than Vcc, the selected transistor S1 operates as a current limiting element if cell current rises. Due to this, if the drain conductance of the selected memory cell is equal to or higher than that of each of the serially connected, unselected memory cells, the cell current rises and the voltage drop between the drain and the source of the selected transistor S1 rises. As a result, a node V2 which is the source of the unselected memory cell M2 rises and the writing error stress of the unselected memory cell M2 is always lower than Vread−GND.

FIG. 32 also shows the change of the node V2 which stated above. In FIG. 32, a chain line shown indicates that VGSL is not lower than Vcc and a solid line indicates that VGSL is not higher than Vcc. Quite naturally, the writing error stresses applied to the unselected memory cells M2 to M15 located upstream of the memory cell M2 in a current flow direction are smaller than those of the conventional memory.

If the drain conductance of the selected transistor S1 is set higher than that of the selected cell from which data is read, at the threshold current, e.g., three times or more and the cell current is almost equal to the threshold current, then 70% or more of the potential difference between the bit line BL and the common source line SL (reference potential line) is applied to the region between the drain and the source of the selected memory cell. Accordingly, the decrease of the cell current due to the selected transistor S1 has only a slight influence. This is because the select transistor S1 does not simply act as a linear resistor but as a resistor which is quite high in equivalent resistance at a higher current and which is quite low in equivalent resistance at the lower current. In other words, it is possible to maintain almost the same minimum read current as that of the conventional memory.

If a sense type which compares the magnitudes of a cell current with a current reference value and determines data, in particular, is used, it is quite obvious that the cell current is rapidly increases over the threshold current when the drain conductance of the selected memory cell is equal to or higher than that of each of the unselected memory cells connected in series. Due to this, even if the drain conductance of the selected switching transistor is smaller than that of the conventional but the drain conductance thereof is sufficiently higher than that of the selected memory cell at the threshold current, then the minimum cell current in a case in which the read data is "1" is held and no disadvantage occurs to the threshold determination.

At the same time, the increase of the cell current due to a back pattern can be suppressed, making it possible to suppress the change of the cell current compared with the conventional memory. The back pattern means a threshold voltage pattern of each of the unselected cells connected in series to the selected cell, particularly the threshold voltage pattern of the bit line-side unselected memory cell. The conductance between the drain of the selected cell and the bit line is determined according to the write/erasure data state of the bit line-side unselected cells and the read current of the selected cell is determined by the conductance, which is referred to as "the influence of the back pattern" by the inventors of the present application.

Further, in this embodiment, the same potential VSL as that of the potential reference line SL is applied to the shield bit line BLa during data read as shown in FIG. 32. Therefore, the writing error stress of the memory cells M0' to M15' connected to the unselected shield bit line BLa takes a maximum of Vread−VSL and can be more constantly suppressed than (Vread−GND) applied to the memory cells connected to the conventional shield bit line BLa. Since the potential of the common source line is kept equal to that of the unselected bit line BLa during data read, it is obvious that the unselected bit line BLa functions as a shield line and that the capacitance coupling noise between a plurality of bit lines BLb can be reduced.

By employing the method of this embodiment, it is possible to decrease the difference between the maximum current and the minimum current carried to the memory cell. It is, therefore, possible to reduce the maximum electromagnetic noise generated by the cell read current while keeping the maximum read time constant. It is thereby possible to read data without any influence of the electromagnetic noise, e.g., potential change due to the capacitance coupling between the adjacent bit lines even if a lower cell current is used. This makes it possible to determine data at high rate, to decrease the probability of reading error resulting from the electromagnetic noise and to obtain high reliability.

Furthermore, since the maximum current carried to the read memory cell can be kept low, the floating of the potential of the common source line SL becomes smaller. This make it difficult to cause threshold voltage change following drain voltage change. In addition, since the maximum current carried to the bit line decreases, as well, the rise of wiring resistance due to electro-migration caused by current stress does not occur and the deterioration of reliability can be suppressed. Further, it is possible to decrease the change of the threshold voltage of the transistor and the increase of leakage current caused by the increase of heat emission. Besides, since the minimum read current can be kept equal to that of the conventional memory, the increase of read time due to the decrease of the minimum read current does not occur.

Moreover, since the writing error stress applied to the unselected memory cells connected in series to the selected memory cell during data read can be reduced, it is possible to narrow the voltage margin between the data "1" and the "0" data. As a result, the pass voltage Vread during data read can be further lowered, whereby it is possible to reduce the area of the booster circuit for generating the pass voltage Vread and boosting time and to thereby realize a memory having higher reliability. It goes without saying that this embodiment can exhibit the same advantages as those described in the first embodiment.

Neadless to say, the sixth embodiment is also effective if using the memory cell structure described in the first, third, or fourth embodiment.

Seventh Embodiment

FIG. 33 is a block diagram of a NAND type EEPROM in the seventh embodiment of the present invention. The configuration of a cell array is the same as that shown in FIGS. 2 to 8. In addition, the element structure in the third embodiment can be used in this embodiment. FIG. 33 shows almost the same configuration as that in the sixth embodiment shown in FIG. 28. However, the seventh embodiment is characterized in that the Vread generation circuit 11c can selectively output at least two different pass voltages Vread's according to a selected page during data read.

In this embodiment, a method of effectively suppressing the threshold voltage change of an unselected memory cell during data read is provided. During data read, the conductance of each of unselected memory cells connected in series to a selected memory cell changes according to a write/erasure state thereof and the threshold voltage of the selected memory cell disadvantageously changes, accordingly. This disadvantage can be basically solved by raising the control gate voltage of each unselected memory cell and raising the drain conductance thereof. However, if the control gate voltage of each unselected memory cell is set excessively high, write stress is applied to the unselected cell and writing error (read disturbance) occurs.

In this embodiment, the drain conductance is not lowered while many unselected memory cells each having "0" data are connected to the drain of the selected memory cell, the writing error of the unselected memory cells caused by the read disturbance is prevented and the threshold voltage rise of the selected memory cell is decreased. This is because the condition for the threshold voltage rise of the selected memory cell is changed so that the threshold voltage rise thereof is kept constant, the drain conductances of the unselected memory cell in the worst state, i.e., a state in which all the unselected memory cells have "0" data, can be raised and the conventional disadvantage can be thereby solved.

To this end, according to the configuration of this embodiment as shown in FIG. 33, a selected page is inputted from the address buffer 6 into the Vread generation circuit 11c of the internal voltage generation circuit 11 as a control input for controlling the output voltage of the circuit 11c. "Page" herein means a group of a plurality of memory cells arranged in one NAND cell block and connected to word lines WL0 to WL15, respectively.

Figure 34:
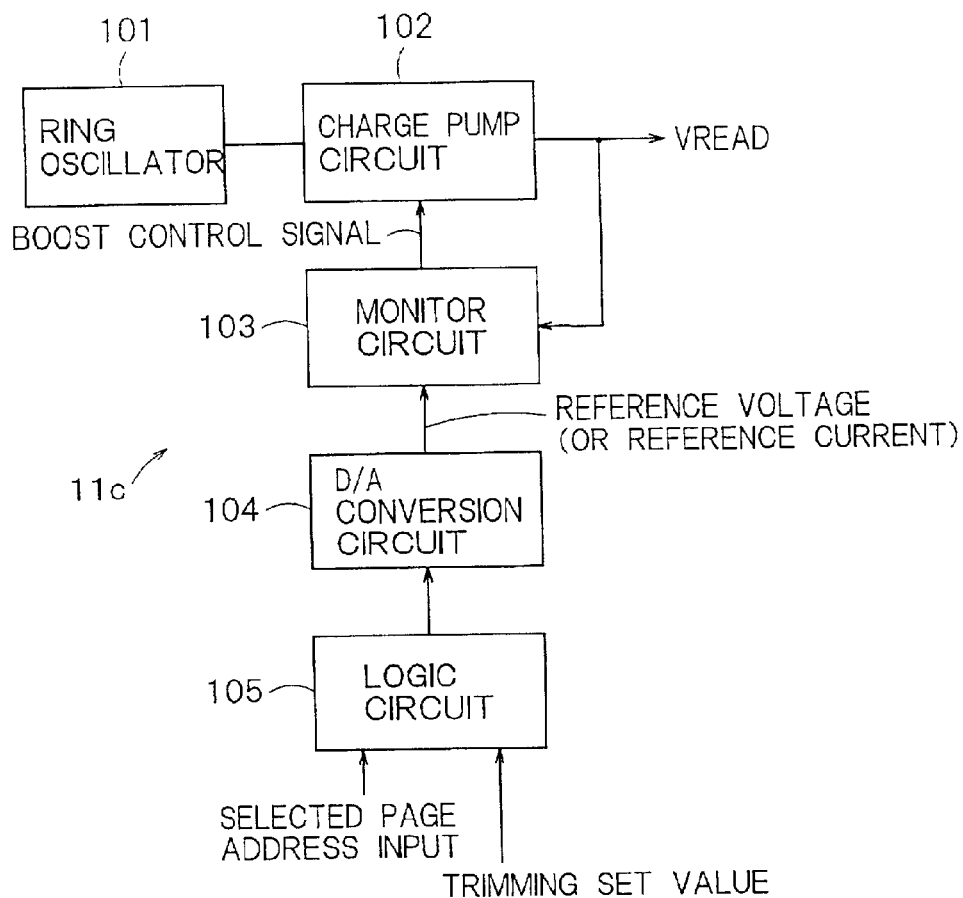
FIG. 34 is a block diagram showing the configuration of a Vread generation circuit shown in FIG. 33.

FIG. 34 shows the concrete configuration of the Vread generation circuit 11c. A ring oscillator circuit 101 and a charge pump circuit 102 driven by the oscillation output of the ring oscillator circuit 101 constitute a booster circuit. The booster circuit generates a high pass voltage Vread obtained by boosting a power supply voltage. A voltage (or current) monitor circuit 103 which restricts the boosting operation of the booster circuit or the charge pump circuit 102 is connected to the output terminal of the charge pump circuit 102. This monitor circuit 103 controls the charge pump circuit 102 to be stopped or to lower a driving force thereof if the pass voltage Vread is raised to not lower than a preset voltage. This monitor circuit 103 forms a feed-back structure for the Vread output voltage, thereby ensuring stable output voltage.

As the ring oscillator circuit 101, the charge pump circuit 102 and the monitor circuit 103, well-known circuits (as disclosed in, for example, Japanese Patent Application Laid-open Publication No. 2000-105998) are employed, respectively. Alternatively, as a circuit type for obtaining different boosted voltages according to reference voltages (or reference currents), a plurality of charge pump circuits are provided and controlled to be switched over to one another (as disclosed in, for example, Japanese Patent Application Laid-open Publication No. 7-111095).

The monitor circuit 103 consists of a comparator which compares a divided voltage of the voltage Vread with a reference voltage. Alternatively, the monitor circuit 103 may include a circuit which divides the output pass voltage Vread or current using, for example, serially-connected resistances and then compares the divided voltage or current with a reference voltage or a reference current. By doing so, the monitor circuit 103 which feeds back the voltage Vread of, for example, not lower than 3V can be formed out of a circuit which employs an active element having a lower voltage than Vread and an active circuit element lower in withstand voltage and smaller in area can be employed. As a result, it is possible to further reduce the circuit area of the monitor circuit 103.

If the reference current is used, the monitor circuit 103 is constituted so that the comparator compares the reference current with the divided current obtained by dividing the Vread output using, for example, serially-connected resistances. A reference voltage generation circuit has a logic circuit 105 into which digital data is inputted and a D/A conversion circuit 104 which converts the output of the logic circuit 105 into an analog value. The output of the D/A conversion circuit 104 becomes the reference voltage (or reference current) for setting the voltage Vread.

The logic circuit 105 inputs two digital signals, i.e., a page address signal selected during data read and a trimming set value the logic value of which can be set after wiring layers are all layered, and generates and outputs a sum signal of the signals. The trimming set value is data used to adjust a boosted voltage to an optimum voltage, programmably held in a nonvolatile memory such as a fuse or an anti-fuse according to the result of a wafer test, automatically read from the nonvolatile memory when the power of the memory is turned on and used to adjust the internal voltage generation circuit. It is preferable that the voltage Vread is set for a certain page and then the voltage Vread thus set is kept unchanged regardless of the cutoff of the power supply during a shipment test. By so setting, the voltage Vread can be kept in a certain range after adjustment.

Figure 35:
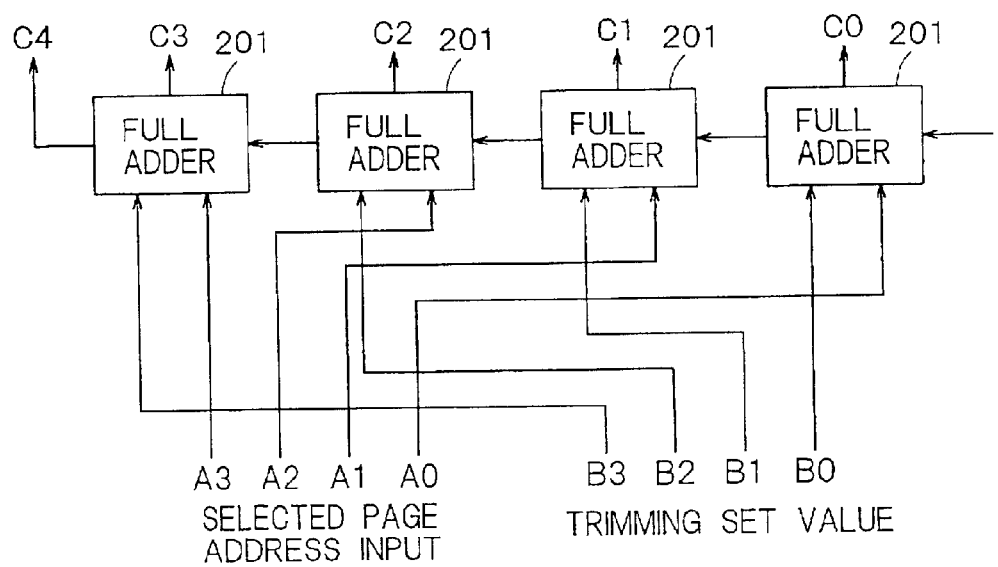
FIG. 35 is a block diagram showing the configuration of a logic circuit shown in FIG. 34.

FIG. 35 shows an example of the configuration of the logic circuit 105 which constitutes a so-called Manchester type adder having a plurality of full adders 201 connected in series. Reference symbols A3 to A0 denote the signal lines of selected page addresses (digital signals), respectively, and reference symbols B3 to B0 denote the signal lines of trimming set values (digital signals), respectively. If the select page addresses and the trimming set values are inputted into the Manchester type adder constituted as stated above, the sums of the selected page addresses and the trimming set values are digitally outputted to C4 to C0, respectively.

Since the outputs of the logic circuit 105 are digital outputs described above, the logic circuit 105 is less influenced by noise and is capable of securing a wider dynamic range than a case in which an analog signal is created from a selected page address, an analog signal is created from the digital input of a trimming set value and the analog signals are summed up as an analog signal. In addition, since it suffices to provide only one D/A conversion circuit 104, monotonicity can be easily ensured for the sum of each selected page address and each trimming set value and the characteristic change caused by temperature change can be easily ensured. As a result, even if a voltage step to be set is small, it is possible to set the voltage Vread with high accuracy.

If only upper addresses of the selected page, for example, are allocated to the signal lines A1 and A0, respectively and the signal lines A3 and A2 are set to have the ground potential GND to thereby divide the word lines into groups of, for example, WL0 to WL3, WL4 to WL7, WL8 to WL11 and WL12 to WL15, it is possible to obtain the voltage Vread different among the groups and constant in each group. This can facilitate allocating the addresses by changing the voltage step according to the difference in selected page address and changing the voltage step of trimming inputs. Further, by dividing the digital value of the selected page in a division circuit, arbitrary integral multiples of the trimming input step can be allocated to the voltage steps according to the difference in selected page address, respectively.

Figures 36A, 36B, 36C:
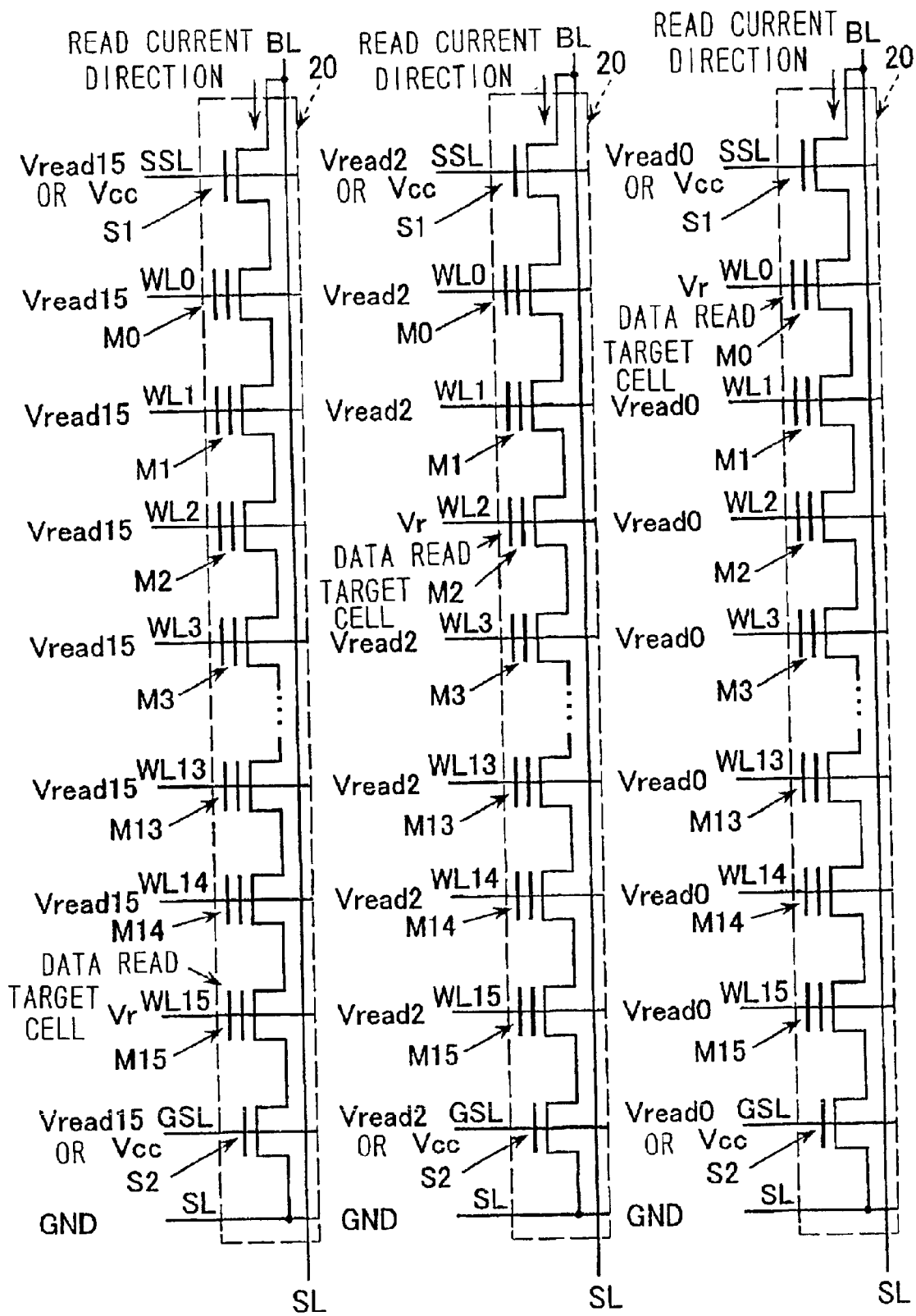
FIGS. 36A, 36B and 36C show the voltage relationship of the NAND cell unit in the data read operation in the eighth embodiment.

Next, the voltage relationship and operation of memory cell parts during data read in this embodiment will be described with reference to FIGS. 36A, 36B and 36C. In FIGS. 36A, 36B and 36C, a pass voltage outputted from the Vread generation circuit 11c if a word line WLx (where x is an integer between 0 and 15) is denoted by Vreadx. FIG. 36A shows a case in which the memory cell M15 closest to the common source line SL is selected, FIG. 36B shows a case in which the memory cell M2 is selected and FIG. 36C shows a case in which the memory cell M0 closest to the bit line BL is selected. In addition, a read current is carried from the bit line BL to the common source line SL.

In FIG. 36A which shows that the word line WL15 is selected, the largest number of unselected memory cells exist on the bit line BL side relative to the selected memory cell M15. In FIG. 36C which shows that the word line WL0 is selected, no unselected memory cell exists on the bit line side relative to the selected memory cell M0. The relationship between the pass voltage Vread15 applied to each unselected memory cell in case of FIG. 36A and the pass voltage Vread0 applied to each unselected memory cell in case of FIG. 36C are set to satisfy Vread15>Vread0.

FIG. 36B shows a case in which the word line WL2 is selected. In this case, the pass voltage Vread2 applied to each unselected memory cell is set to have a relationship of Vread15>Vread2>Vread0. That is, this embodiment is characterized in that as the number of unselected memory cells existing on the bit line BL side relative to the selected cell from which data is read increases, the pass voltage applied to each unselected memory cell is raised.

More generally, if it is assumed that the integer x which expresses the position of the word line WLx has arbitrary values i and j and the values i and j satisfy a relationship of i>j, then it is preferable that Vreadi and Vreadj satisfies a relationship of Vreadi=Vreadj so as to suppress the rise of an erasure threshold voltage caused by the read disturbance.

This embodiment is particularly effective if write verification read operation is carried out so that data is batch-erased and then data is sequentially written to memory cells from the common source line side. If data is written to the memory cells from the common source line side, it suffices to take account of only the memory cells on the drain side (bit line side) with regards to the resistance change of each unselected cell due to the data written after the data is written to the selected cell. In this case, the voltage drop quantity of each of the source-side unselected cells has no change. It is, therefore, possible to suppress threshold voltage change due to source potential change and to decrease the threshold voltage change of the selected memory cell. As shown in FIGS. 36A, 36B and 36C, the voltage applied to the control gate of each of the select switching transistors S1 and S2 may be Vreadx or Vcc as in the case of the conventional memory. Needless to say, any methods described in the first to sixth embodiments can be used in this embodiment.

Figure 38:
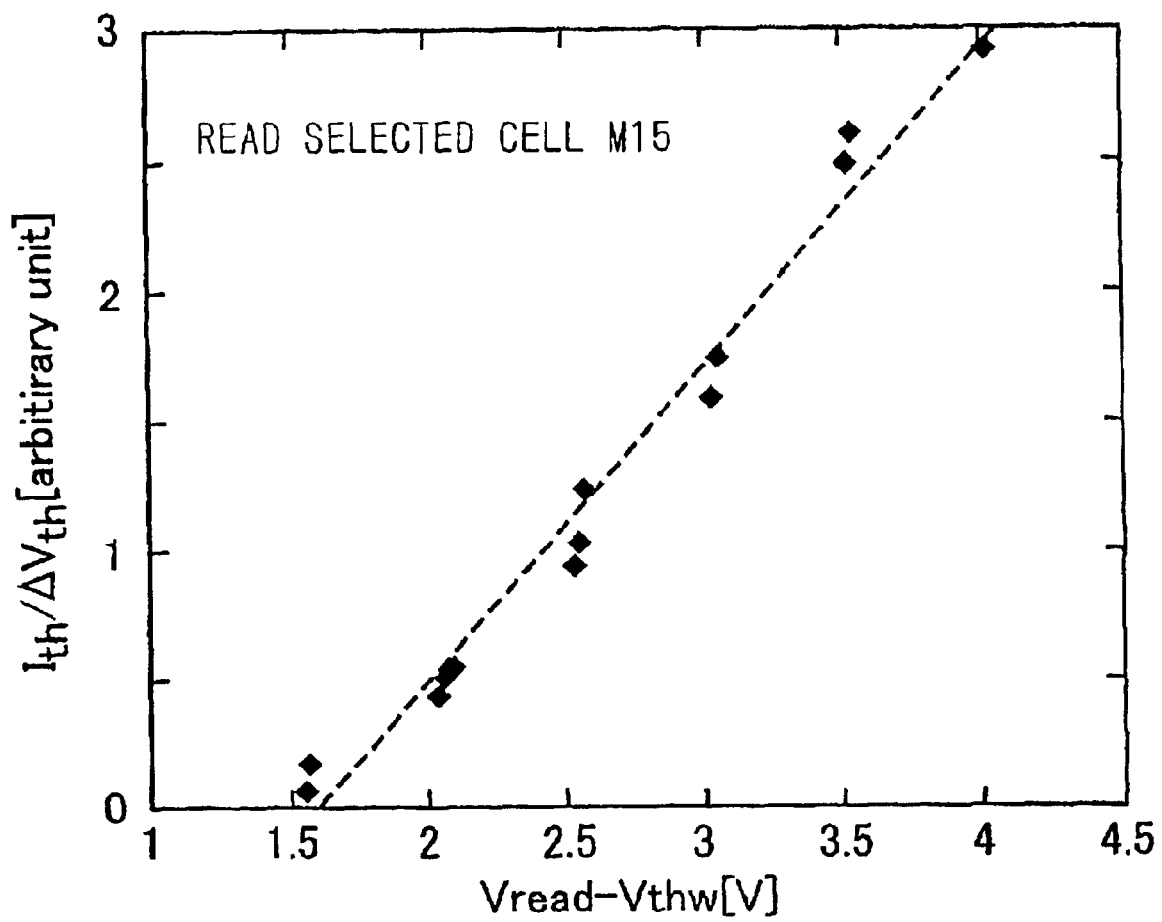
FIG. 38 is a graph of experimental data which shows the manner of threshold voltage change due to the back pattern of a selected memory cell in the seventh embodiment.

It is assumed that the maximum change quantity of the threshold voltage of the selected cell resulting from the change of the conductance of each unselected cell according to the write/erasure states (i.e., back pattern) of the unselected cells connected in series to the selected cell from which the data is read, is ?Vth and that a current (threshold current) which defines a threshold voltage is Ith. For the first time, the inventors of the present application discovered that if the position of the selected cell is fixed, Ith/?Vth forms almost a linear function of (Vread−Vthw) as shown in FIG. 38 and constructed the analysis model of the linear function. FIG. 38 shows Ith/?Vth if the memory cell M15 closest to the common source line is specifically set at the read selected cell and the pass voltage Vread and the write threshold voltages Vthw applied to the memory cells M0 to M15 are variously changed. The erasure threshold voltage Vthe is fixed to −2V and Ith ranges from not lower than 10 pA to not higher than 2 uA. In addition, the pass voltage Vread ranges from 3V to 6V and the write threshold voltage Vthw ranges from 0V to 4V.

The characteristics shown in FIG. 38 can be explained as follows. If the drain conductance of the selected cell is sufficiently lower than that of each serially connected, unselected cell and that of each select switching transistor and the selected cell operates in a saturation region, then most of the voltage between the bit line and the common source line is applied to the region between the drain and the source of the selected cell and the potential of the source electrode of the selected cell, therefore, becomes far lower than that of the drain electrode thereof. If it is assumed that each unselected cell connected to the bit line side relative to the selected cell performs a linear operation, the conductance of each unselected cell becomes the lowest when the threshold voltage Vthw is in a write state and expressed as βcell×(Vreadx−Vthw−V0), where V0 is a constant. The conductance of all the bit line-side unselected cells is lowered as the number nk of the bit line-side unselected cells increases. If the substrate bias effect is ignored, the conductance is almost expressed as βcell×(Vreadx−Vthw−V0)/nk.

If an unselected cell is in an erasure state, the threshold voltage thereof is Vthe. Therefore, the change quantity ?VD of the drain voltage of the selected cell resulting from the change of the conductance according to the write/erasure states of the bit line-side unselected cells connected in series to the selected cell can be approximated as shown in the following formula 5.

$$?Vth \propto ?VD = (Ith \cdot nk/\beta cell)[1/(Vreadx-Vthw-V0)-1/(Vreadx-Vthe-V0)] - Ith \cdot nk/\beta cell \cdot (Vreadx-Vthw-V0) \quad \text{Formula 5.}$$

Namely, the formula 5 indicates that if Vthw and Vthe are set at, for example, 1V and −2V, respectively, then the second term smaller than the first term in braces can be ignored and an approximation formula which expresses that the threshold voltage change ?Vth is inversely proportional to (Vreadx−Vthw−V0) can be thereby obtained. If the constant current of Ith is carried, the source potential of the selected cell has no change. Since the threshold voltage drop ?Vth of the selected cell due to the drain induced barrier lowering is proportional to ?VD, the experimental characteristics shown in FIG. 38 are explicable.

Figures 37A, 37B:
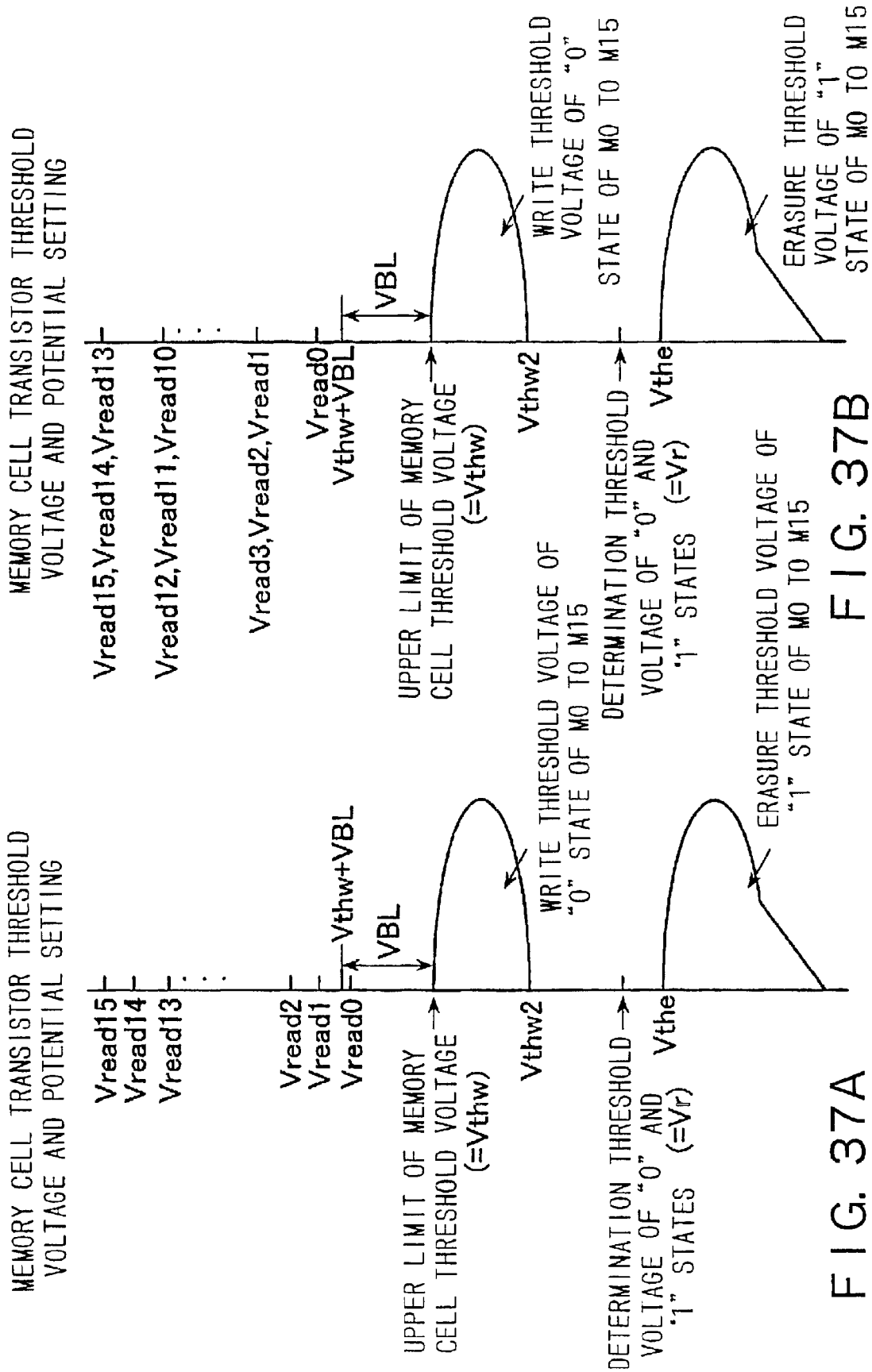
FIGS. 37A and 37B show examples of the setting of pass voltage Vread in the seventh embodiment.

In FIGS. 36A, 36B and 36C, if the number nk of the serially connected, unselected cells upstream of the selected cell is small, ?Vth becomes smaller according to the formula 5. Accordingly, if (Vreadx−Vthw−V0)/nk is set constant according to the position x of the selected cell, it is possible to make ?Vth closer to a constant value. FIG. 37A shows an example of the setting of pass voltages as described above. Namely, the read voltages are set to satisfy a relationship of Vread15>Vread14>Vread13>. . . >Vread 1, and the intervals between the voltages are set almost equal to make ?Vth constant according to the formula 5. Vreadx is set herein to be not lower than (Vthw+VBL). As for the Vread0, since no unselected cell exists on the bit line side relative to the selected cell, it is not necessary to set the interval with the Vread0 equal but may be not less than Vthw. Needless to say, the voltage Vread0 may be set to be not lower than (Vthw+VBL).

In this embodiment, if all the memory cells M0 to M15 are read by a constant number of times, it is possible to reduce the total Vread stress of the unselected cells while securing the minimum current carried to the cells compared with a conventional memory wherein data is read from all the memory cells at the same constant pass voltage as Vread15. If it is assumed that the rise of the accumulated quantity of the charge accumulation layer due to the read disturbance when a certain pass voltage Vread is applied is ?Q (Vread), the total Vread stress generated when data is read from all the memory cells M0 to M15 a certain number of times kn is almost proportional to S?Q (Vreadx).

Since the read timing of this embodiment is the same as that of the first embodiment, it will not be described herein.

FIG. 37B shows another example of the setting of pass voltages. In FIG. 37B, the position x of the selected cell is divided into groups each having three consecutive positions such as 15 to 13, 12 to 10, 9 to 7, . . . in a range of 0 to 15 and the same pass voltage is used in the same group. That is, the pass voltage is set so that Vread15=Vread14=Vread13, Vread12=Vread11=Vread10, . . . Vread3=Vread2=Vread1.

As stated above, the pass voltages Vread's may be applied by dividing them into groups. Generally, if integers i and j corresponding to the position x of the selected cell have arbitrary values from 1 to 15, the integers i and j satisfy a relationship of i>j and a relationship of Vreadi=Vreadj is established, then it is possible to suppress the rise of the erasure threshold voltage due to the read disturbance compared with the conventional memory.

As stated above, if the pass voltages Vread's are divided into groups and applied, it is possible to reduce the number of signal bits of the logic circuit 105 including logic addition circuits and the D/A conversion circuit 104 and to thereby further reduce the circuit area.

Further, in this embodiment, the pass voltage Vreadx is set so that the conditions of the threshold voltage rise due to the read disturbance are made the same as those of the conventional memory, i.e., the conditions of S?Q (Vreadx) are made the same as those of the conventional memory, the integers i and j corresponding to the position x of the selected cell have arbitrary values from 1 to 15, respectively, and that the relationship of Vreadi=Vreadj is established under the condition of i>j, then the drain conductance of each unselected cell can be raised from that of the conventional memory when the memory cell M15 is selected. Accordingly, it is possible to decrease the difference between the maximum current and the minimum current carried to the memory cells, to determine data at high rate, to decrease the probability of reading error resulting from the electromagnetic noise and to obtain high reliability.

Moreover, since the minimum read current can be lowered, it is possible to shorten read time determined according to the minimum read current. In addition, since the writing error stress of the unselected cells connected in series to the selected cell during data read can be reduced, it is possible to narrow the voltage margin between the data "1" and the data "0". It is thereby possible to decrease data destruction resulting from the overlapping of the threshold voltage distributions of different data. Besides, it is possible to lower the threshold voltage of the "0" data by as much as the narrowed margin, to shorten time required to write data, to lower write voltage and to lower the upper limit of the Vread voltage. As a result, it is possible to further reduce the area of the write voltage generation circuit or that of the Vread voltage generation circuit.

Modification of Seventh Embodiment

Figures 39A, 39B, 39C:
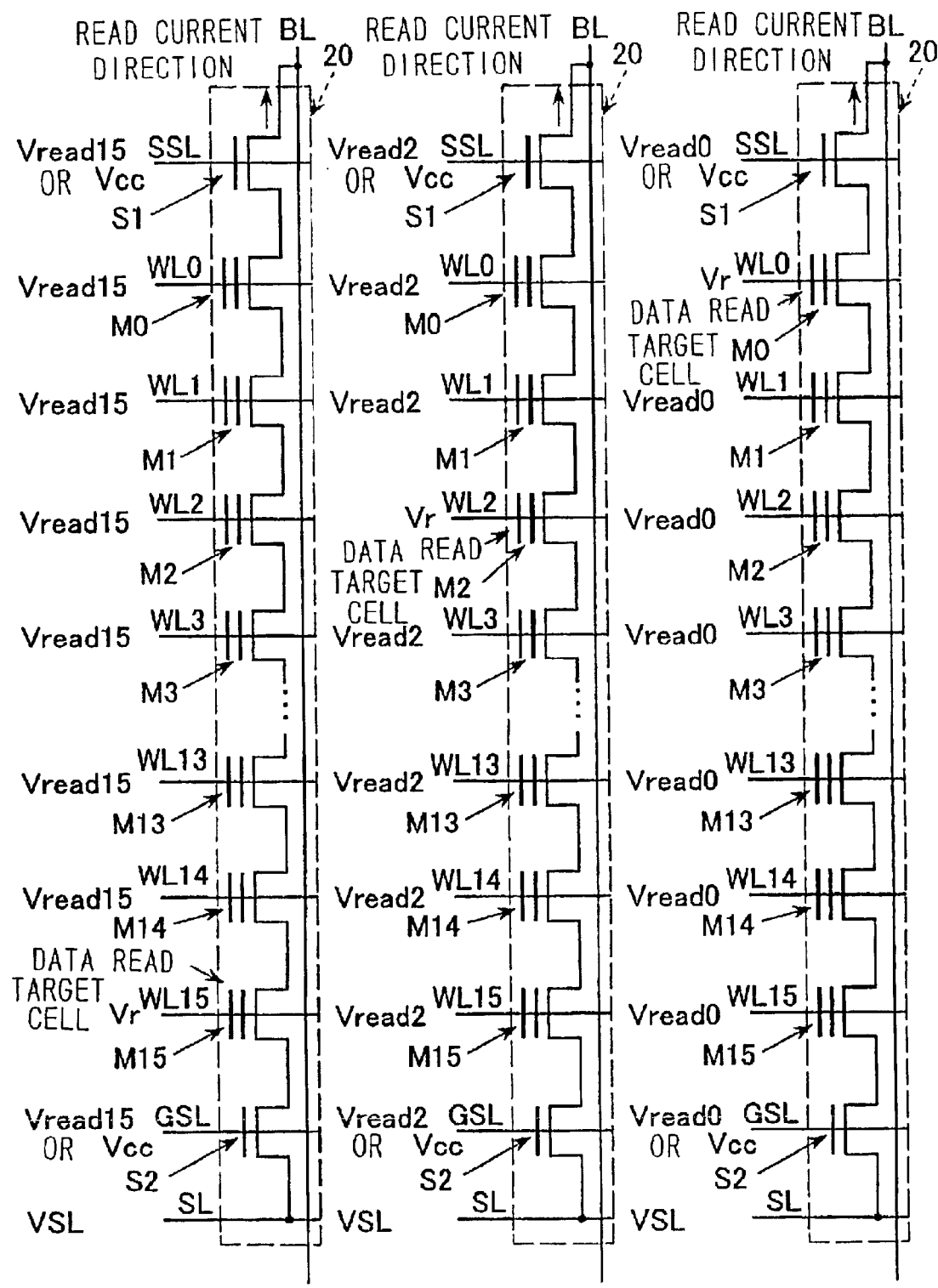
FIGS. 39A, 39B and 39C show the voltage relationship of the NAND cell unit in the data read operation in the seventh embodiment.

FIGS. 39A, 39B ad 39C show a modification of the seventh embodiment. FIGS. 39A, 39B ad 39C, which corresponds to FIGS. 36A, 36B and 36C, show an example of the setting of the pass voltage Vread if a read current direction is opposite to that in the seventh embodiment, i.e., a read current is carried from the common source line SL to the bit line BL and memory cells M15, M2 and M0 are selected, respectively. Since the basic configuration in this embodiment is the same as that in the seventh embodiment, the configurations shown in FIGS. 33 to 35 can be used herein as they are.

FIGS. 40A and 40B, which correspond to FIGS. 37A and 37B in the seventh embodiment, show the relationship between threshold voltage and the pass voltage Vread. Contrary to the seventh embodiment, as the number of unselected cells existing on the common source line SL side relative to the selected memory cell increases, the pass voltage Vread applied to the unselected cells is raised.

Namely, the relationship between the pass voltage Vread0 if the memory cell M0 closest to the bit line is selected and the pass voltage Vread15 if the memory cell M15 closest to the common source line SL is selected is set to satisfy Vread0>Vread15. Generally, if the integer x which expresses the position of a word line WLx has arbitrary values i and j, and i and j satisfy i>j, then the pass voltages Vreadi and Vreadj are set to satisfy a relationship of Vreadj=Vreadi. By so setting, it is possible to suppress the rise of an erasure threshold voltage due to read disturbance.

This modification is particularly effective if write verification read operation is carried so that data is batch-erased, and then data is sequentially written to the cells from the bit line side. By doing so, it suffices to take account of only the memory cells on the source side (common source line side) with regards to the resistance change of each unselected cell due to the data written after the data is written to the selected cell. In this case, the voltage drop quantity of each of the source-side (bit line-side) unselected cells has no change. It is, therefore, possible to suppress threshold voltage change due to source potential change and to decrease the threshold voltage change of the selected memory cell.

As shown in FIGS. 39A, 39B and 39C, the voltage applied to the control gate of each of the select switching transistors S1 and S2 may be Vreadx or Vcc as in the case of the conventional memory. Needless to say, any methods as described in the first to sixth embodiments can be used in this embodiment.

Since the read timing is the same as that in the first embodiment, it will not be described herein.

According to this embodiment, all the advantages of the seventh embodiments can be obtained. In addition, as described in the sixth embodiment, if the bit line adjacent the selected bit line is used as a shield bit line, it is also possible to suppress the read disturbance generated in the memory cells connected to the shield bit line. Further, it is possible to reduce the total Vread stress applied to the cells without deteriorating the worst current carried to the cells compared with the conventional memory wherein the same voltage as the voltage Vread0 is used as the voltage Vread to read data from all the memory cells.

The present invention is not limited to the above-stated embodiments. For example, the data read method described in the embodiments is also applicable to verification read operation for making the threshold voltage distributions of written data uniform. If so, it is possible to further advantageously make the threshold voltage right after data write and the threshold voltage during data read uniform.

Further, the present invention can be used in combination with the conventional method of changing the read voltage Vr. If the read voltage Vr is controlled for each word line and the voltage of the select gate line GSL is set lower than the read voltage Vread, in particular, it is possible to decrease not only the rise of the threshold voltages of the memory cells M0 and M15 as shown in FIG. 12 but also the rise of the threshold voltages of the other memory cells M1 to M14. If data is sequentially written/read from the select gate GSL side in the first embodiment and the modification of the first embodiment, in particular, the change quantities of the threshold voltages caused by the data of the unselected memory cells can be, greatly advantageously, made almost zero for all the memory cells by changing the read voltage Vr for the same reason as that described in the analysis of the first embodiment.

Moreover, the embodiments can be also applied to a multilevel memory for, for example, storing four-level threshold voltages in one memory cell. In this case, if it is assumed that the four-level data are in the first, second, third and fourth data states in a descending order, the upper limit Vthw of the threshold voltage of the data "0" may be regarded as that of the threshold voltage of the highest threshold voltage in the first data state and the threshold voltage Vthw2 may be regarded as the lower limit of the threshold voltage in the third data state. Besides, in a NAND type multilevel memory, since threshold voltage changes of all the threshold voltage distributions other than that in the data state of the highest threshold voltage disadvantageously occur, it is necessary to make the separation width between the threshold voltage distributions larger than that in a binary memory. However, by applying the first, second, third and fourth embodiment to the NAND type multilevel memory, it is possible to further advantageously narrow the threshold voltage distribution width.

Further, the present invention is applicable not only to the EEPROM which employs nonvolatile memory cells of the MISFET structure but also a memory constituted so that a plurality of so-called current read type memory cells each of which stores data as the presence/absence or magnitude of current in a nonvolatile manner, are connected in series. Accordingly, the present invention is effective to any memory wherein a plurality of memory cells are connected in series and data is read from the memory cells in the same manner described so far, such as a ferroelectric memory which stores data according to residual polarization and a ferromagnetic memory which stores data according to the direction or intensity of magnetization.

Additionally, as the method of forming the element isolation insulating film and the insulating film, any method other than that of transforming silicon to a silicon oxide film or a silicon nitride film, e.g., a method of injecting silicon deposited with oxygen ions or a method of oxidizing deposited silicon may be used. In addition, as the charge accumulation layer, a $TiO_2$ layer, an $Al_2O_3$ layer, a tantalum oxide layer, a strontium titanate layer, a barium titanate layer, a zirconium titanate lead layer or a layered layer thereof may be used.

While the p type S1 substrate is used as the semiconductor substrate in the embodiments, an n type S1 substrate or an SOI substrate may be used. Further, the other silicon-containing monocrystalline semiconductor substrate such as an SiGe mixed crystal substrate or an SiGeC mixed crystal substrate may be used. Further, the gate electrode can be formed out of silicide or polycide such as SiGe mixed crystal, SiGeC mixed crystal, TiSi, NiSi, CoSi, TaSi, WSi or MoSi, metal such as Ti, Al, Cu, TiN or W, polycrystalline material, or the layered structure thereof. The charge accumulation layer may be formed in the form of dots.

In addition, while the memory including then channel memory cells and the n channel select transistors has been described in the embodiments, the present invention is also applicable to a case in which p channel memory cells and p channel select transistors are used.

As stated so far, according to the present invention, in the nonvolatile semiconductor memory in which memory cell units are each constituted by connecting a plurality of current read type memory cells in series, it is possible to decrease read current change caused by the data of the unselected memory cells connected in series to the selected memory cell and the position of the selected memory cell and, at the same time, to suppress the rise quantity of the threshold voltage due to the data states of the unselected memory cells.

What is claimed is:

1. A semiconductor memory including a memory cell unit, the memory cell unit comprising:

a plurality of memory cells in which each conductance between current terminals changes according to held data, each having a plurality of current terminals connected in series between a first terminal and a second terminal, and each capable of electrically rewriting the data;

a first select switching element electrically connecting said first terminal to a data transfer line; and a second select switching element electrically connecting said second terminal to a reference potential line, wherein said semiconductor memory has a data read mode for forcing the first and second select switching elements of said memory cell unit into conduction, applying a read voltage for forcing a path between the current terminals into conduction or cut-off according to the data of a selected memory cell, to a control electrode of the selected memory cell, applying a pass voltage for forcing a path between the current terminals into conduction irrespectively of the data of each of the memory cells other than said selected memory cell, to the control electrode of each of the memory cells other than said selected memory cell, and detecting presence and absence or magnitude of a current between said data transfer line and said reference potential line, and the pass voltage applied to the control electrode of each of said unselected memory cells is made variable according to a position of said selected memory cell in said memory cell unit.

2. A semiconductor memory according to claim 1, wherein in said data read mode, a current is carried from said data transfer line to said reference potential line through said memory cell unit, and as the number of the unselected memory cells on said data transfer line side relative to said selected memory cell increases, said pass voltage is set higher.

3. A semiconductor memory according to claim 1, wherein in said data read mode, a current is carried from said reference potential line to said data transfer line through said memory cell unit, and as the number of the unselected memory cells on said reference potential line side relative to said selected memory cell increases, said pass voltage is set higher.

4. A semiconductor memory according to claim 1, comprising:

a pass voltage generation circuit configured to generate said pass voltage, comprising;

a booster circuit configured to generate the pass voltage higher than a power supply voltage and different according to a reference voltage or a reference current; and a reference value generation circuit configured to generate said reference voltage or said reference current in response to address data for selecting the memory cell in said memory cell unit.

5. A semiconductor memory according to claim 4, wherein said reference value generation circuit comprises:

a logic circuit configured to input a trimming set value for adjusting the pass voltage generated in accordance with a test result and said address data, and to generate digital data corresponding to said reference voltage or said reference current; and a circuit configured to convert output digital data of the logic circuit into an analog value, and to generate said reference voltage or said reference current.

6. A semiconductor memory according to claim 1, wherein said semiconductor memory has a data write mode for sequentially writing the data to the memory cells from the memory cell most downstream of the read current after data of said memory cell unit is batch-erased.

7. A semiconductor memory according to claim 1, wherein each of said memory cells has a floating gate type transistor structure having a floating gate formed on a semiconductor substrate through a tunnel insulating film, and having a control gate electrode formed on the floating gate through an insulating film.

8. A semiconductor memory according to claim 1, wherein each of said memory cell has a MONOS type transistor structure having a layered insulating film having a tunnel insulating film, a charge accumulation layer containing nitrogen and a silicon oxide film layered on a semiconductor substrate, and having a control gate electrode formed on the layered insulating film.

* * * * *